(12) United States Patent
Nagata et al.

(10) Patent No.: US 11,239,319 B2
(45) Date of Patent: Feb. 1, 2022

(54) SEMICONDUCTOR DEVICE

(71) Applicant: ROHM CO., LTD., Kyoto (JP)

(72) Inventors: Masaki Nagata, Kyoto (JP); Takefumi Fujimoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/833,032

(22) Filed: Mar. 27, 2020

(65) Prior Publication Data

US 2020/0312962 A1 Oct. 1, 2020

(30) Foreign Application Priority Data

Mar. 29, 2019 (JP) .............................. JP2019-068672

(51) Int. Cl.
| | |
|---|---|
| *H01L 29/10* | (2006.01) |
| *H01L 29/423* | (2006.01) |
| *H01L 29/08* | (2006.01) |
| *H01L 29/78* | (2006.01) |
| *H01L 29/40* | (2006.01) |

(52) U.S. Cl.
CPC ........ *H01L 29/1095* (2013.01); *H01L 29/086* (2013.01); *H01L 29/407* (2013.01); *H01L 29/4236* (2013.01); *H01L 29/7813* (2013.01)

(58) Field of Classification Search
None
See application file for complete search history.

(56) References Cited

U.S. PATENT DOCUMENTS

| | | | | |
|---|---|---|---|---|
| 6,545,316 B1* | 4/2003 | Baliga | ............ | H01L 21/823487 257/329 |
| 2003/0087510 A1* | 5/2003 | Chen | ................ | H01L 21/26513 438/529 |
| 2006/0211179 A1* | 9/2006 | Siemieniec | ......... | H01L 29/4236 438/138 |
| 2007/0059906 A1 | 3/2007 | Wang et al. | | |
| 2013/0240902 A1* | 9/2013 | Schulze | ............. | H01L 21/6835 257/77 |

* cited by examiner

*Primary Examiner* — Robert K Carpenter
(74) *Attorney, Agent, or Firm* — Hamre, Schumann, Mueller & Larson, P.C.

(57) ABSTRACT

A semiconductor device includes an n-type semiconductor substrate which includes an n-type impurity having a diffusion coefficient less than a diffusion coefficient of phosphorus, an n-type epitaxial layer which includes a high concentration region, an intermediate concentration region and a low concentration region formed in this order from the semiconductor substrate side and has a concentration gradient in which an n-type impurity concentration is decreased in a downward step-wise manner from the semiconductor substrate toward a crystal growth direction by the high concentration region, the intermediate concentration region and the low concentration region, and a trench structure which includes a trench formed in the low concentration region, an insulating layer formed on an inner wall of the trench and an embedded electrode which is embedded in the trench across the insulating layer.

17 Claims, 34 Drawing Sheets

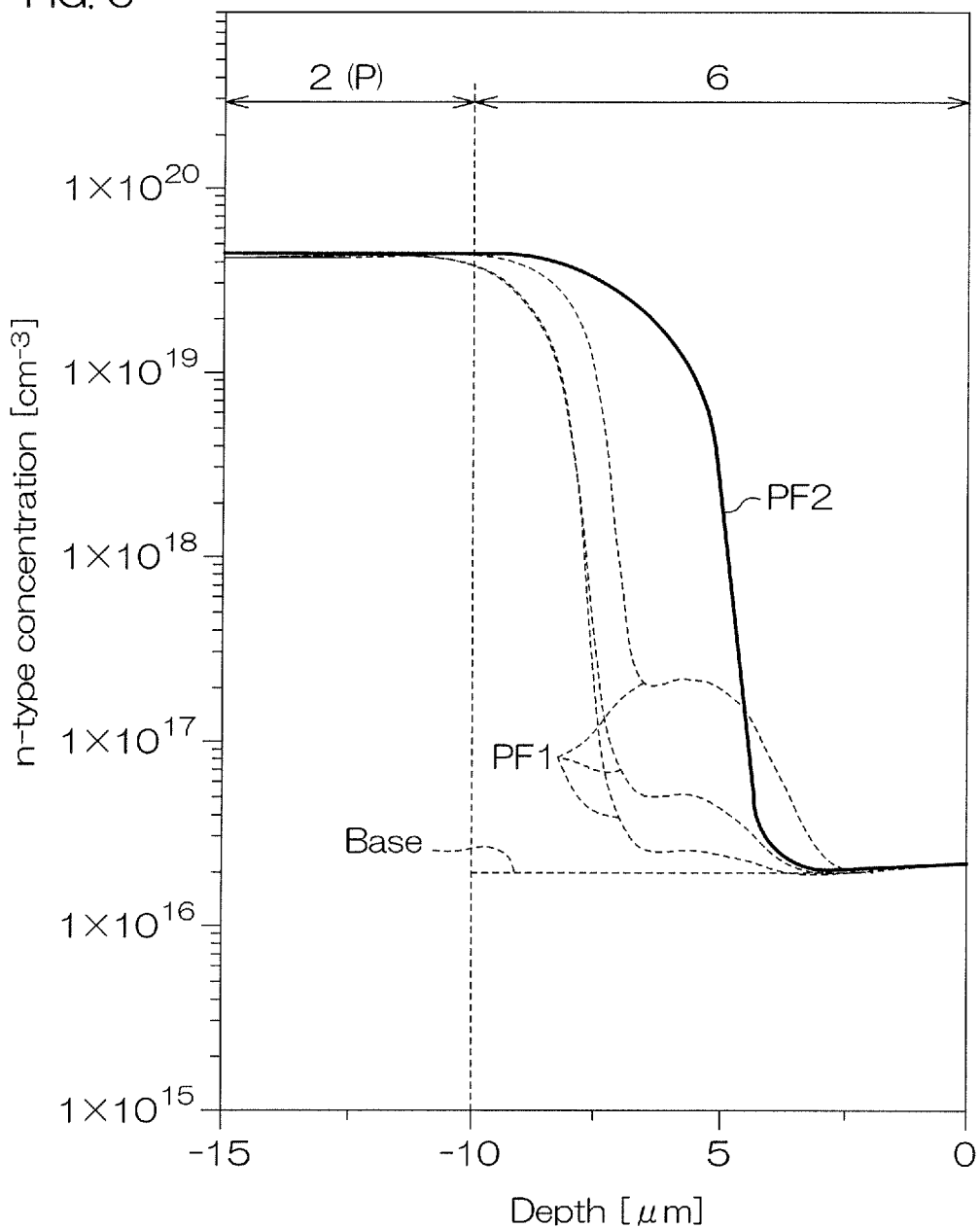

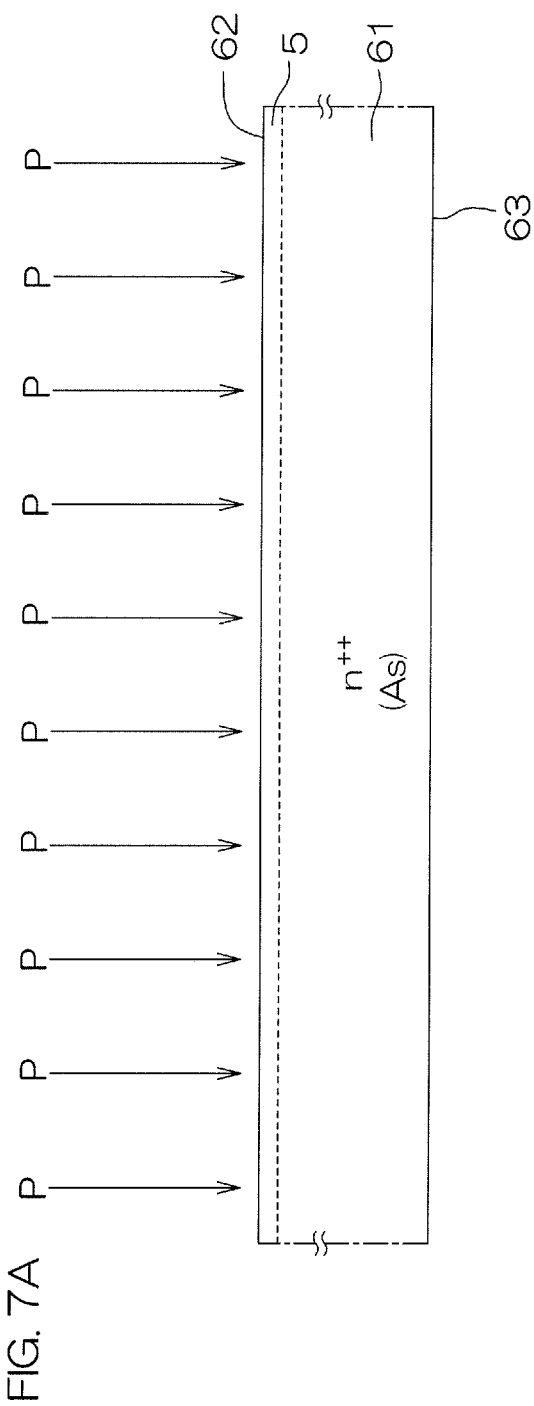

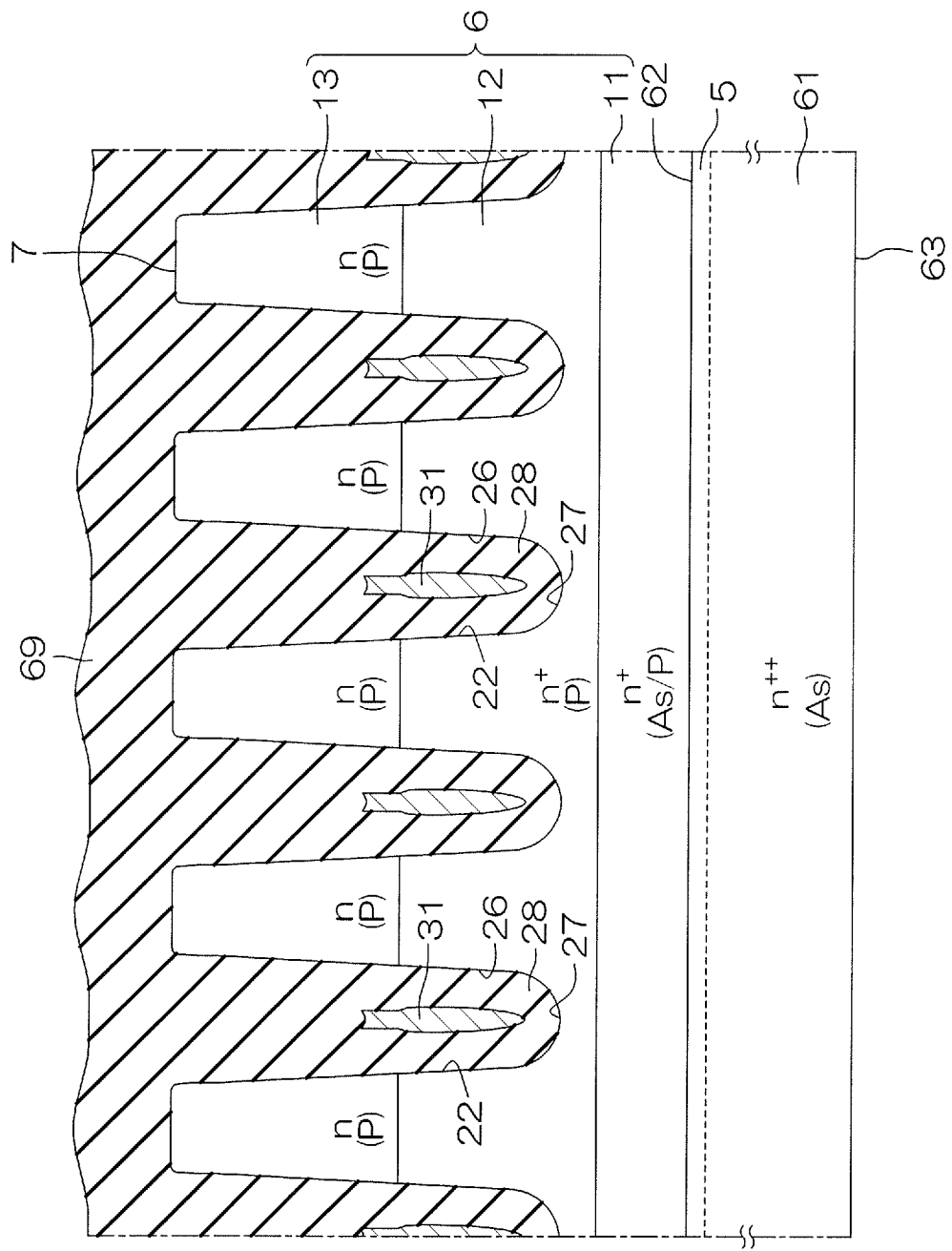

SEMICONDUCTOR DEVICE

CROSS REFERENCE TO RELATED APPLICATIONS

This application claims the benefit of priority to Japanese Patent Application No. 2019-068672 filed on Mar. 29, 2019. The entire contents of these applications are hereby incorporated herein by reference.

BACKGROUND OF THE INVENTION

1. Field of the Invention

The present invention relates to a semiconductor device.

2. Description of the Related Art

US20070059906A1 discloses a semiconductor device having a trench gate MOSFET. The semiconductor device includes a silicon substrate (semiconductor substrate), a spacer layer, an epitaxial layer and a trench structure. The silicon substrate includes phosphorus as a main n-type impurity. The spacer layer includes arsenic as a main n-type impurity and is laminated on the silicon substrate. The epitaxial layer includes an n-type impurity and is laminated on the spacer layer. The trench structure includes a trench formed in the epitaxial layer, an insulating layer formed on an inner wall of the trench and an electrode embedded in the trench across the insulating layer.

SUMMARY OF THE INVENTION

A preferred embodiment of the present invention provides a semiconductor device including an n-type semiconductor substrate which includes an n-type impurity having a diffusion coefficient less than a diffusion coefficient of phosphorus, an n-type epitaxial layer which includes a high concentration region, an intermediate concentration region and a low concentration region formed in this order from the semiconductor substrate side and has a concentration gradient in which an n-type impurity concentration is decreased in a downward step-wise manner from the semiconductor substrate toward a crystal growth direction by the high concentration region, the intermediate concentration region and the low concentration region, and a trench structure which includes a trench formed in the low concentration region, an insulating layer formed in an inner wall of the trench and an embedded electrode which is embedded in the trench across the insulating layer.

The aforementioned or other objects, features, and effects of the present invention will be clarified by the following description of preferred embodiments given below with reference to the accompanying drawings.

BRIEF DESCRIPTION OF THE DRAWINGS

FIG. 6 is a graph which is obtained by simulating concentration profiles where a semiconductor substrate that includes phosphorus as a main n-type impurity is adopted.

DETAILED DESCRIPTION OF THE PREFERRED EMBODIMENTS

An increase in concentration of an n-type impurity in an epitaxial layer is effective in reducing a resistance of the epitaxial layer. For example, a spacer layer may be removed from a structure disclosed by US20070059906A1 to diffuse phosphorus in a semiconductor substrate to an epitaxial layer, thus making it possible to increase a concentration of the epitaxial layer.

It is, however, difficult to control an amount of phosphorus diffused to the epitaxial layer from the semiconductor substrate and therefore the concentration of the epitaxial layer cannot be appropriately increased. For example, where an epitaxial layer is increased in concentration in an inappropriate manner, an undesired electric field concentration occurs in the epitaxial layer due to the trench structure, thus resulting in a reduction in breakdown voltage. In the semiconductor device according to US20070059906A1, in order to avoid this type of problem, a spacer layer is formed on the semiconductor substrate.

Thus, a preferred embodiment of the present invention provides a semiconductor device capable of suppressing a reduction in breakdown voltage and reducing a resistance of an epitaxial layer.

A preferred embodiment of the present invention provides a semiconductor device which includes an n-type semiconductor substrate that includes an n-type impurity having a diffusion coefficient less than a diffusion coefficient of phosphorus, an n-type epitaxial layer which includes a high concentration region, an intermediate concentration region and a low concentration region formed in this order from the semiconductor substrate side and has a concentration gradient in which an n-type impurity concentration is decreased in a downward step-wise manner from the semiconductor substrate toward the crystal growth direction by the high concentration region, the intermediate concentration region and the low concentration region, and a trench structure which includes a trench formed in the low concentration region, an insulating layer formed on an inner wall of the trench and an embedded electrode which is embedded in the trench across the insulating layer. According to the semiconductor device, it is possible to suppress a reduction in breakdown voltage and reduce a resistance of the epitaxial layer.

Hereinafter, preferred embodiments of the present invention will be described in detail with reference to the attached drawings.

Figure 1:
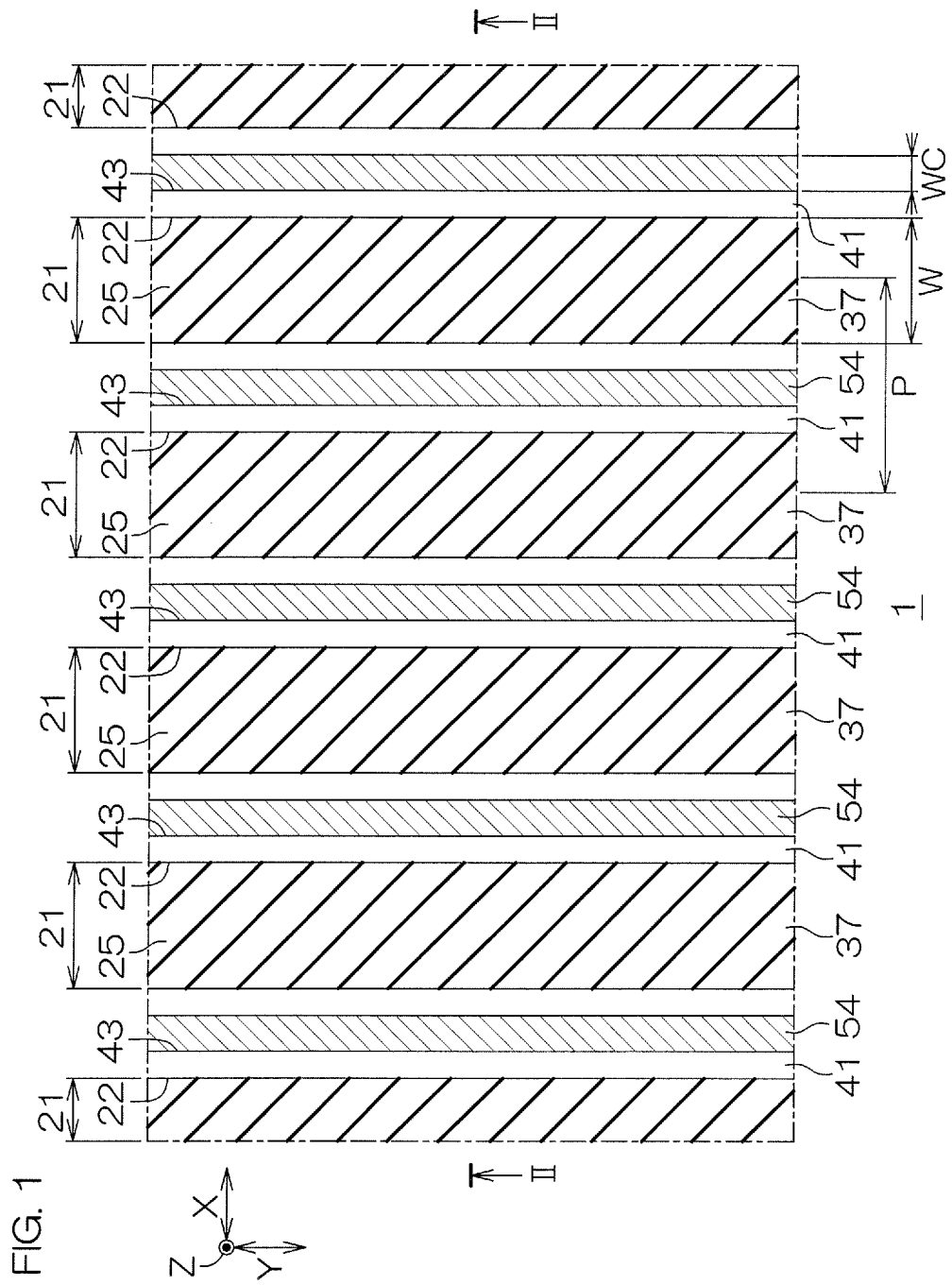
FIG. 1 is a plan view which shows a partial region of a semiconductor device according to a first preferred embodiment of the present invention in an enlarged manner.
Figure 2:
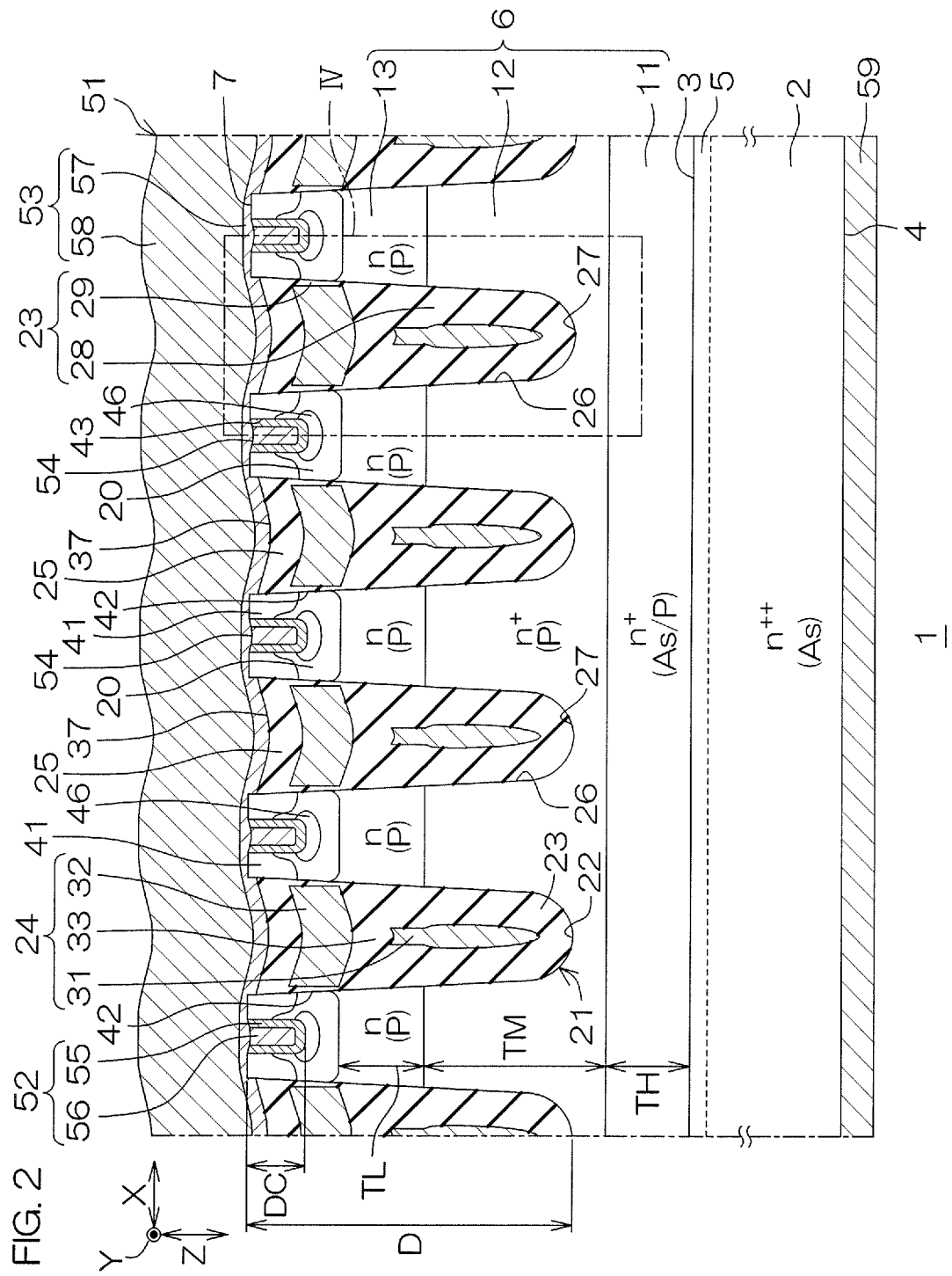
FIG. 2 is a sectional view taking along line II-II shown in FIG. 1.

FIG. 1 is a plan view which shows a partial region of a semiconductor device 1 according to the first preferred embodiment of the present invention in an enlarged manner. FIG. 2 is a sectional view taking along line II-II shown in FIG. 1.

With reference to FIG. 1 and FIG. 2, the semiconductor device 1 is a semiconductor switching device which includes a MISFET (Metal Insulator Semiconductor Field Effect Transistor) as one example of an insulating gate type transistor.

The semiconductor device 1 includes an $n^{++}$ type semiconductor substrate 2 which is composed of silicon. The semiconductor substrate 2 is formed as a drain region of the MISFET. The semiconductor substrate 2 includes a pentavalent element having a relatively small diffusion coefficient less than a diffusion coefficient of phosphorus (P) as a main n-type impurity (donor). Arsenic (As), antimony (Sb), bismuth (Bi), etc., are exemplified as an n-type impurity having a relatively small diffusion coefficient. In this embodiment, the semiconductor substrate 2 includes arsenic as a main n-type impurity.

The semiconductor substrate 2 has an n-type impurity concentration which is substantially constant over the entire region. The n-type impurity concentration of the semiconductor substrate 2 may be not less than $1\times10^{19}$ cm$^{-3}$ and not more than $1\times10^{21}$ cm$^{-3}$. In this embodiment, the n-type impurity concentration of the semiconductor substrate 2 is from not less than $1\times10^{19}$ cm$^{-3}$ to not more than $1\times10^{20}$ cm$^{-3}$.

The semiconductor substrate 2 may be formed in a rectangular solid shape. The semiconductor substrate 2 includes a first substrate main surface 3 on one side and a second substrate main surface 4 on the other side. The first substrate main surface 3 and the second substrate main surface 4 may be each formed in a square shape in plan view as viewed from a normal direction Z (hereinafter, simply referred to as "plan view").

A thickness of the semiconductor substrate 2 may be from not less than 50 μm to not more than 450 μm. The thickness of the semiconductor substrate 2 may be from not less than 50 μm to not more than 150 μm, from not less than 150 μm to not more than 250 μm, from not less than 250 μm to not more than 350 μm, or from not less than 350 μm to not more than 450 μm.

The semiconductor device 1 includes an impurity region 5 formed in a surface layer portion of the first substrate main surface 3. In FIG. 2, the impurity region 5 is indicated by a broken line. The impurity region 5 includes an n-type impurity different from the n-type impurity of the semiconductor substrate 2, besides the n-type impurity (arsenic) of the semiconductor substrate 2.

Specifically, the impurity region 5 includes an n-type impurity having a relatively large diffusion coefficient in excess of a diffusion coefficient of the n-type impurity of the semiconductor substrate 2. In this embodiment, the impurity region 5 includes phosphorus as an n-type impurity having a relatively large diffusion coefficient. That is, the impurity region 5 includes arsenic and phosphorus which are different from each other in diffusion coefficient as an n-type impurity.

The impurity region 5 is formed as an n-type impurity supply source which supplies phosphorus to an epitaxial layer 6 by diffusion to be described later. A phosphorus concentration of the impurity region 5 is less than an arsenic concentration of the semiconductor substrate 2. The phosphorus concentration of the impurity region 5 may be from not less than $1\times10^{17}$ cm$^{-3}$ to not more than $1\times10^{19}$ cm$^{-3}$.

A thickness of the impurity region 5 may be from not less than 10 nm to not more than 1000 nm. The thickness of the impurity region 5 may be from not less than 10 nm to not more than 100 nm, from not less than 100 nm to not more than 250 nm, from not less than 250 nm to not more than 500 nm, from not less than 500 nm to not more than 750 nm, or from not less than 750 nm to not more than 1000 nm.

The semiconductor device 1 includes an n-type epitaxial layer 6 formed on the first substrate main surface (impurity region 5). The epitaxial layer 6 is formed by epitaxially growing silicon from the first substrate main surface 3. The epitaxial layer 6 is formed as a drift region of the MISFET.

The epitaxial layer 6 has an epitaxial main surface 7. The epitaxial main surface 7 is formed in parallel to the first substrate main surface 3. In a plan view, the epitaxial main surface 7 is formed in a square shape in alignment with the first substrate main surface 3.

The epitaxial layer 6 has a thickness less than the thickness of the semiconductor substrate 2. The thickness of the epitaxial layer 6 may be from not less than 3 μm to not more than 25 μm. The thickness of the epitaxial layer 6 may be from not less than 3 μm to not more than 10 μm, from not less than 10 μm to not more than 15 μm, from not less than 15 μm to not more than 20 μm, or from not less than 20 μm to not more than 25 μm. The thickness of the epitaxial layer 6 is preferably from not less than 5 μm to not more than 20 μm. In this embodiment, the thickness of the epitaxial layer 6 is approximately 10 μm.

Figure 3:
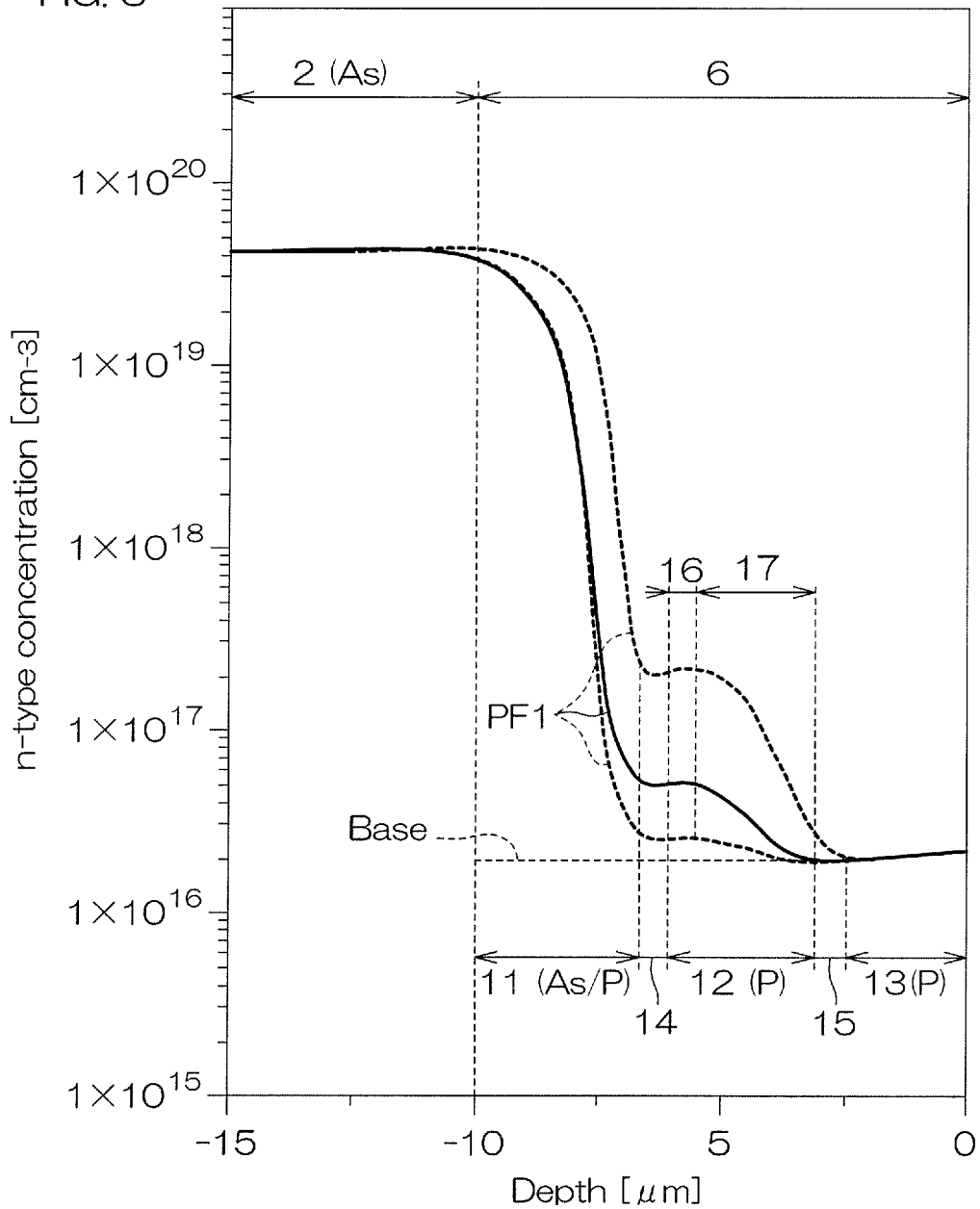
FIG. 3 is a graph which is obtained by simulating concentration profiles.

Hereinafter, with reference to FIG. 3 as well, a specific description will be given of an n-type impurity concentration of the epitaxial layer 6. FIG. 3 is a graph which is obtained by simulating a concentration profile PF1. In FIG. 3, the vertical axis indicates an n-type impurity concentration [cm$^{-3}$], while the horizontal axis indicates a depth [μm], with the epitaxial main surface 7 given as a reference (zero point).

In FIG. 3, a concentration profile PF1 formed by the semiconductor substrate 2 and the epitaxial layer 6 is shown. In FIG. 3, concentration profiles PF1 in which an n-type impurity concentration of a high concentration region 11 is adjusted in the concentration profile PF1 are also shown by broken lines. In FIG. 3, an example in which the n-type impurity concentration of the semiconductor substrate 2 is set at not less than $1\times10^{19}$ cm$^{-3}$ to not more than $1\times10^{20}$ cm$^{-3}$ (specifically, approximately $4\times10^{19}$ cm$^{-3}$) is also shown.

Further, in FIG. 3, a base phosphorus concentration imparted to the epitaxial layer 6 at the time of epitaxial growth is indicated by a broken line. The base phosphorus concentration is a phosphorus concentration which is imparted to the epitaxial layer 6 by phosphorus added from the outside (gas atmosphere) at the time of epitaxial growth.

The epitaxial layer 6 is formed in such a mode that the n-type impurity concentration decreases gradually from the semiconductor substrate 2 toward a crystal growth direction. The crystal growth direction is a direction oriented from the first substrate main surface 3 to the epitaxial main surface 7. The epitaxial layer 6, specifically, includes an $n^+$-type high concentration region 11, an n-type intermediate concentration region 12 and an $n^-$-type low concentration region 13 which are formed in this order from the first substrate main surface 3 side.

The epitaxial layer 6 has an n-type impurity concentration gradient in which the n-type impurity concentration is decreased in a downward step-wise manner from the semiconductor substrate 2 toward the crystal growth direction by the high concentration region 11, the intermediate concentration region 12 and the low concentration region 13. The epitaxial layer 6 also includes a high concentration transition region 14 in which the concentration gradient inclines gently between the high concentration region 11 and the intermediate concentration region 12. Further, the epitaxial layer 6 includes a low concentration transition region 15 in which the concentration gradient inclines gently between the intermediate concentration region 12 and the low concentration region 13.

The n-type impurity concentration of the high concentration transition region 14 is less than the n-type impurity concentration of the semiconductor substrate 2. The n-type impurity concentration of the low concentration transition region 15 is less than the n-type impurity concentration of the high concentration transition region 14. The high concentration region 11 has an n-type impurity concentration between the semiconductor substrate 2 and the high concentration transition region 14. The intermediate concentration region 12 has an n-type impurity concentration between the high concentration transition region 14 and the low concentration transition region 15. The low concentration region 13 has an n-type impurity concentration between the low concentration transition region 15 and the epitaxial main surface 7.

The semiconductor substrate 2 has an n-type impurity concentration in which a mean value is a first value A1. The high concentration region 11 has an n-type impurity concentration in which the mean value is a second value A2 less than the first value A1 (A2<A1). The intermediate concentration region 12 has an n-type impurity concentration in which the mean value is a third value A3 less than the second value A2 (A3<A2<A1). The low concentration region 13 has an n-type impurity concentration in which the mean value is a fourth value A4 less than the third value A3 (A4<A3<A2<A1).

The first value A1 is determined by a mean value of functions f(x) in an interval set by the semiconductor substrate 2 when the concentration profile PF1 is defined by the functions f(x). The second value A2 is determined by a mean value of functions f(x) in an interval set by the high concentration region 11. The third value A3 is determined by a mean value of functions f(x) in an interval set by the intermediate concentration region 12. The fourth value A4 is determined by a mean value of functions f(x) in an interval set by the low concentration region 13.

The high concentration region 11 is formed by epitaxially growing silicon from the first substrate main surface 3. The high concentration region 11 is a buffer region which incorporates arsenic diffused from the semiconductor substrate 2. The high concentration region 11 includes arsenic and phosphorus as a main n-type impurity. Specifically, the high concentration region 11 includes arsenic diffused from the semiconductor substrate 2 and phosphorus diffused from the impurity region 5. The high concentration region 11 also includes phosphorus added during epitaxial growth.

The high concentration region 11 has a concentration gradient in which the n-type impurity concentration decreases gradually from the first substrate main surface 3 toward the crystal growth direction. The n-type impurity concentration of the high concentration region 11 increases gradually in decreasing rate from the first substrate main surface 3 toward the crystal growth direction.

Specifically, the high concentration region 11 has a concentration gradient in which an arsenic concentration taken over from the semiconductor substrate 2 decreases gradually from the first substrate main surface 3 toward the crystal growth direction. Further, the high concentration region 11 has a concentration gradient in which a phosphorus concentration taken over from the impurity region 5 decreases gradually from the first substrate main surface 3 toward the crystal growth direction.

Arsenic is smaller in diffusion coefficient than phosphorus. Therefore, in the high concentration region 11, a decreasing rate of arsenic per unit thickness exceeds a decreasing rate of phosphorus per unit thickness. Thereby, the high concentration region 11 is formed in a mode that the n-type impurity concentration composed of the phosphorus concentration and the arsenic concentration is replaced by the n-type impurity concentration composed of the phosphorus concentration toward the crystal growth direction. The high concentration region 11 is demarcated by a region in which the n-type impurity concentration is controlled by the arsenic concentration and the phosphorus concentration in the epitaxial layer 6 (that is, a region between the first substrate main surface 3 and the high concentration transition region 14).

A thickness TH of the high concentration region 11 may be from not less than 1 μm to not more than 5 μm. The thickness TH may be from not less than 1 μm to not more than 2 μm, from not less than 2 μm to not more than 3 μm, from not less than 3 μm to not more than 4 μm, or from not less than 4 μm to not more than 5 μm.

The high concentration transition region 14 is a stationary region in which an inclination of the concentration gradient can be regarded as zero or substantially zero. In other words, the high concentration transition region 14 is a region in which the n-type impurity concentration composed of the phosphorus concentration and the arsenic concentration is replaced by the n-type impurity concentration composed of the phosphorus concentration in the epitaxial layer 6. In the high concentration transition region 14, the phosphorus concentration is not less than the arsenic concentration.

The n-type impurity concentration of the high concentration transition region 14 may be from not less than $1 \times 10^{16}$ cm$^{-3}$ to not more than $1 \times 10^{18}$ cm$^{-3}$. The n-type impurity concentration of the high concentration transition region 14 is preferably from not less than $2 \times 10^{16}$ cm$^{-3}$ to not more than $5 \times 10^{16}$ cm$^{-3}$.

The intermediate concentration region 12 is formed on the high concentration region 11 via the high concentration transition region 14. The intermediate concentration region 12 is formed by epitaxially growing silicon from the high concentration region 11. The intermediate concentration region 12 includes phosphorus as a main n-type impurity. Specifically, the intermediate concentration region 12 includes phosphorus diffused from the high concentration region 11 (impurity region 5) and phosphorus added during epitaxial growth. The intermediate concentration region 12 may include a trace amount of arsenic diffused from the semiconductor substrate 2 to such an extent that the concentration does not affect the n-type impurity concentration.

The intermediate concentration region 12 has a concentration gradient in which the n-type impurity concentration decreases from the high concentration region 11 toward the crystal growth direction. Specifically, the intermediate concentration region 12 has a concentration gradient in which the phosphorus concentration decreases down to the base phosphorus concentration from the high concentration region 11 toward the crystal growth direction.

Thereby, the intermediate concentration region 12 is formed in such a mode that the n-type impurity concentration composed of the phosphorus concentration taken over from the high concentration region 11 is replaced by the n-type impurity concentration composed of the base phosphorus concentration toward the crystal growth direction. The intermediate concentration region 12 is demarcated by a region in which the n-type impurity concentration is controlled by the phosphorus concentration taken over from the high concentration region 11 in the epitaxial layer 6 (that is, a region between the high concentration transition region 14 and the low concentration transition region 15).

In this embodiment, the intermediate concentration region 12 includes a gentle region 16 and a steep region 17. The gentle region 16 is a region in which the n-type impurity concentration changes gently in the crystal growth direction. The gentle region 16 is formed due to the high concentration transition region 14. The steep region 17 is a region in which a decreasing rate of the n-type impurity concentration in the crystal growth direction is steeper than the gentle region 16. A thickness of the gentle region 16 is not more than that of the steep region 17. Specifically, the thickness of the gentle region 16 is less than that of the steep region 17.

Figure 4:
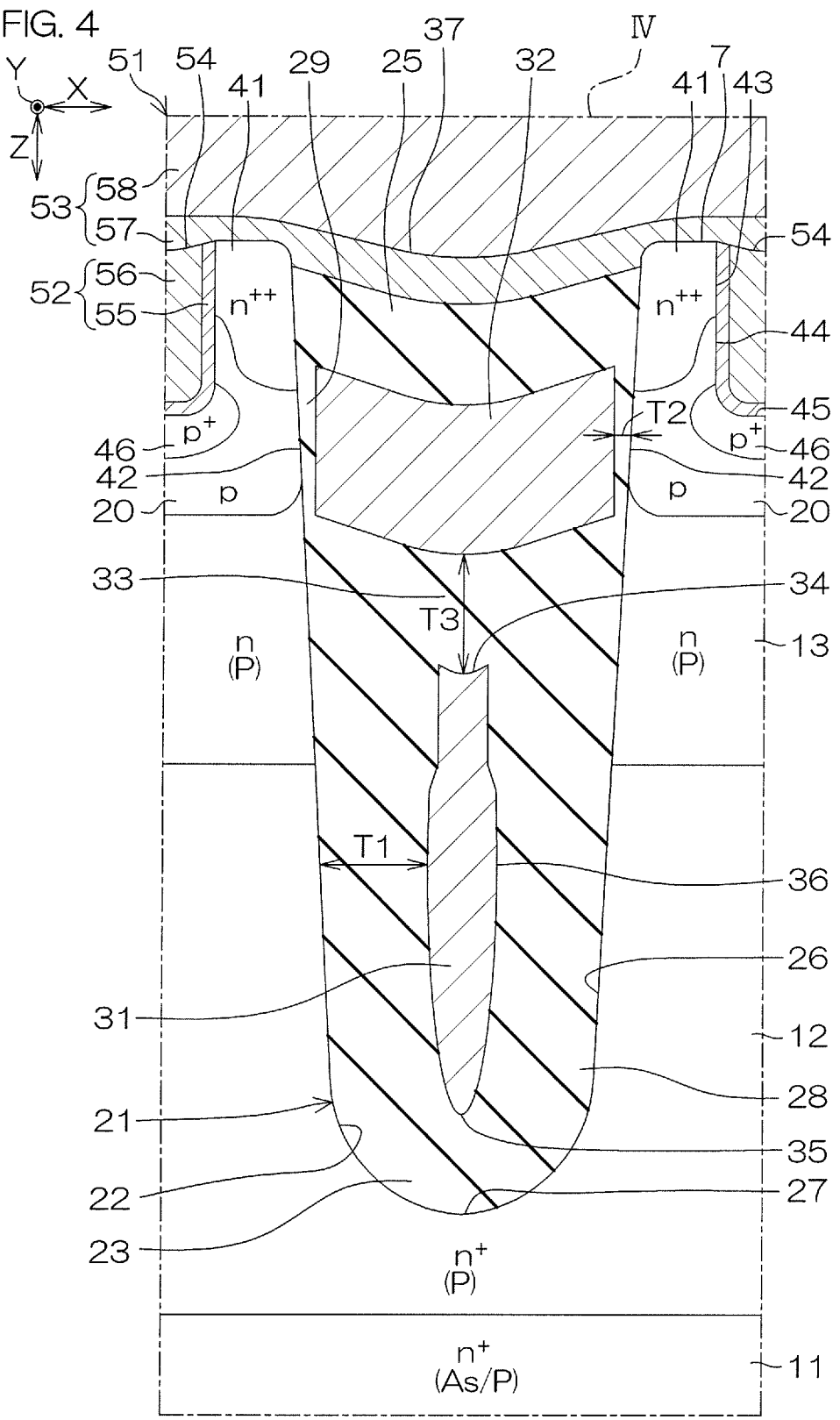
FIG. 4 is an enlarged view of a region IV shown in FIG. 2.

The gentle region 16 may be a region in which the n-type impurity concentration increases gradually from the high concentration transition region 14 toward the crystal growth direction. That is, the gentle region 16 may have the n-type impurity concentration in excess of the n-type impurity concentration of the high concentration transition region 14. In FIG. 4, there is shown the gentle region 16 in which the n-type impurity concentration increases gently from the high concentration transition region 14 toward the crystal growth direction.

In this case, a maximum value of the n-type impurity concentration of the intermediate concentration region 12 is given as a maximum value of the n-type impurity concentration of the gentle region 16. A concentration ratio R1 of a maximum value of the n-type impurity concentration of the gentle region 16 with respect to that of the n-type impurity concentration of the high concentration transition region 14 maybe in excess of 1 and not more than 2. The concentration ratio R1 may be in excess of 1 and not more than 1.2, from not less than 1.2 to not more than 1.4, from not less than 1.4 to not more than 1.6, from not less than 1.6 to not more than 1.8, or from not less than 1.8 to not more than 2. The concentration ratio R1 is preferably from not less than 1 to not more than 1.5.

The gentle region 16 may be a region which keeps the n-type impurity concentration of the high concentration transition region 14 from the high concentration transition region 14 toward the crystal growth direction. That is, the gentle region 16 may have an n-type impurity concentration which is substantially equal to the n-type impurity concentration of the high concentration transition region 14. In this case, A concentration ratio R2 of the n-type impurity concentration of the gentle region 16 with respect to that of the high concentration transition region 14 is substantially 1.

The gentle region 16 may be a region in which the n-type impurity concentration decreases gently from the high concentration transition region 14 toward the crystal growth direction. That is, the gentle region 16 may have an n-type impurity concentration less than the n-type impurity concentration of the high concentration transition region 14.

In this case, a maximum value of the n-type impurity concentration of the intermediate concentration region 12 is given as the n-type impurity concentration of the high concentration transition region 14. A concentration ratio R3 of a minimum value of the n-type impurity concentration of the gentle region 16 with respect to that of the high concentration transition region 14 may be from not less than 0.5 to less than 1. The concentration ratio R3 may be from not less than 0.5 to not more than 0.6, from not less than 0.6 to not more than 0.7, from not less than 0.7 to not more than 0.8, from not less than 0.8 to not more than 0.9, or from not less than 0.9 to less than 1.

A thickness TM of the intermediate concentration region 12 may be from not less than 1 µm to not more than 5 µm. The thickness TM may be from not less than 1 µm to not more than 2 µm, from not less than 2 µm to not more than 3 µm, from not less than 3 µm to not more than 4 µm, or from not less than 4 µm to not more than 5 µm.

The low concentration transition region 15 is a stationary region in which an inclination of the concentration gradient of the intermediate concentration region 12 can be regarded as zero or substantially zero. In other words, the low concentration transition region 15 is a region in which the n-type impurity concentration composed of the phosphorus concentration taken over from the intermediate concentration region 12 is replaced by the n-type impurity concentration composed of the base phosphorus concentration.

The n-type impurity concentration of the low concentration transition region 15 may be from not less than $5\times10^{15}$ cm$^{-3}$ to not more than $5\times10^{16}$ cm$^{-3}$ under a condition that it is less than the n-type impurity concentration of the high concentration transition region 14. The n-type impurity concentration of the low concentration region 13 is preferably from not less than $1\times10^{16}$ cm$^{-3}$ to not more than $2\times10^{16}$ cm$^{-3}$.

The low concentration region 13 is formed on the high concentration region 11 via the low concentration transition region 15. The low concentration region 13 is formed by epitaxially growing silicon from the intermediate concentration region 12. The low concentration region 13 includes phosphorus as a main n-type impurity.

The low concentration region 13 has a concentration gradient which keeps the base phosphorus concentration from the intermediate concentration region 12 (low concentration transition region 15) toward the crystal growth direction. The low concentration region 13 may include a trace amount of arsenic diffused from the semiconductor substrate 2 to such an extent that the concentration does not affect the n-type impurity concentration. The low concentration region 13 may include a trace amount of phosphorus diffused from the impurity region 5 to such an extent that the concentration does not affect the n-type impurity concentration.

The low concentration region 13 is demarcated by a region in which the n-type impurity concentration of the epitaxial layer 6 is controlled by the base phosphorus concentration (that is, a region between the low concentration transition region 15 and the epitaxial main surface 7). The n-type impurity concentration of the low concentration region 13 is substantially equal to the n-type impurity concentration of the low concentration transition region 15. The n-type impurity concentration of the low concentration region 13 may be from not less than $5\times10^{15}$ cm$^{3}$ to not more than $1\times10^{17}$ cm$^{3}$. The n-type impurity concentration of the low concentration region 13 is preferably from not less than $1\times10^{16}$ cm$^{-3}$ to not more than $5\times10^{16}$ cm$^{-3}$.

The low concentration region 13 may have a concentration gradient in which the n-type impurity concentration increases or decreases gradually toward the crystal growth direction in a range of not less than $5\times10^{15}$ cm$^{-3}$ to not more than $5\times10^{16}$ cm$^{-3}$. The low concentration region 13 may have a concentration gradient in which the n-type impurity concentration increases or decreases gradually toward the crystal growth direction in a range of not less than $1\times10^{16}$ cm$^{-3}$ to not more than $2\times10^{16}$ cm$^{-3}$.

A thickness TL of the low concentration region 13 may be from not less than 1 µm to not more than 5 µm. The thickness TL may be from not less than 1 μm to not more than 2 μm, from not less than 2 μm to not more than 3 μm, from not less than 3 μm to not more than 4 μm, or from not less than 4 μm to not more than 5 μm.

Again, with reference to FIG. 1 and FIG. 2, the semiconductor device 1 includes a body region 20 which is formed in a surface layer portion of the epitaxial main surface 7. The body region 20 is formed in a surface layer portion of the low concentration region 13 at an interval from the intermediate concentration region 12 to the epitaxial main surface 7 side. That is, a bottom portion of the body region 20 is formed within the low concentration region 13.

A peak value of a p-type impurity concentration of the body region 20 may be from not less than $1 \times 10^{16}$ cm$^{-3}$ to not more than $1 \times 10^{18}$ cm$^{-3}$. The body region 20 may have a thickness of not less than 0.2 μm to not more than 1 μm. The thickness of the body region 20 is a thickness of the body region 20 in a normal direction Z when the epitaxial main surface 7 is given as a reference. The thickness of the body region 20 may be from not less than 0.2 μm to not more than 0.4 μm, from not less than 0.4 μm to not more than 0.6 μm, from not less than 0.6 μm to not more than 0.8 μm, or from not less than 0.8 μm to not more than 1 μm.

The semiconductor device 1 includes a plurality of trench structures 21 formed in the epitaxial main surface 7. The plurality of trench structures 21 are formed at intervals along a first direction X. The plurality of trench structures 21 are each formed in a band shape extending along a second direction Y which intersects the first direction X in plan view. Specifically, the first direction X is orthogonal to the second direction Y. Thereby, the plurality of trench structures 21 are formed in a stripe shape extending along the second direction Y as a whole in plan view.

A pitch P between central portions of the plurality of trench structures 21 which are mutually adjacent may be from not less than 0.5 μm to not more than 5.5 μm. The pitch P may be from not less than 0.5 μm to not more than 1.5 μm, from not less than 1.5 μm to not more than 2.5 μm, from not less than 2.5 μm to not more than 3.5 μm, from not less than 3.5 μm to not more than 4.5 μm, or from not less than 4.5 μm to not more than 5.5 μm. The pitch P is preferably from not less than 1 μm to not more than 3 μm.

Specifically, the plurality of trench structures 21 each include a trench 22 formed in the epitaxial layer 6, an insulating layer 23 formed on an inner wall of the trench 22 and an embedded electrode 24 which is embedded in the trench 22 across the insulating layer 23. In this embodiment, the plurality of trench structures 21 each include an insulator 25 which covers the embedded electrode 24 inside the trench 22.

The plurality of trench structures 21 has the substantially similar structure. Hereinafter, with reference to FIG. 4, a description will be given of a specific structure of the trench structure 21, with attention given to one trench structure 21. FIG. 4 is an enlarged view of a region IV shown in FIG. 2.

With reference to FIG. 4, the trench 22 penetrates through the body region 20 and is formed in the low concentration region 13. Specifically, the trench 22 penetrates through the low concentration region 13 (low concentration transition region 15) and reaches the intermediate concentration region 12. Thereby, the body region 20 is formed in a region along the plurality of trenches 22 in a surface layer portion of the low concentration region 13.

The trench 22 is formed at an interval on the epitaxial main surface 7 side with respect to the first substrate main surface 3 of the semiconductor substrate 2. Thereby, the trench 22 faces the first substrate main surface 3 across the high concentration region 11. Specifically, the trench 22 is formed at an interval on the epitaxial main surface 7 side with respect to the high concentration region 11. Thereby, the trench 22 faces the first substrate main surface 3 across the high concentration region 11 and the intermediate concentration region 12.

The trench 22 includes a side wall 26 and a bottom wall 27. The side wall 26 exposes the body region 20, the low concentration region 13 and the intermediate concentration region 12. The bottom wall 27 exposes the intermediate concentration region 12. The bottom wall 27 is formed in a curved shape toward the semiconductor substrate 2.

An angle (absolute value) of the side wall 26 formed with the epitaxial main surface 7 inside the epitaxial layer 6 may be from not less than 90° to not more than 95°. The angle may be from not less than 90° to not more than 91°, from not less than 91° to not more than 92°, from not less than 92° to not more than 93°, from not less than 93° to not more than 94°, or from not less than 94° to not more than 95°.

The angle is preferably in excess of 90° and not more than 92°. That is, the trench 22 is preferably formed in a tapered shape such as to be made narrow from the epitaxial main surface 7 to the bottom wall 27 in a cross sectional view.

The trench 22 has a trench width W and a trench depth D. The trench width W is an opening width of the trench 22 in the first direction X. The trench depth D is a depth of the trench 22 in the normal direction Z when the epitaxial main surface 7 is given as a reference.

The trench width W may be from not less than 1 μm to not more than 2 μm. The trench width W may be from not less than 1 μm to not more than 1.2 μm, from not less than 1.2 μm to not more than 1.4 μm, from not less than 1.4 μm to not more than 1.6 μm, from not less than 1.6 μm to not more than 1.8 μm, or from not less than 1.8 μm to not more than 2 μm. In this embodiment, the trench width W is from not less than 1.5 μm to not more than 1.8 μm.

The trench depth D may be from not less than 2 μm to not more than 8 μm although the trench depth D is different depending on the thickness of the epitaxial layer 6. The trench depth D may be from not less than 2 μm to not more than 3 μm, from not less than 3 μm to not more than 4 μm, from not less than 4 μm to not more than 5 μm, from not less than 5 μm to not more than 6 μm, from not less than 6 μm to not more than 7 μm, or from not less than 7 μm to not more than 8 μm. In this embodiment, the trench depth D is from not less than 5 μm to not more than 8 μm.

The insulating layer 23 is formed in a film shape along an inner wall of the trench 22. The insulating layer 23 defines a U letter space which is recessed in a U letter shape inside the trench 22. The insulating layer 23 may include at least any one of an SiO$_2$ layer, an SiN layer, an Al$_2$O$_3$ layer, a ZrO$_2$ layer and a Ta$_2$O$_3$ layer.

The insulating layer 23 may have a single-layer structure which includes an SiO$_2$ layer, an SiN layer, an Al$_2$O$_3$ layer, a ZrO$_2$ layer or a Ta$_2$O$_3$ layer. The insulating layer 23 may have a laminated structure in which one or not less than two of an SiO$_2$ layer, an SiN layer, an Al$_2$O$_3$ layer, a ZrO$_2$ layer and a Ta$_2$O$_3$ layer are laminated in any given manner. In this embodiment, the insulating layer 23 has a single-layer structure which includes an SiO$_2$ layer.

The insulating layer 23 includes a bottom-side insulating layer 28 and an opening-side insulating layer 29 which are formed from the bottom wall 27 side of the trench to an opening side in this order. The bottom-side insulating layer 28 covers an inner wall on the bottom wall 27 side of the trench 22. Specifically, the bottom-side insulating layer 28 covers the inner wall on the bottom wall 27 side with respect to a bottom portion of the body region 20. That is, the bottom-side insulating layer 28 is in contact with the intermediate concentration region 12 and the low concentration region 13. The bottom-side insulating layer 28 defines the U letter space on the bottom wall 27 side. The bottom-side insulating layer 28 may be partially in contact with the body region 20.

The opening-side insulating layer 29 covers an inner wall on the opening side of the trench 22. Specifically, the opening-side insulating layer 29 covers the side wall 26 in an opening-side region with respect to the bottom portion of the body region 20. The opening-side insulating layer 29 is in contact with the body region 20. The opening-side insulating layer 29 maybe in contact with the low concentration region 13 in a region outside the body region 20. The opening-side insulating layer 29 may be partially in contact with the intermediate concentration region 12.

The bottom-side insulating layer 28 has a first thickness T1. The opening-side insulating layer 29 has a second thickness T2 than the first thickness T1 (T2<T1). The second thickness T2 maybe from not less than 1/100 of the first thickness T1 to not more than 1/10 thereof. The first thickness T1 is a thickness of the inner wall of the trench 22 along the normal direction in the bottom-side insulating layer 28. The second thickness T2 is a thickness of the inner wall of the trench 22 along the normal direction in the opening-side insulating layer 29.

A ratio T1/W of the first thickness T1 of the bottom-side insulating layer 28 with respect to the trench width W may be from not less than 0.1 to not more than 0.4. The ratio T1/W may be from not less than 0.1 to not more than 0.2, from not less than 0.2 to not more than 0.3, or from not less than 0.3 to not more than 0.4. The ratio T1/W is preferably from not less than 0.25 to not more than 0.35.

The first thickness T1 of the bottom-side insulating layer 28 may be from not less than 0.1 μm to not more than 1.5 μm. The first thickness T1 may be from not less than 0.1 μm to not more than 0.25 μm, from not less than 0.25 μm to not more than 0.5 μm, from not less than 0.5 μm to not more than 0.75 μm, from not less than 0.75 μm to not more than 1 μm, from not less than 1 μm to not more than 1.25 μm, or from not less than 1.25 μm to not more than 1.5 μm. The first thickness T1 is preferably from not less than 0.15 μm to not more than 1 μm.

The second thickness T2 of the opening-side insulating layer 29 may be from not less than 0.01 μm to not more than 0.15 μm. The second thickness T2 may be from not less than 0.01 μm to not more than 0.025 μm, from not less than 0.025 μm to not more than 0.05 μm, from not less than 0.05 μm to not more than 0.075 μm, from not less than 0.075 μm to not more than 0.1 μm, from not less than 0.1 μm to not more than 0.125 μm, or from not less than 0.125 μm to not more than 0.15 μm. The second thickness T2 is preferably from not less than 0.05 μm to not more than 0.1 μm.

In this embodiment, the embedded electrode 24 has an insulated-separation type split electrode structure which includes a bottom-side electrode 31, an opening-side electrode 32 and an intermediate insulating layer 33.

A reference voltage (for example, ground voltage) may be applied to the bottom-side electrode 31, and a gate voltage may be applied to the opening-side electrode 32. In this case, while the bottom-side electrode 31 functions as a field electrode, the opening-side electrode 32 functions as a gate electrode. It is, thereby, possible to reduce a parasitic capacitance and also improve a switching speed.

A gate voltage may be applied to the bottom-side electrode 31 and the opening-side electrode 32. In this case, the bottom-side electrode 31 and the opening-side electrode 32 function as a gate electrode. Thereby, a voltage drop between the bottom-side electrode 31 and the opening-side electrode 32 can be suppressed, thus making it possible to suppress an undesired electric field concentration between the bottom-side electrode 31 and the opening-side electrode 32. It is also possible to lower an on-resistance in the epitaxial layer 6 and then reduce electricity consumption.

The bottom-side electrode 31 is embedded in the bottom wall 27 side across the insulating layer 23. Specifically, the bottom-side electrode 31 is embedded in the bottom wall 27 side across the bottom-side insulating layer 28. The bottom-side electrode 31 faces the intermediate concentration region 12 and the low concentration region 13 across the bottom-side insulating layer 28. The bottom-side electrode 31 may partially face the body region 20 across the bottom-side insulating layer 28. The bottom-side electrode 31 includes a drawing portion which is drawn out to an opening of the trench 22 in a region which is not shown. A gate voltage or a reference voltage is applied to the drawing portion of the bottom-side electrode 31.

The bottom-side electrode 31 includes an upper end portion 34, a lower end portion 35 and a wall portion 36. The upper end portion 34 is positioned closer to an opening side of the trench 22 than a middle portion of the trench 22 in terms of the normal direction Z. The upper end portion 34 faces the low concentration region 13 across the bottom-side insulating layer 28.

The lower end portion 35 is positioned closer to the bottom wall 27 side of the trench 22 than the middle portion of the trench 22 in terms of the normal direction Z. The lower end portion 35 faces the intermediate concentration region 12 across the bottom-side insulating layer 28. The lower end portion 35 is formed in a curved shape toward the bottom wall 27 of the trench 22.

Specifically, the lower end portion 35 is formed by following a bottom wall of the U letter space defined by the bottom-side insulating layer 28 and formed in a smoothly curved shape toward the bottom wall 27 of the trench 22. It is, thereby, possible to suppress a local electric field concentration on the bottom-side electrode 31 and also suppress a reduction in breakdown voltage BVDSS.

The wall portion 36 connects the upper end portion 34 and the lower end portion 35 to extend in a wall shape along the side wall 26 of the trench 22. A width of the wall portion 36 in the first direction X is in excess of a width of the upper end portion 34 in the first direction X.

The bottom-side electrode 31 may include at least any one of conductive polysilicon, tungsten, aluminum, copper, an aluminum alloy and a copper alloy. In this embodiment, the bottom-side electrode 31 includes conductive polysilicon. The bottom-side electrode 31 may include n-type polysilicon or p-type polysilicon.

The opening-side electrode 32 is embedded in the opening side of the trench 22 across the insulating layer 23. Specifically, the opening-side electrode 32 is embedded in the opening side of the trench 22 across the opening-side insulating layer 29. The opening-side electrode 32 faces the body region 20 across the opening-side insulating layer 29. The opening-side electrode 32 may partially face the low concentration region 13 across the opening-side insulating layer 29.

In this embodiment, the opening-side electrode 32 is formed at an interval to the bottom wall 27 side of the trench from the epitaxial main surface 7. Thereby, the opening-side electrode 32 defines a recessed space between the side wall 26 and the opening-side electrode 32 at the opening side of the trench 22.

The opening-side electrode 32 may include at least any one of conductive polysilicon, tungsten, aluminum, copper, an aluminum alloy and a copper alloy. The opening-side electrode 32 preferably includes the same conductive material as the bottom-side electrode 31. In this embodiment, the opening-side electrode 32 includes conductive polysilicon. The opening-side electrode 32 may include n-type polysilicon or p-type polysilicon.

The intermediate insulating layer 33 is interposed between the bottom-side electrode 31 and the opening-side electrode 32 and electrically insulates the bottom-side electrode 31 and the opening-side electrode 32. Specifically, the intermediate insulating layer 33 covers the upper end portion 34 of the bottom-side electrode 31 exposed from the bottom-side insulating layer 28 in a region between the bottom-side electrode 31 and the opening-side electrode 32. The intermediate insulating layer 33 is continuous with the insulating layer 23 (the bottom-side insulating layer 28 and the opening-side insulating layer 29).

The intermediate insulating layer 33 has a third thickness T3 in terms of the normal direction Z. The third thickness T3 is in excess of the second thickness T2 of the opening-side insulating layer 29 (T2<T3). The third thickness T3 may be from not less than 0.1 μm to not more than 1.5 μm. The third thickness T3 may be from not less than 0.1 μm to not more than 0.25 μm, from not less than 0.25 μm to not more than 0.5 μm, from not less than 0.5 μm to not more than 0.75 μm, from not less than 0.75 μm to not more than 1 μm, from not less than 1 μm to not more than 1.25 μm, or from not less than 1.25 μm to not more than 1.5 μm. The third thickness T3 is preferably from not less than 0.2 μm to not more than 0.5 μm.

The intermediate insulating layer 33 may include at least any one of an $SiO_2$ layer, an SiN layer, an $Al_2O_3$ layer, a $ZrO_2$ layer and a $Ta_2O_3$ layer. The intermediate insulating layer 33 may have a single-layer structure which includes an $SiO_2$ layer, an SiN layer, an $Al_2O_3$ layer, a $ZrO_2$ layer or a $Ta_2O_3$ layer.

The intermediate insulating layer 33 may have a laminated structure in which any one or not less than two of an $SiO_2$ layer, an SiN layer, an $Al_2O_3$ layer, a $ZrO_2$ layer and a $Ta_2O_3$ layer are laminated in any given manner. The intermediate insulating layer 33 is preferably composed of the same insulating material as the insulating layer 23. In this embodiment, the intermediate insulating layer 33 includes an $SiO_2$ layer.

The insulator 25 is embedded in the opening side of the trench 22. Specifically, the insulator 25 is embedded in the recessed space defined by the side wall 26 and the opening-side electrode 32 at the opening side of the trench 22. The insulator 25 has an exposed surface 37 which is exposed from the trench 22. The exposed surface 37 may be positioned at the bottom wall 27 side of the trench 22 with respect to the epitaxial main surface 7. The exposed surface 37 may have a curved surface which is recessed toward the bottom wall 27 side of the trench 22.

The insulator 25 may include at least any one of an $SiO_2$ layer, an SiN layer, an $Al_2O_3$ layer, a $ZrO_2$ layer and a $Ta_2O_3$ layer. The insulator 25 may have a single-layer structure which includes an $SiO_2$ layer, an SiN layer, an $Al_2O_3$ layer, a $ZrO_2$ layer or a $Ta_2O_3$ layer.

The insulator 25 may have a laminated structure in which one or not less than two of an $SiO_2$ layer, an SiN layer, an $Al_2O_3$ layer, a $ZrO_2$ layer and a $Ta_2O_3$ layer are laminated in any given manner. The insulator 25 is preferably composed of the same insulating material as the insulating layer 23. In this embodiment, the insulator 25 includes an $SiO_2$ layer.

With reference to FIG. 1, FIG. 2 and FIG. 4, the semiconductor device 1 includes a plurality of $n^{++}$-type source regions 41 which are each formed in a plurality of regions along trenches 22 in the body region 20. The plurality of source regions 41 are formed in the surface layer portion of the body region 20 such as to be exposed from the epitaxial main surface 7.

The source region 41 has an n-type impurity concentration in excess of the n-type impurity concentration of the low concentration region 13. The n-type impurity concentration of the source region 41 is in excess of the n-type impurity concentration of the intermediate concentration region 12. The n-type impurity concentration of the source region 41 is in excess of the n-type impurity concentration of the high concentration region 11. A peak value of the n-type impurity concentration of the source region 41 may be from not less than $1 \times 10^{19}$ $cm^{-3}$ to not more than $1 \times 10^{21}$ $cm^{-3}$. In this embodiment, the peak value of the n-type impurity concentration of the source region 41 is from not less than $1 \times 10^{19}$ $cm^{-3}$ to not more than $1 \times 10^{20}$ $cm^{-3}$.

The plurality of source regions 41 are each formed in a band shape extending along the plurality of trenches 22 in plan view. Each of the source regions 41 is formed in a vertically long band shape which extends along a side wall 26 of a corresponding trench 22 from the epitaxial main surface 7 toward the bottom portion of the body region 20 in a cross sectional view.

Each of the source regions 41 covers the insulator 25 which is exposed from a corresponding trench 22. Each of the source regions 41 also crosses the insulator 25 along the normal direction Z and covers the opening-side insulating layer 29 exposed from a corresponding trench 22.

Thereby, each of the source regions 41 faces the opening-side electrode 32 across the opening-side insulating layer 29. A bottom portion of each of the source regions 41 is positioned in a region at the epitaxial main surface 7 side with respect to the bottom portion of the body region 20. Each of the source regions 41 demarcates a p-type channel 42 of a MISFET between the low concentration region 13 and the source regions 41 in the body region 20. In other words, the channel 42 of the MISFET is formed within the low concentration region 13.

The semiconductor device 1 includes a plurality of contact holes 43 which are each formed in a plurality of regions between the trenches 22. The plurality of contact holes 43 are formed alternately with the plurality of trenches 22 along the first direction X in such a mode that one trench 22 is held therebetween. The plurality of contact holes 43 are each formed in a band shape extending along the second direction Y in plan view.

Thereby, the plurality of contact holes 43 are formed in a stripe shape extending along the second direction Y as a whole in plan view. Although they are not shown specifically, a length of each of the contact holes 43 in the second direction Y is preferably less than a length of the trench 22 in the second direction Y in plan view.

Each of the contact holes 43 is formed at an interval from the trench 22 in plan view. Each of the contact holes 43 faces the trench 22 on one side across one source region 41 and faces the trench 22 on the other side across one source region 41. Ina cross sectional view, each of the contact holes 43 exposes source regions 41 from both sides. Each of the contact holes 43 faces the insulator 25 in the first direction X. Each of the contact holes 43 may partially face the opening-side electrode 32 in the first direction X.

Each of the contact holes 43 includes a contact side wall 44 and a contact bottom wall 45. The contact side wall 44 extends in a wall shape along the normal direction Z. The contact side wall 44 faces the insulator 25 across the source region 41. The contact side wall 44 may partially face the opening-side electrode 32 across the source region 41.

The contact bottom wall 45 is positioned in a region at the bottom portion side of the body region 20 with respect to a bottom portion of the source region 41. The contact bottom wall 45 is positioned in a region at the epitaxial main surface 7 side with respect to the bottom portion of the body region 20. The contact bottom wall 45 may be positioned in a region at the epitaxial main surface 7 side with respect to the bottom portion of the source region 41.

The contact side wall 44 may be inclined to the epitaxial main surface 7. An angle (absolute value) of the contact side wall 44 formed with the epitaxial main surface 7 inside the epitaxial layer 6 may be from not less than 90° to not more than 95°. The angle may be from not less than 90° to not more than 95°. The angle may be from not less than 90° to not more than 91°, from not less than 91° to not more than 92°, from not less than 92° to not more than 93°, from not less than 93° to not more than 94°, or from not less than 94° to not more than 95°.

The angle may be in excess of 90° and not more than 92°. That is, the contact hole 43 may be formed in a tapered shape such as to be made narrow from the epitaxial main surface 7 toward the contact bottom wall 45 in a cross sectional view.

The contact hole 43 has a contact width WC and a contact depth DC. The contact width WC is a width of the contact hole 43 in the first direction X. The contact depth DC is a depth of the contact hole 43 in the normal direction Z, with the epitaxial main surface 7 given as a reference.

The contact width WC is preferably less than the trench width W (WC<W). The contact width WC may be from not less than 0.1 μm to not more than 0.3 μm. The contact width WC may be from not less than 0.1 μm to not more than 0.2 μm, from not less than 0.2 μm to not more than 0.3 μm, or from not less than 0.2 μm to not more than 0.3 μm.

The contact depth DC is less than a thickness of the body region 20. The contact depth DC may be from not less than 0.1 μm to not more than 0.5 μm. The contact depth DC may be from not less than 0.1 μm to not more than 0.2 μm, from not less than 0.2 μm to not more than 0.3 μm, from not less than 0.3 μm to not more than 0.4 μm, or from not less than 0.4 μm to not more than 0.5 μm.

With reference to FIG. 2 and FIG. 4, the semiconductor device 1 includes a plurality of $p^+$-type contact regions 46 which are each formed in a plurality of regions along the contact holes 43 within the body region 20. Each of the contact regions 46 is formed along each of the contact bottom walls 45. Each of the contact regions 46 has a p-type impurity concentration in excess of the p-type impurity concentration of the body region 20. A peak value of the p-type impurity concentration of each of the contact regions 46 may be from not less than $1 \times 10^{19}$ cm$^{-3}$ to not more than $1 \times 10^{21}$ cm$^{-3}$.

Each of the contact regions 46 entirely covers each of the contact bottom walls 45. Each of the contact regions 46 extends in parallel to the contact bottom wall 45. The bottom portion of each of the contact regions 46 is positioned in a region at the contact bottom wall 45 side with respect to the bottom portion of the body region 20. Each of the contact regions 46 may be connected to the plurality of source regions 41. Each of the contact regions 46 may have a portion which covers the contact side wall 44 through a corner portion of the contact hole 43.

With reference to FIG. 2 and FIG. 4, the semiconductor device 1 includes a source electrode 51 formed on the epitaxial main surface 7. The source electrode 51 transmits a reference voltage (for example, a ground voltage) to the body region 20, the source region 41 and a contact region 46.

The source electrode 51 covers the plurality of trenches 22 and enters the plurality of contact holes 43. The source electrode 51 covers the exposed surfaces 37 of the plurality of insulators 25. The source electrode 51 is electrically connected to the body region 20, the plurality of source regions 41 and the plurality of contact regions 46 inside the plurality of contact holes 43.

The source electrode 51 includes a plurality of first electrode layers 52 and a second electrode layer 53. The plurality of first electrode layers 52 are layers positioned inside the plurality of contact holes 43. The second electrode layer 53 is a layer positioned outside the plurality of contact holes 43.

Each of the first electrode layers 52 is electrically connected to the plurality of source regions 41 and contact regions 46 inside a corresponding contact hole 43. Thereby, each of the first electrode layers 52 is electrically connected to the body region 20 via the contact region 46.

Each of the first electrode layers 52 has an electrode surface 54 which is exposed from the contact hole 43. The electrode surface 54 may be positioned at the contact bottom wall 45 side with respect to the epitaxial main surface 7. The electrode surface 54 may have a curved surface which is recessed toward the contact bottom wall 45.

In this embodiment, each of the first electrode layers 52 has a laminated structure in which a plurality of electrodes are laminated. In this embodiment, the first electrode layer 52 includes a first layer 55 and a second layer 56 which are laminated in this order from an inner wall of the contact hole 43.

The first layer 55 is formed in a film shape along the inner wall of the contact hole 43. The first layer 55 defines a recessed space inside the contact hole 43. The first layer 55 includes at least one of a Ti (titanium) layer and a TiN (titanium nitride) layer. The first layer 55 may have a laminated structure which includes a Ti layer and a TiN layer which are laminated in this order from the inner wall of the contact hole 43. The first layer 55 may have a single-layer structure which includes a Ti layer or a TiN layer. The first layer 55 is formed as a barrier layer against the second layer 56.

The second layer 56 is embedded in the contact hole 43 across the first layer 55. Specifically, the second layer 56 is embedded in the recessed space defined by the first layer 55. The second layer 56 includes a W (tungsten) layer. The electrode surface 54 of each of the first electrode layers 52 is formed by the first layer 55 and the second layer 56.

The second electrode layer 53 covers the plurality of first electrode layers 52. Specifically, the second electrode layer 53 covers the electrode surfaces 54 of the plurality of first electrode layers 52 and the exposed surfaces 37 of the plurality of insulators 25. Thereby, the second electrode layer 53 is in contact with the exposed surface 37 of the insulator 25 and connected to the electrode surface 54 of the first electrode layer 52. The second electrode layer 53 is electrically connected to the body region 20, the plurality of source regions 41 and the plurality of contact regions 46 via the plurality of first electrode layers 52.

In this embodiment, the second electrode layer 53 has a laminated structure in which a plurality of electrodes are laminated. In this embodiment, the second electrode layer 53 includes a first layer 57 and a second layer 58 laminated in this order from the epitaxial main surface 7.

The first layer 57 is formed in a film shape along the epitaxial main surface 7. The first layer 57 is in contact with the exposed surface 37 of the insulator 25 and also connected to the electrode surface 54 of the first electrode layer 52. The first layer 55 includes at least one of a Ti (titanium) layer and a TiN (titanium nitride) layer. The first layer 57 may have a laminated structure which includes a Ti layer and a TiN layer laminated in this order from the epitaxial main surface 7. The first layer 57 may have a single-layer structure which includes a Ti layer or a TiN layer. The first layer 57 is formed as a barrier layer against the second layer 56.

The second layer 58 is formed in a film shape on the first layer 57. The second layer 58 may include at least any one of a nickel layer, a palladium layer, an aluminum layer, a copper layer, an aluminum alloy layer and a copper alloy layer. The second layer 58 may have a single-layer structure which includes a nickel layer, a palladium layer, an aluminum layer, a copper layer, an aluminum alloy layer or a copper alloy layer. The second layer 58 may have a laminated structure in which one or not less than two of a nickel layer, a palladium layer, an aluminum layer, a copper layer, an aluminum alloy layer and a copper alloy layer are laminated in any given manner.

The semiconductor device 1 includes a drain electrode 59 which is formed on the second substrate main surface 4. The drain electrode 59 is electrically connected to the semiconductor substrate 2. The drain electrode 59 transmits a power supply voltage to the semiconductor substrate 2 and the epitaxial layer 6.

The drain electrode 59 may include at least any one of a Ti layer, an Ni layer, an Au layer, an Ag layer and an Al layer. The drain electrode 59 may have a single-layer structure which includes a Ti layer, an Ni layer, an Au layer, an Ag layer or an Al layer. The drain electrode 59 may have a laminated structure in which one or not less than two of a Ti layer, an Ni layer, an Au layer, an Ag layer and an Al layer are laminated in any given manner.

Figure 5:
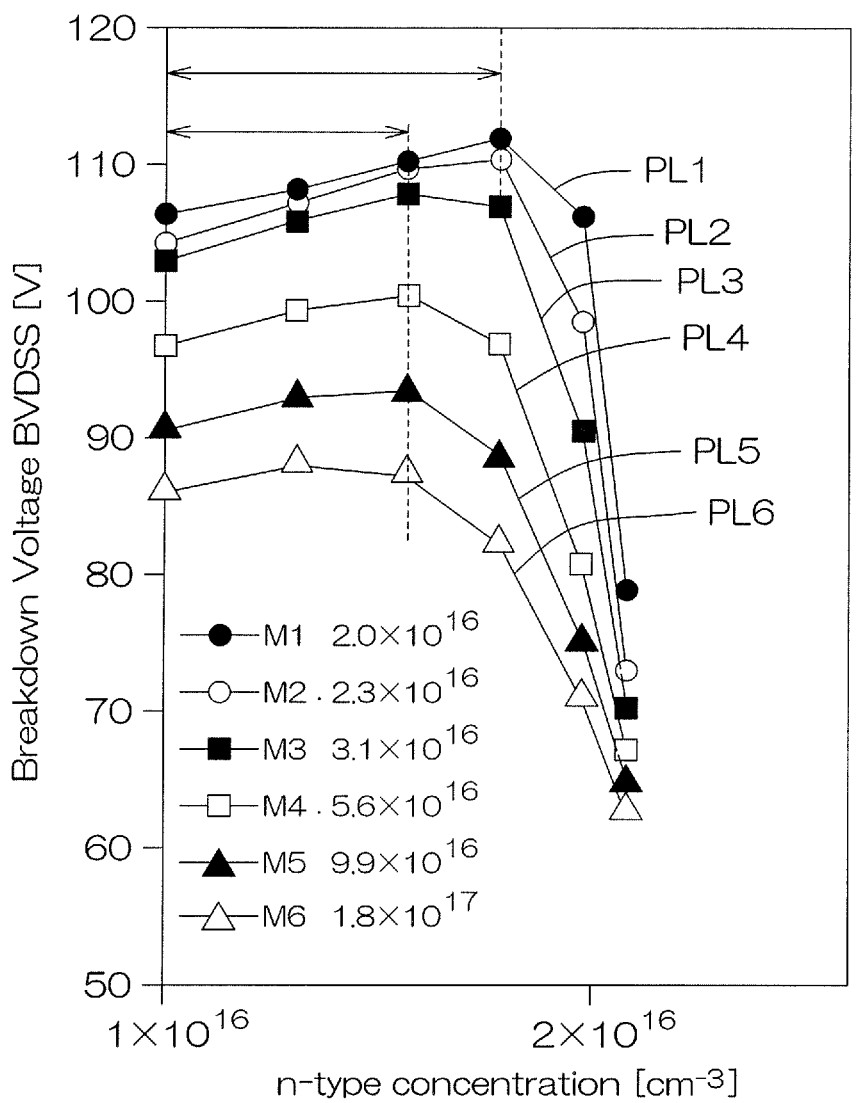
FIG. 5 is a graph which is obtained by simulating characteristics of a breakdown voltage.

FIG. 5 is a graph which is obtained by simulating characteristics of a breakdown voltage BVDSS. In FIG. 5, the vertical axis indicates a breakdown voltage BVDSS [V], while the horizontal axis indicates an n-type impurity concentration of the low concentration region 13.

Here, a first model M1, a second model M2, a third model M3, a fourth model M4, a fifth model M5 and a sixth model M6 were prepared to examine the respective breakdown voltages BVDSS of the first to sixth models M1 to M6. Also, examined was a breakdown voltage BVDSS when an n-type impurity concentration of the low concentration region 13 according to each of the first to the sixth models M1 to M6 was changed from $1\times10^{16}$ cm$^{-3}$ to $2.1\times10^{16}$ cm$^{-3}$.

Each of the first to the sixth models M1 to M6 has an n-type impurity concentration mutually different in terms of the high concentration transition region 14. An increase in n-type impurity concentration of the high concentration transition region 14 means an increase in n-type impurity concentration of the intermediate concentration region 12 in its entirety (also refer to FIG. 3). A decrease in n-type impurity concentration of the high concentration transition region 14 means a decrease in n-type impurity concentration of the intermediate concentration region 12 in its entirety (also refer to FIG. 3).

In the first model M1, the n-type impurity concentration of the high concentration transition region 14 is set at $2.0\times10^{16}$ cm$^{-3}$. In the second model M2, the n-type impurity concentration of the high concentration transition region 14 is set at $2.3\times10^{16}$ cm$^{-3}$. In the third model M3, the n-type impurity concentration of the high concentration transition region 14 is set at $3.1\times10^{16}$ cm$^{-3}$.

In the fourth model M4, the n-type impurity concentration of the high concentration transition region 14 is set at $5.6\times10^{16}$ cm$^{-3}$. In the fifth model M5, the n-type impurity concentration of the high concentration transition region 14 is set at $9.9\times10^{16}$ cm$^{-3}$. In the sixth model M6, the n-type impurity concentration of the high concentration transition region 14 is set at $1.8\times10^{17}$ cm$^{-3}$.

In FIG. 5, there are shown a first polygonal line PL1, a second polygonal line PL2, a third polygonal line PL3, a fourth polygonal line PL4, a fifth polygonal line PL5 and a sixth polygonal line PL6. The first polygonal line PL1 shows an evaluation result of the first model M1. The second polygonal line PL2 shows an evaluation result of the second model M2. The third polygonal line PL3 shows an evaluation result of the third model M3. The fourth polygonal line PL4 shows an evaluation result of the fourth model M4. The fifth polygonal line PL5 shows an evaluation result of the fifth model M5. The sixth polygonal line PL6 shows an evaluation result of the sixth model M6.

With reference to the first to sixth polygonal lines PL1 to PL6, it has been found that an increase in n-type impurity concentration of the high concentration transition region 14 (intermediate concentration region 12) results in a reduction in breakdown voltage BVDSS. On the other hand, it has been found that an increase in n-type impurity concentration of the low concentration region 13 results in an increase in breakdown voltage BVDSS in a predetermined range but results in a reduction in breakdown voltage BVDSS in excess of the predetermined range.

For example, in the first model M1 and the second model M2, when the n-type impurity concentration of the low concentration region 13 is in a range of not less than $1.0\times10^{16}$ cm$^{-3}$ to not more than $1.8\times10^{16}$ cm$^{-3}$, the breakdown voltage BVDSS is increased, but in excess of this range, the breakdown voltage BVDSS is sharply reduced. Further, in the third to the sixth models M3 to M6, when the n-type impurity concentration of the low concentration region 13 is in a range of not less than $1.0\times10^{16}$ cm$^{-3}$ to not more than $1.5\times10^{16}$ cm$^{-3}$, the breakdown voltage BVDSS is increased, but in excess of this range, the breakdown voltage BVDSS is sharply reduced.

From these results, it has been found that the n-type impurity concentration of the high concentration transition region 14 is in particular preferably from not less than $2\times10^{16}$ cm$^{-3}$ to not more than $5\times10^{16}$ cm$^{-3}$. It has been also found that the n-type impurity concentration of the low concentration region 13 is in particular preferably from not less than $1\times10^{16}$ cm$^{-3}$ to not more than $1.8\times10^{16}$ cm$^{-3}$.

FIG. 6 is a graph which is obtained by simulating a second concentration profile PF2 where the semiconductor substrate 2 that includes phosphorus as a main n-type impurity in place of arsenic is adopted. In FIG. 6, the vertical axis indicates an n-type impurity concentration [cm$^{-3}$], while the horizontal axis indicates a depth [μm], with the epitaxial main surface 7 given as a reference (zero point). In FIG. 6, the concentration profiles PF1 shown in FIG. 3 are indicated by a broken line.

With reference to FIG. 6, where the semiconductor substrate 2 which includes phosphorus as a main n-type impurity in place of arsenic is adopted, the epitaxial layer 6 does not have the intermediate concentration region 12 but includes only the high concentration region 11 and the low concentration region 13. The high concentration region 11 is formed by diffusing phosphorus in the semiconductor substrate 2 to the epitaxial layer 6.

In the second concentration profile PF2, an n-type impurity concentration of a portion corresponding to the high concentration transition region 14 of the concentration profile PF1 is in excess of $1\times10^{19}$ cm$^{-3}$. Therefore, it has been found that where the semiconductor substrate 2 which includes phosphorus as a main n-type impurity in place of arsenic is adopted, the breakdown voltage BVDSS is significantly reduced as apparent from the results of the graph shown in FIG. 5.

As described above, the semiconductor device 1 includes the semiconductor substrate 2, the epitaxial layer 6 and the trench structure 21. The semiconductor substrate 2 includes the n-type impurity having a diffusion coefficient less than the diffusion coefficient of phosphorus. Specifically, the semiconductor substrate 2 includes arsenic as the main n-type impurity. Thereby, it is possible to suppress an undesired diffusion of the n-type impurity (arsenic) from the semiconductor substrate 2 to the epitaxial layer 6. As a result, it is possible to suppress an undesired increase in concentration of the epitaxial layer 6 due to the n-type impurity (arsenic) of the semiconductor substrate 2 and, therefore, appropriately adjust the n-type impurity concentration of the epitaxial layer 6.

The epitaxial layer 6 includes the high concentration region 11, the intermediate concentration region 12 and the low concentration region 13 which are formed in this order from the semiconductor substrate 2 side. The epitaxial layer 6 has the n-type impurity concentration gradient in which the n-type impurity concentration is decreased in the downward step-wise manner from the semiconductor substrate 2 toward the crystal growth direction by the high concentration region 11, the intermediate concentration region 12 and the low concentration region 13.

The high concentration region 11 is a buffer region which incorporates arsenic diffused from the semiconductor substrate 2. The intermediate concentration region 12 is a region which partially raises the n-type impurity concentration of the epitaxial layer 6 to reduce the resistance of the epitaxial layer 6. The low concentration region 13 is a region that suppresses the increase in the concentration of the entire region of the epitaxial layer 6.

In a region where the trench structure 21 is formed in the epitaxial layer 6, electric field concentration is likely to occur due to a structure in which a current path is restricted. In other words, electric field concentration is likely to occur in a region of the epitaxial layer 6 where the channel 42 is formed. Further, when a region where the trench structure 21 is formed in the epitaxial layer 6 is increased in concentration, a depletion layer from the trench structure 21 spreads insufficiently, thus resulting in a reduction in breakdown voltage BVDSS.

Thus, in the semiconductor device 1, the low concentration region 13 is formed in the region where the trench structure 21 is formed in the epitaxial layer 6. It is, thereby, possible to appropriately form the depletion layer in the low concentration region 13. Therefore, it is possible to provide the semiconductor device 1 capable of reducing a resistance of the epitaxial layer 6, while suppressing a reduction in breakdown voltage BVDSS.

Further, according to the semiconductor device 1, the trench structure 21 is formed which penetrates through the low concentration region 13 and reaches the intermediate concentration region 12. The above-described structure is able to dissipate an electric field which gives a load to the trench structure 21 to the low concentration region 13 and the intermediate concentration region 12. It is, thereby, possible to suppress a local electric field concentration in the low concentration region 13 and the intermediate concentration region 12. As a result, it is possible to appropriately suppress a reduction in breakdown voltage BVDSS. The above-described structure is in particular effective in a case where the plurality of trench structures 21 are formed.

Further, according to the semiconductor device 1, the trench structure 21 is formed at an interval from the high concentration region 11. It is, thereby, possible to appropriately widen the depletion layer from the trench structure 21 and, therefore, appropriately suppress a reduction in breakdown voltage BVDSS.

Figure 7B:
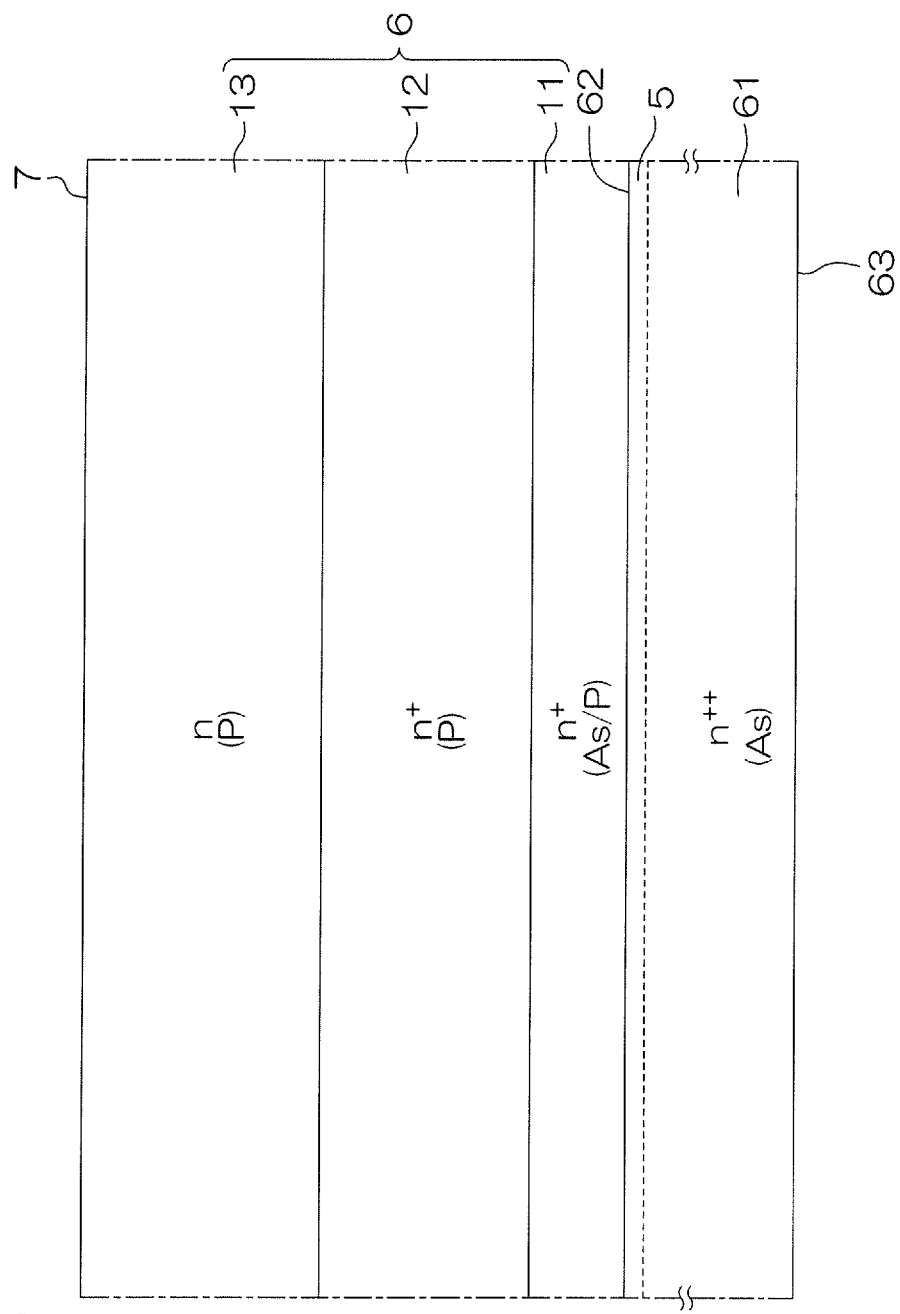
FIG. 7A to FIG. 7Z are each a sectional view of a region corresponding to that of FIG. 2 and a sectional view for describing one example of a method for manufacturing the semiconductor device shown in FIG. 1.
Figure 7C:
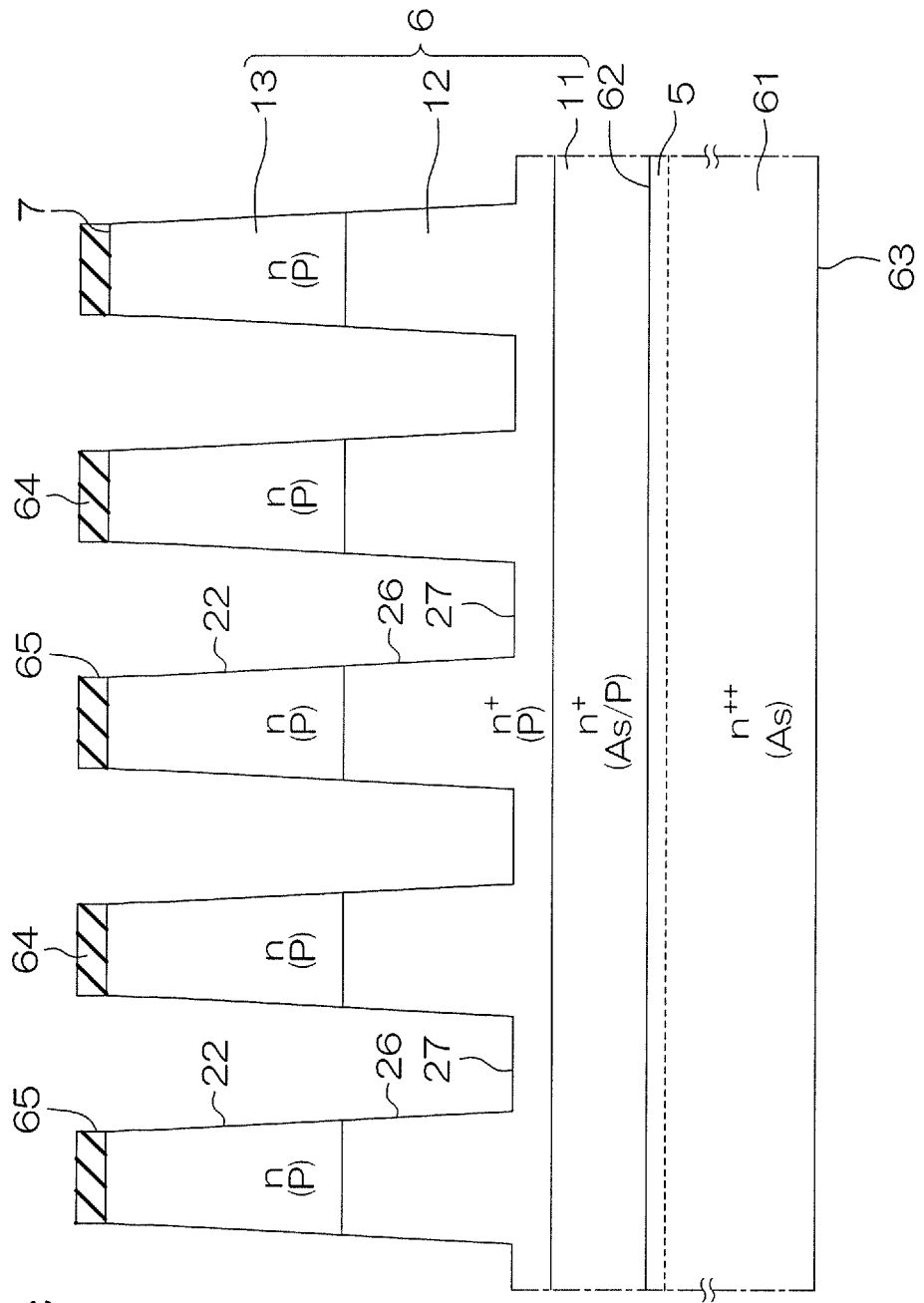
Figure 7D:
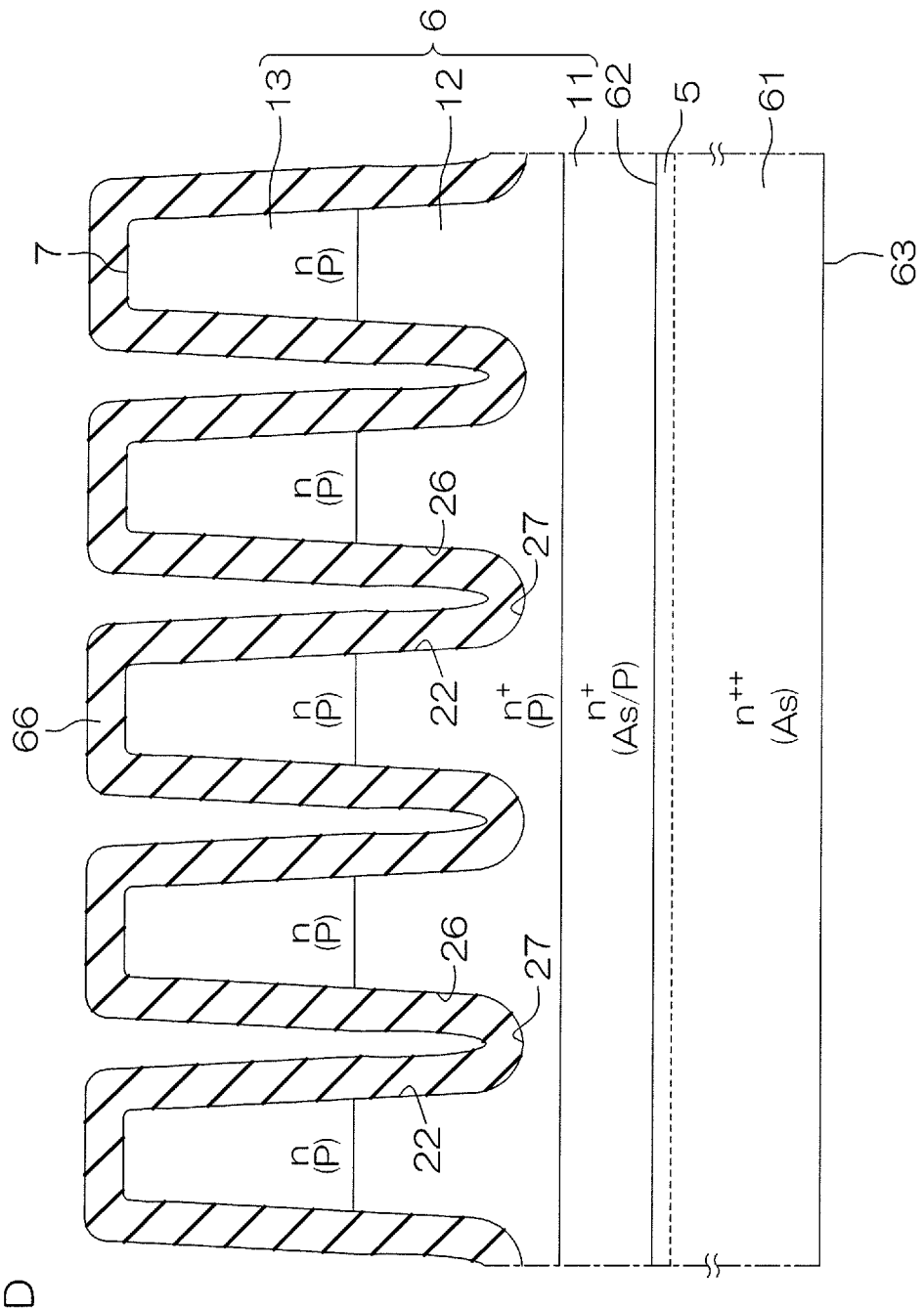
Figure 7E:
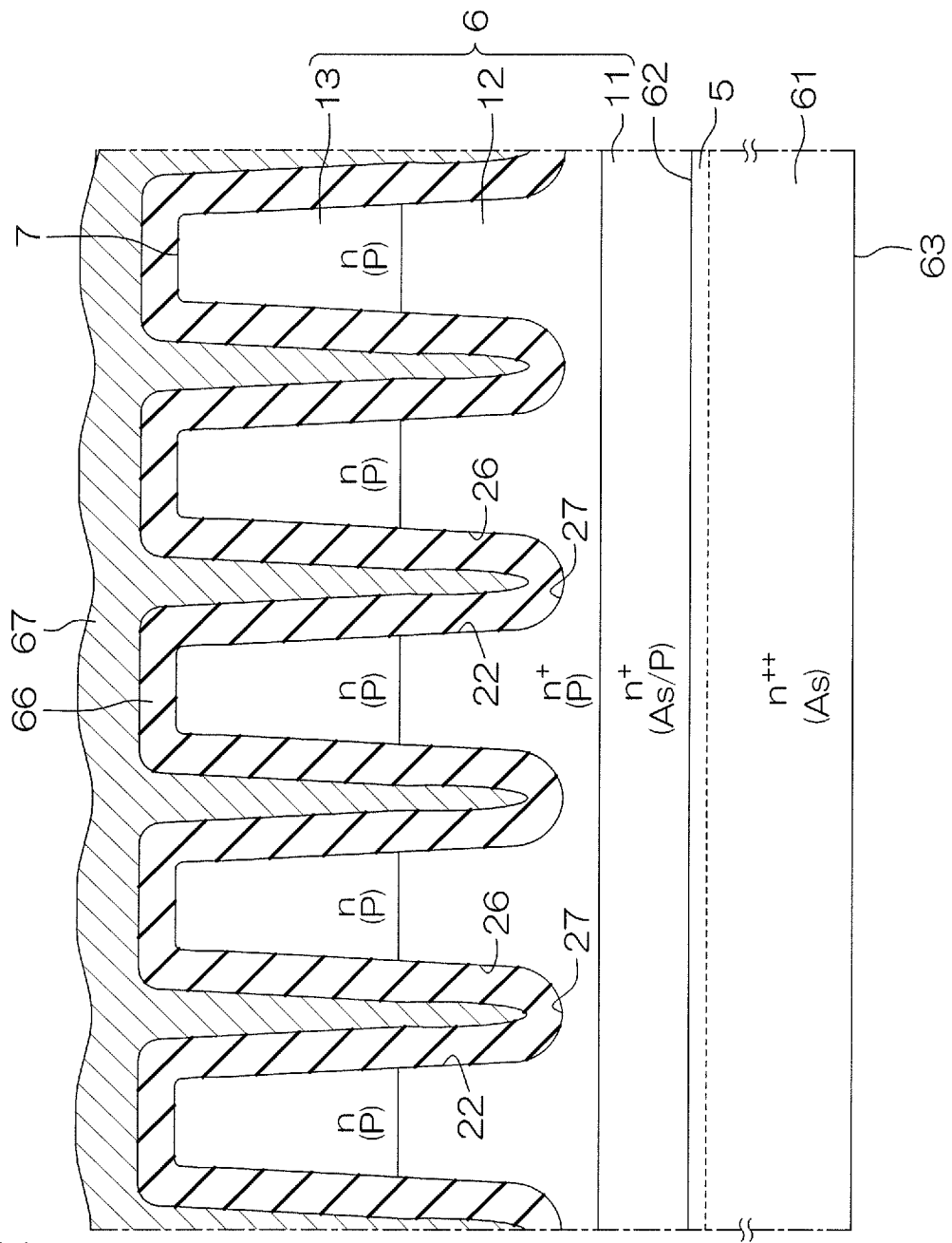
Figure 7F:
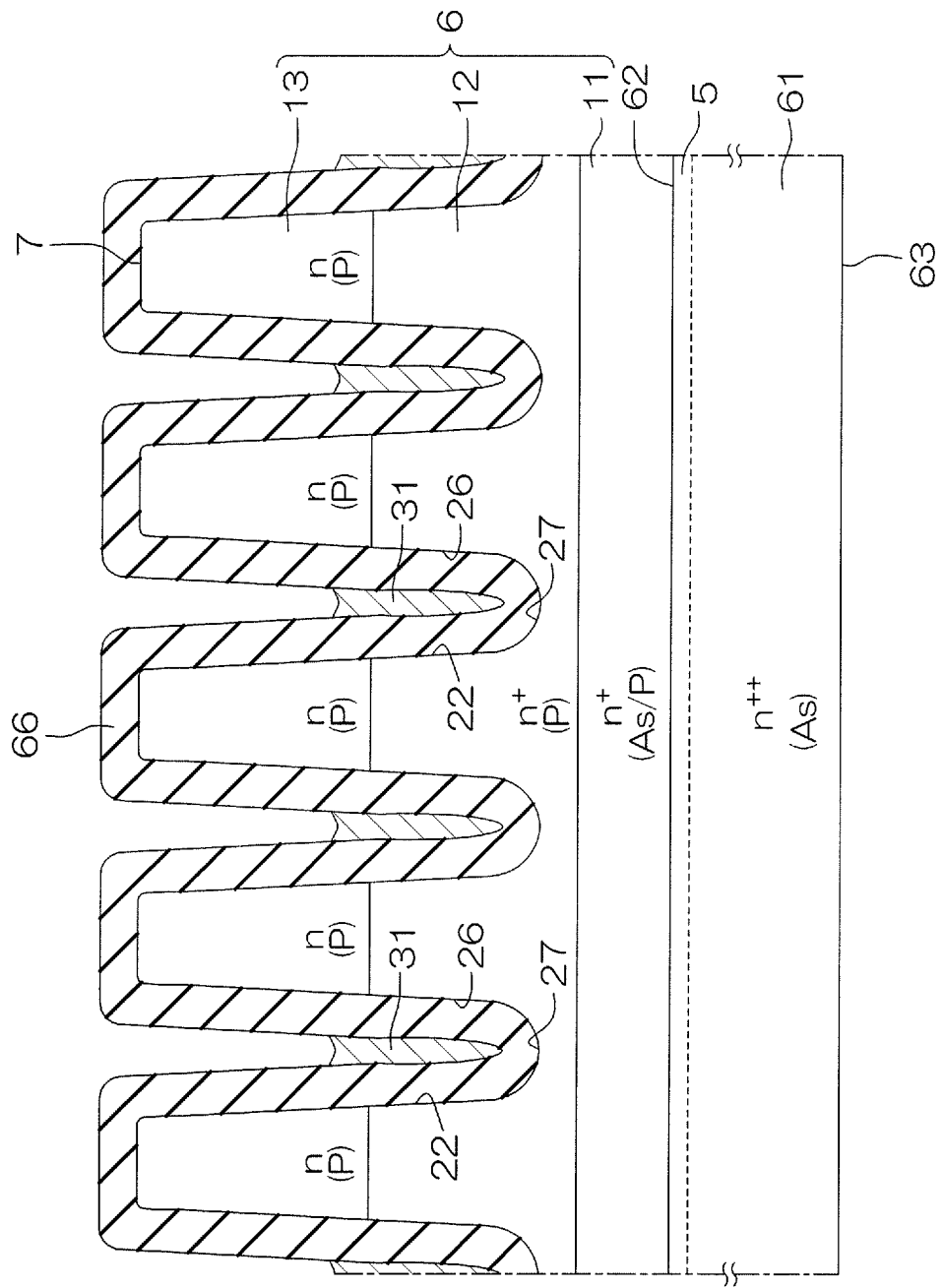
Figure 7G:
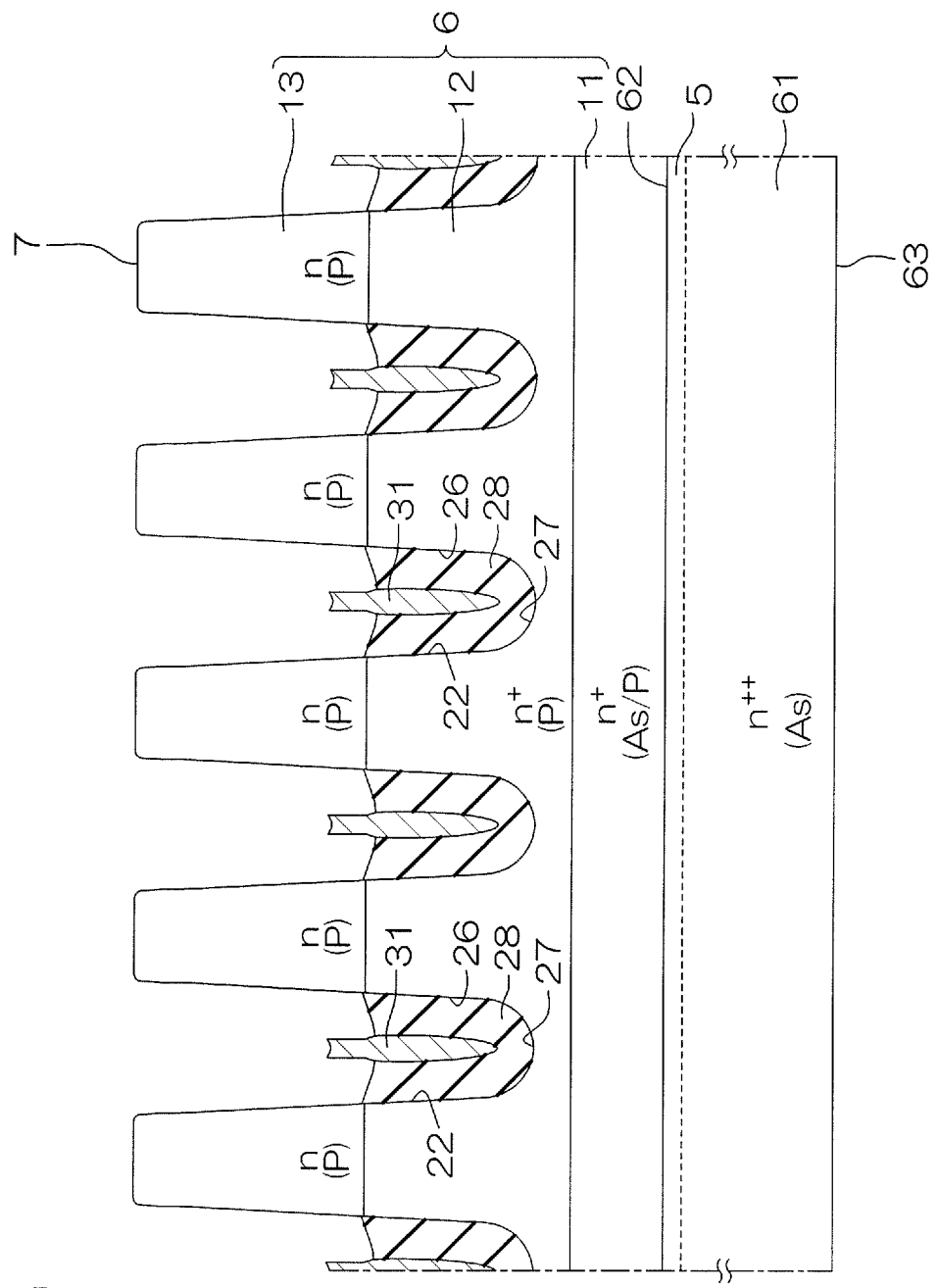
Figure 7H:
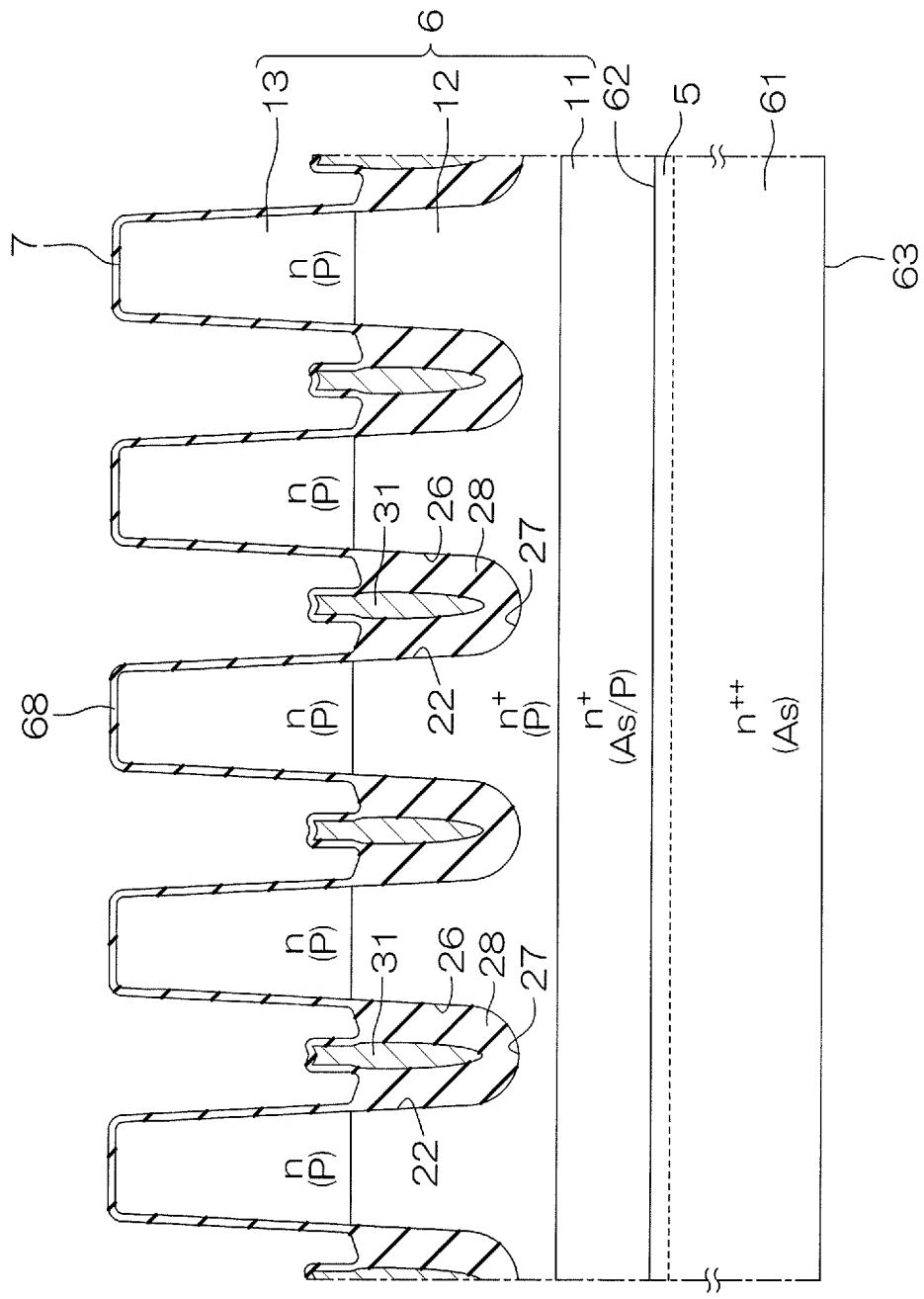
Figure 7J:
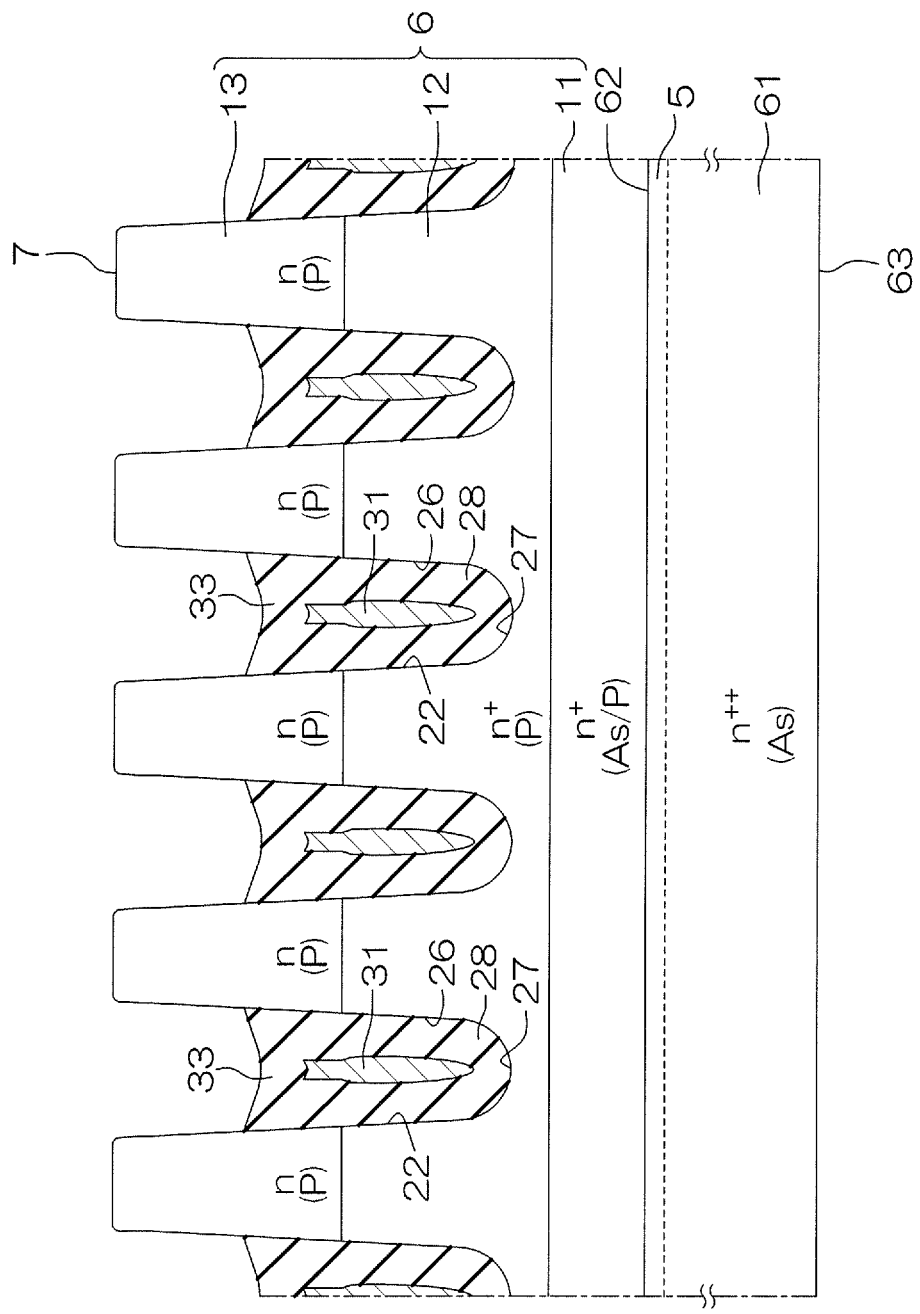
Figure 7K:
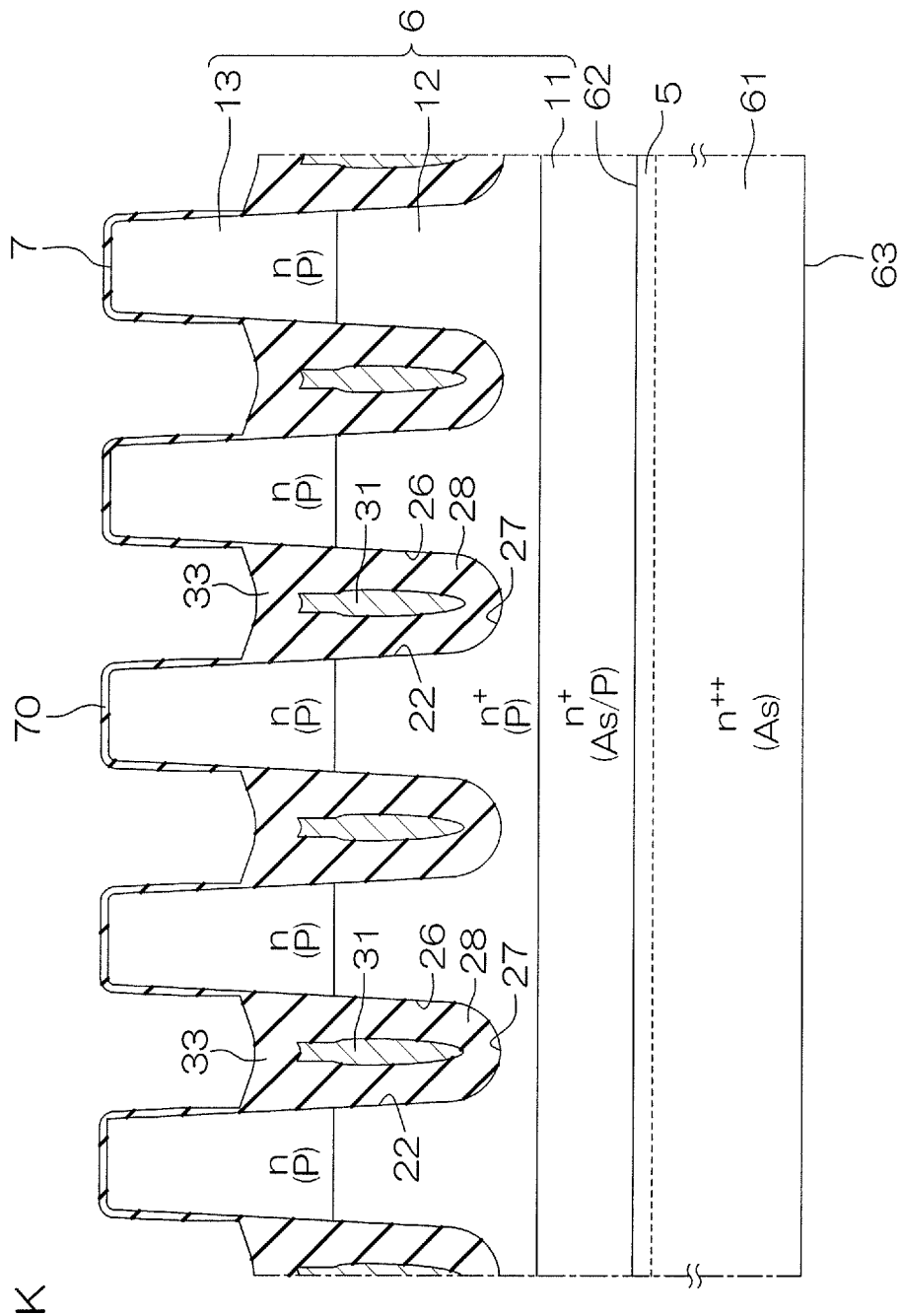
Figure 7L:
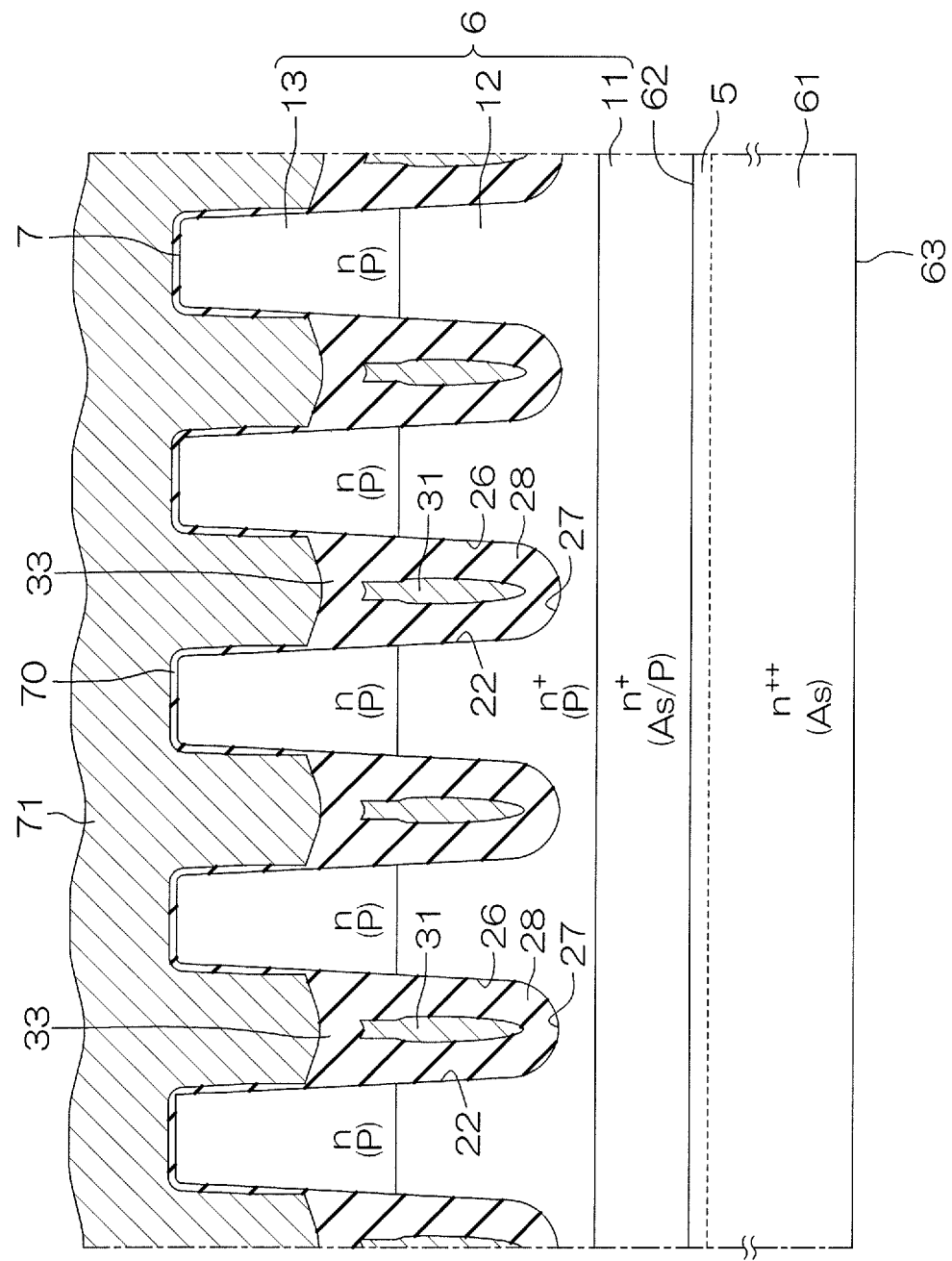
Figure 7M:
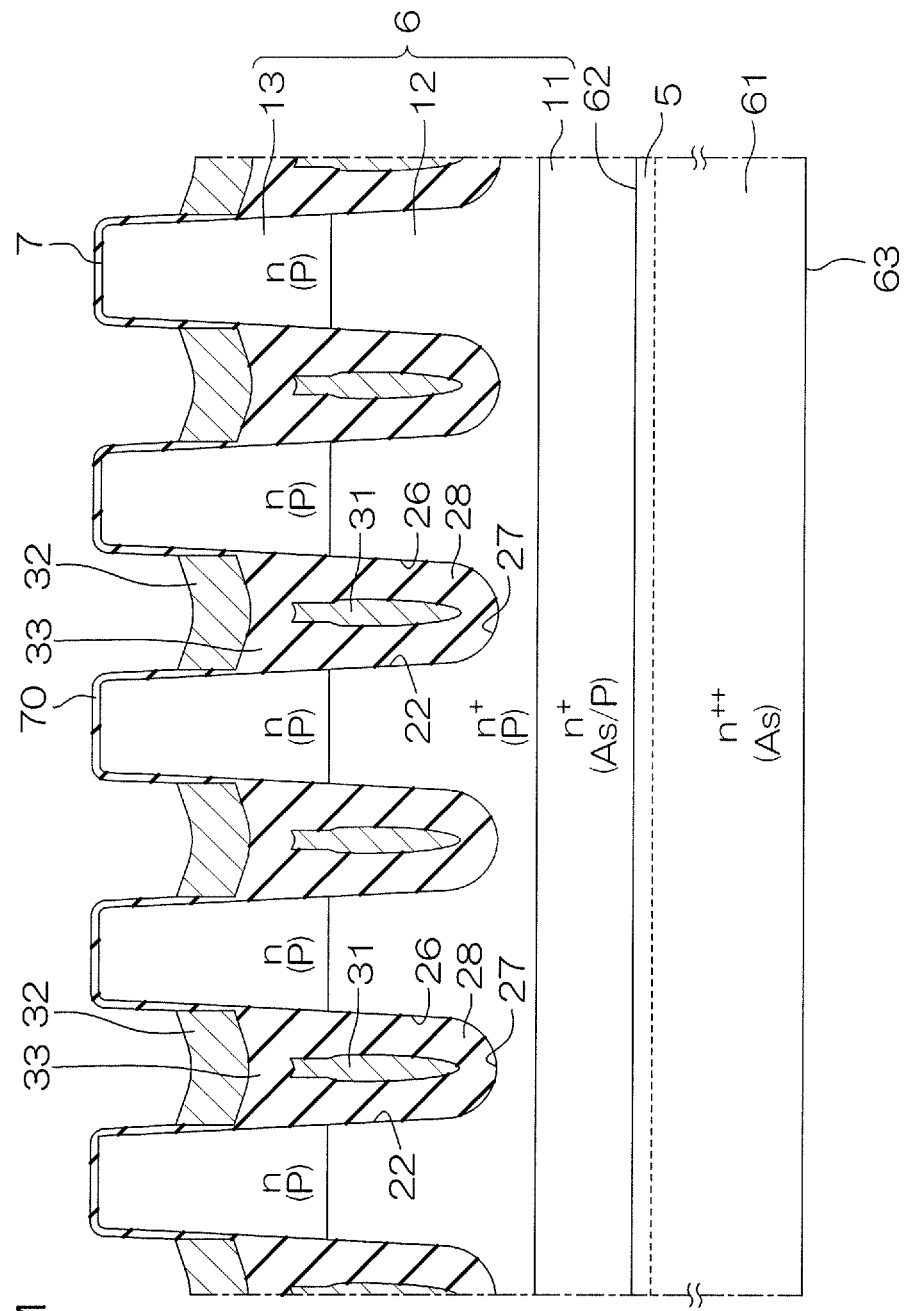
Figure 7N:
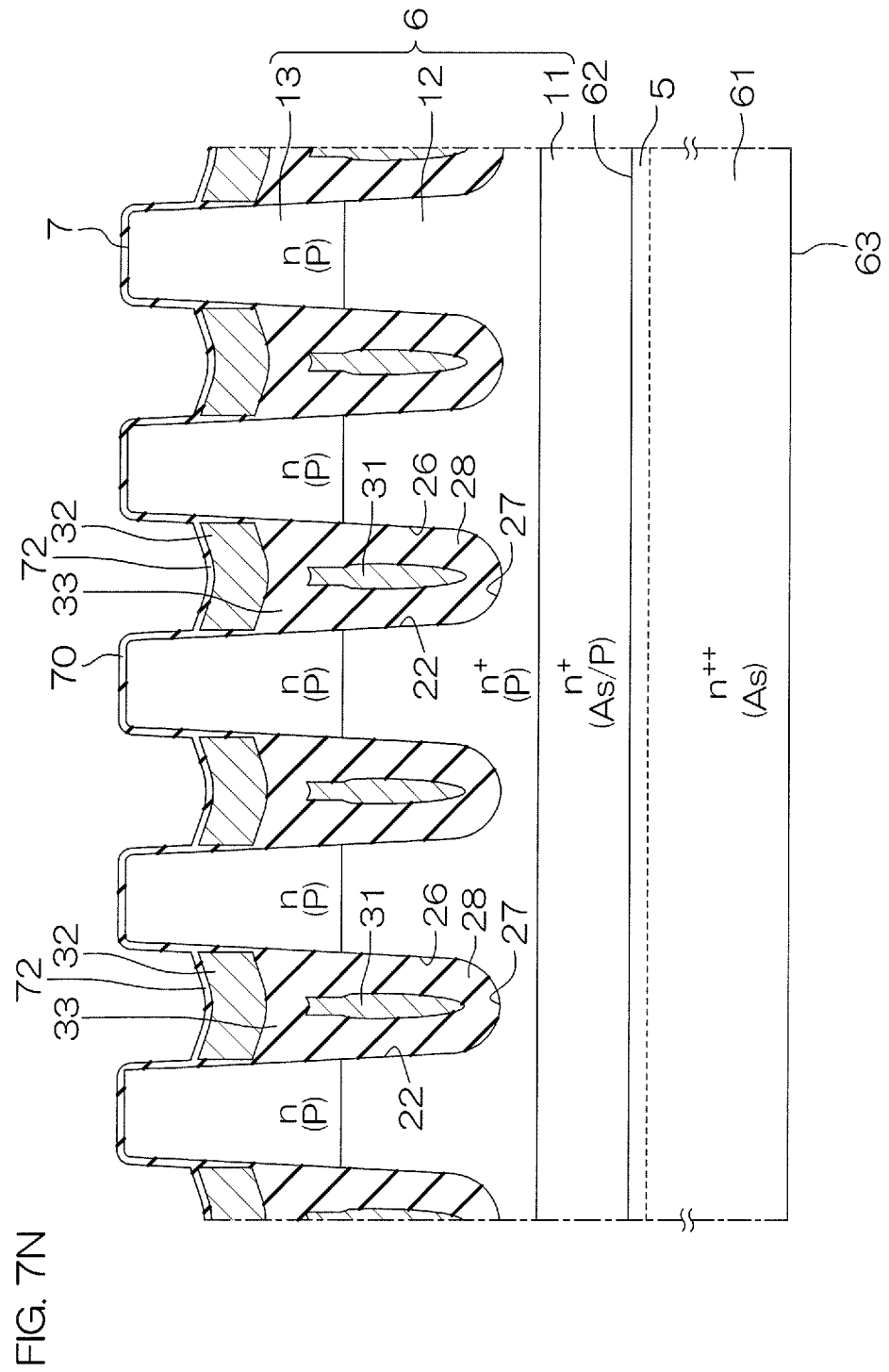
Figure 70:
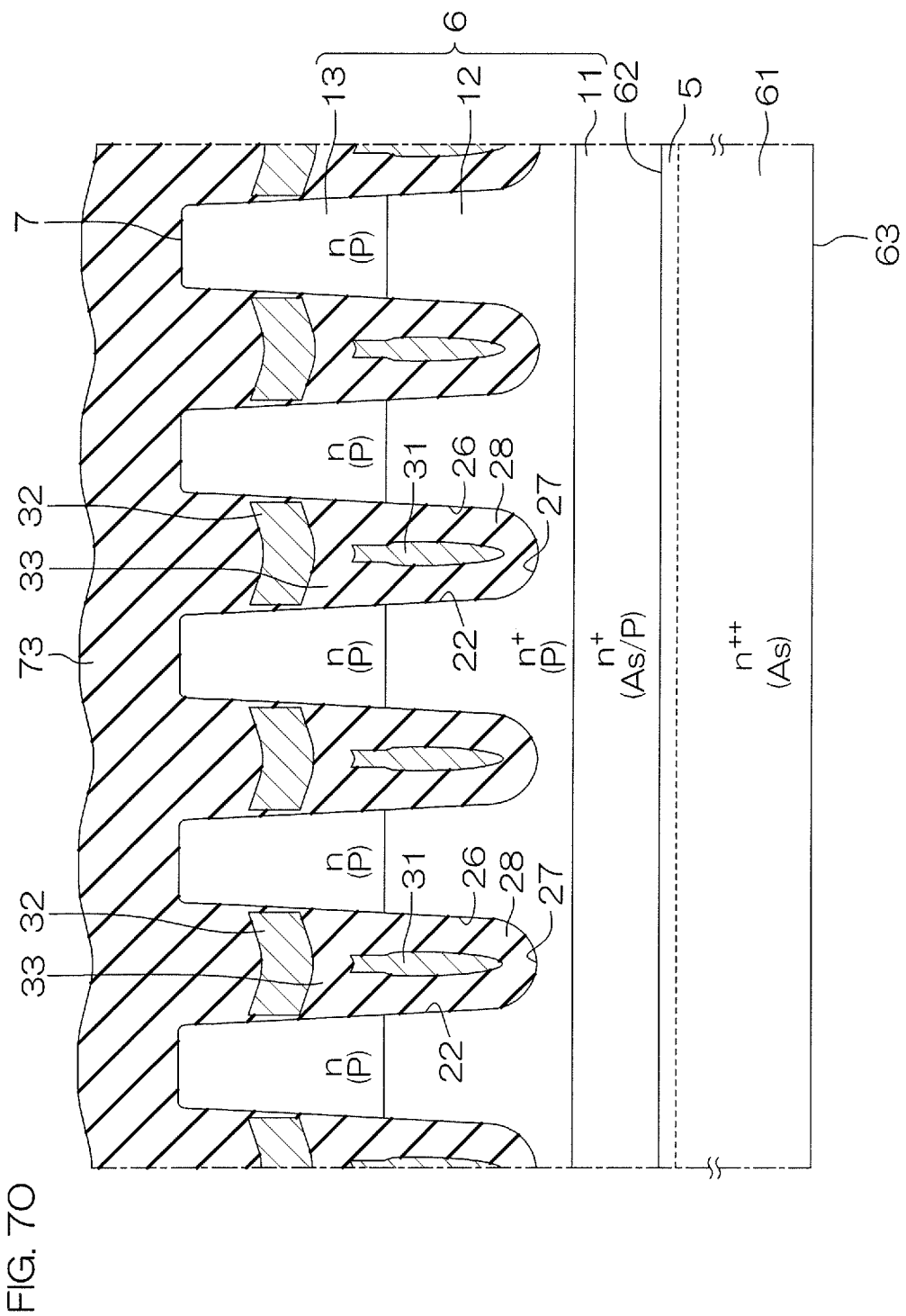
Figure 7P:
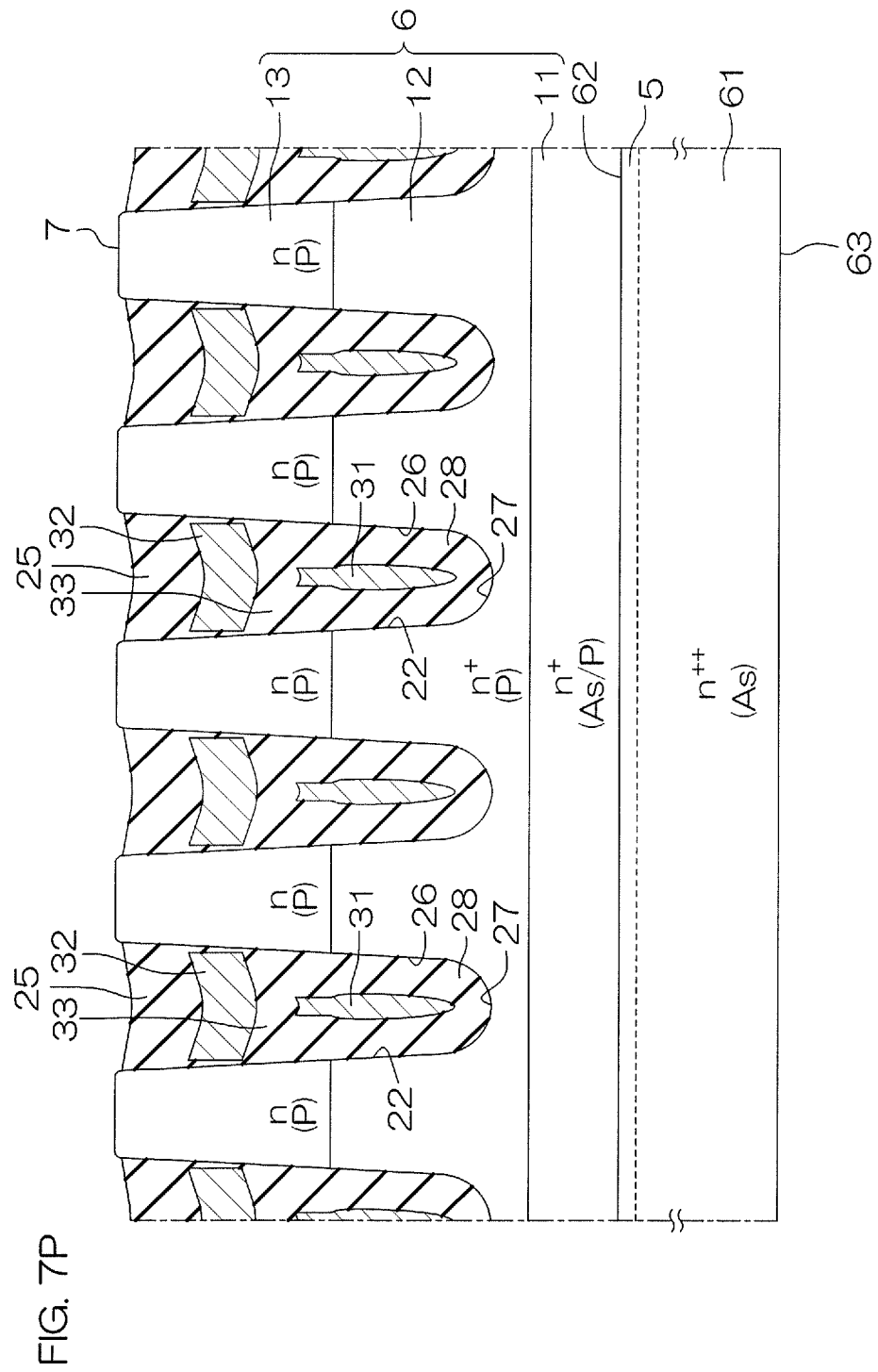
Figure 7Q:
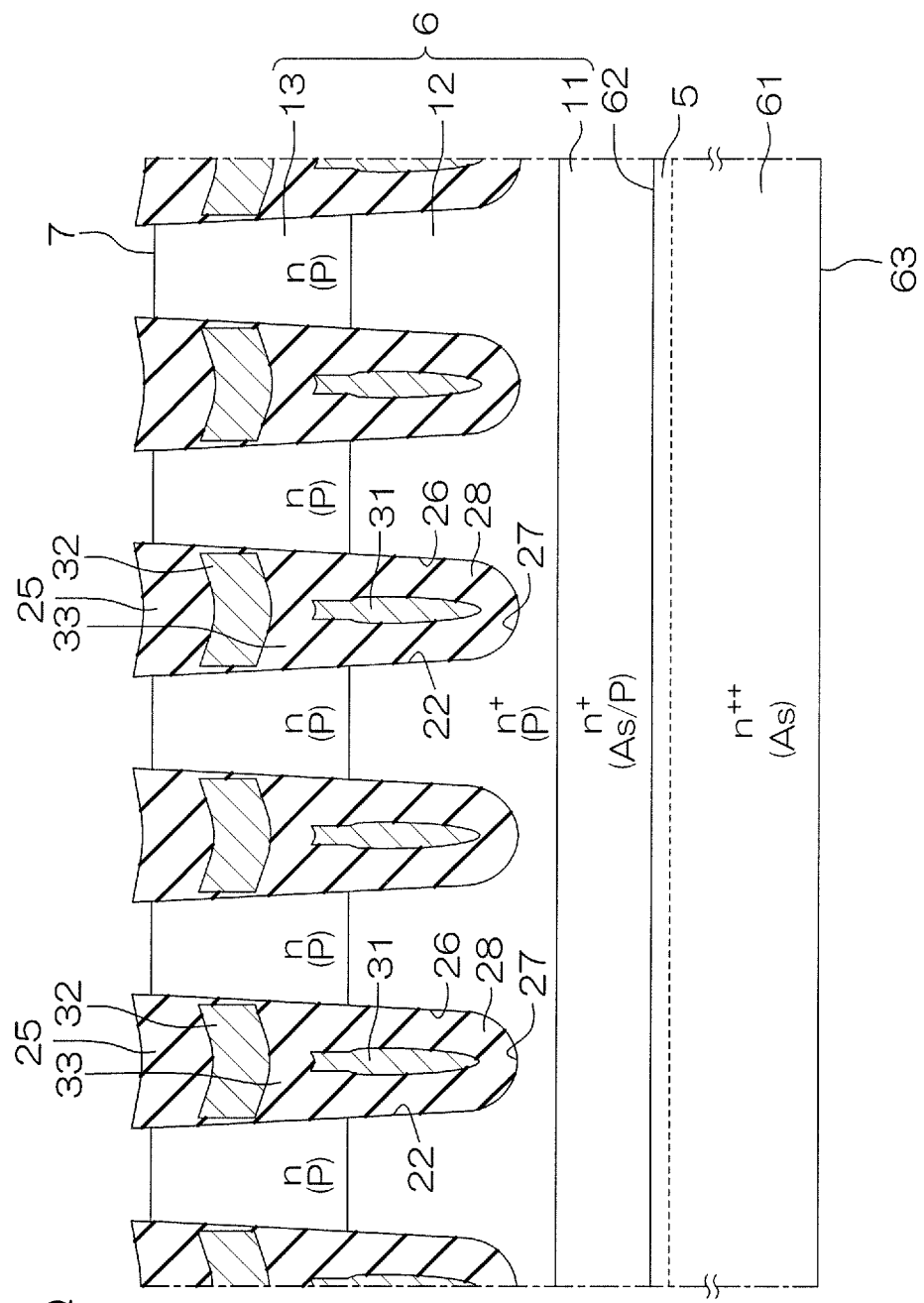
Figure 7R:
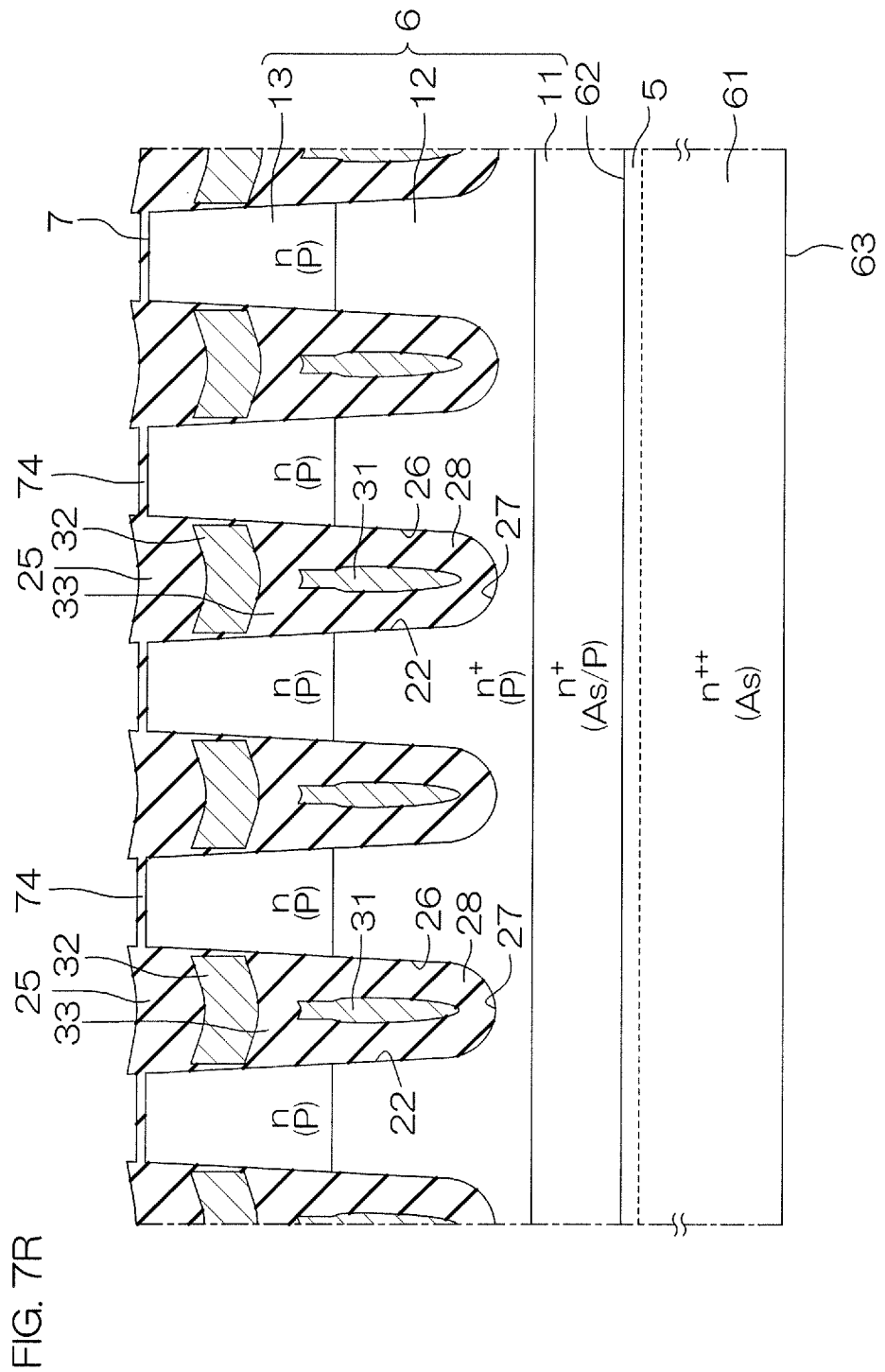
Figure 7S:
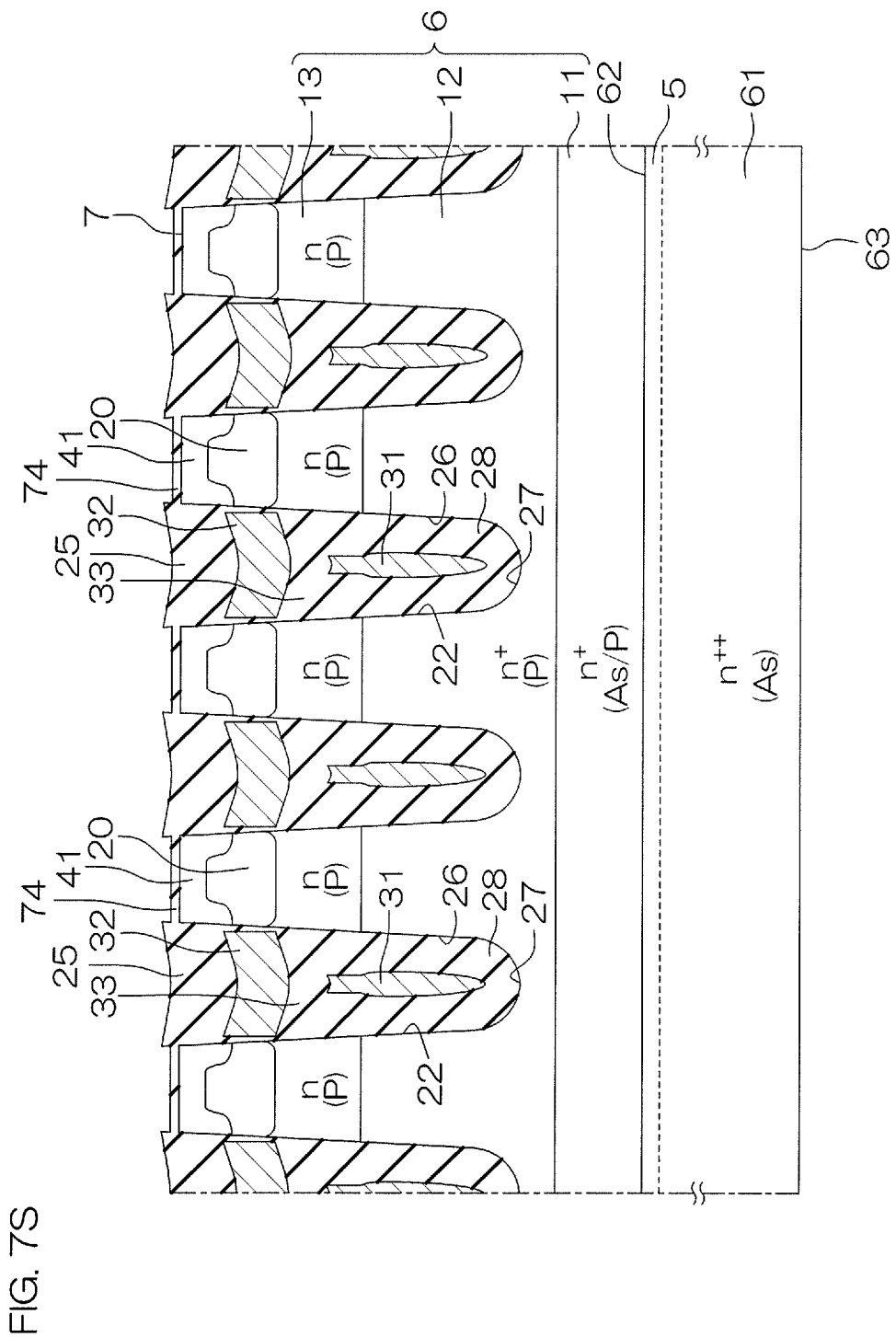
Figure 7T:
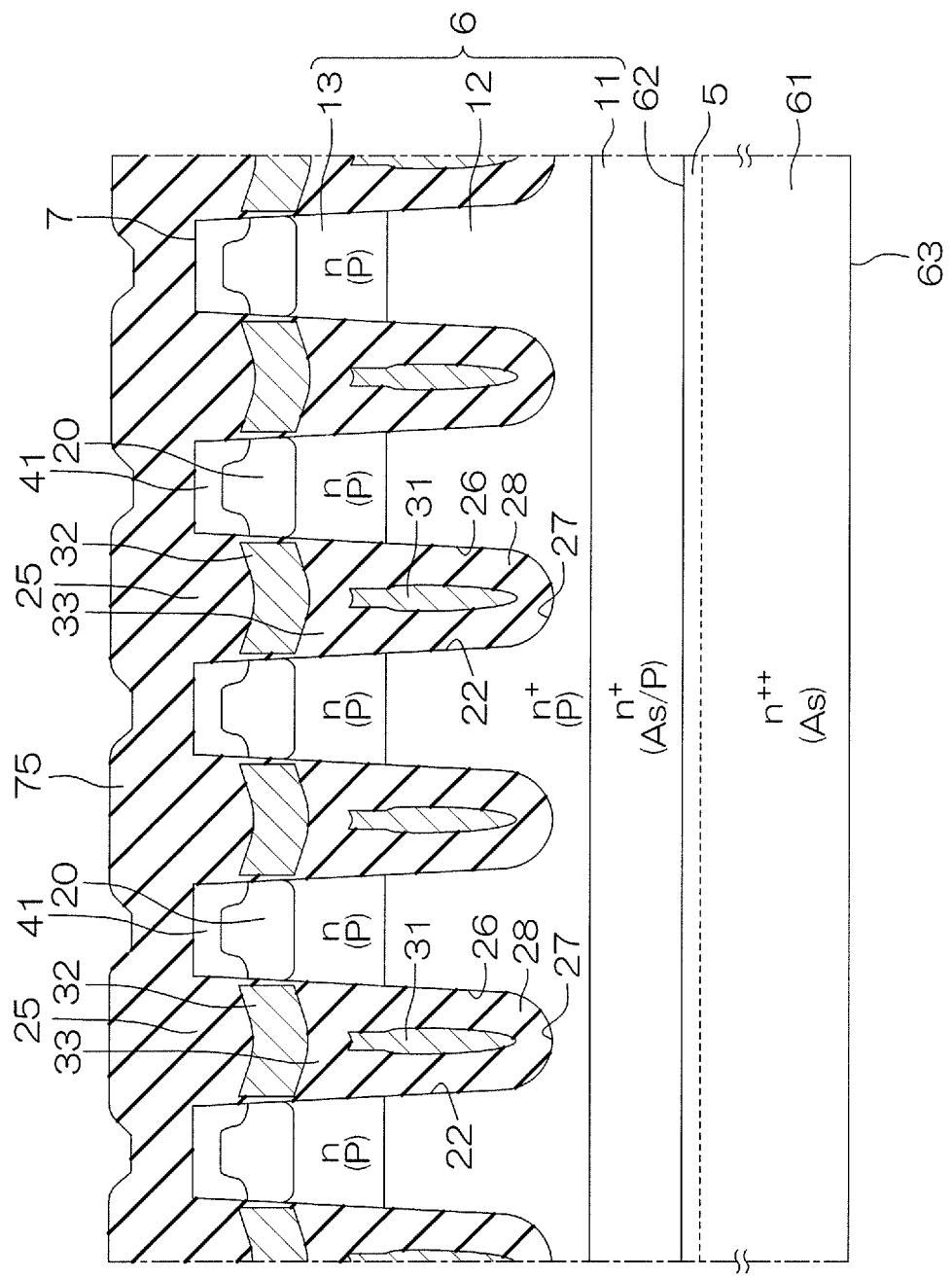
Figure 7U:
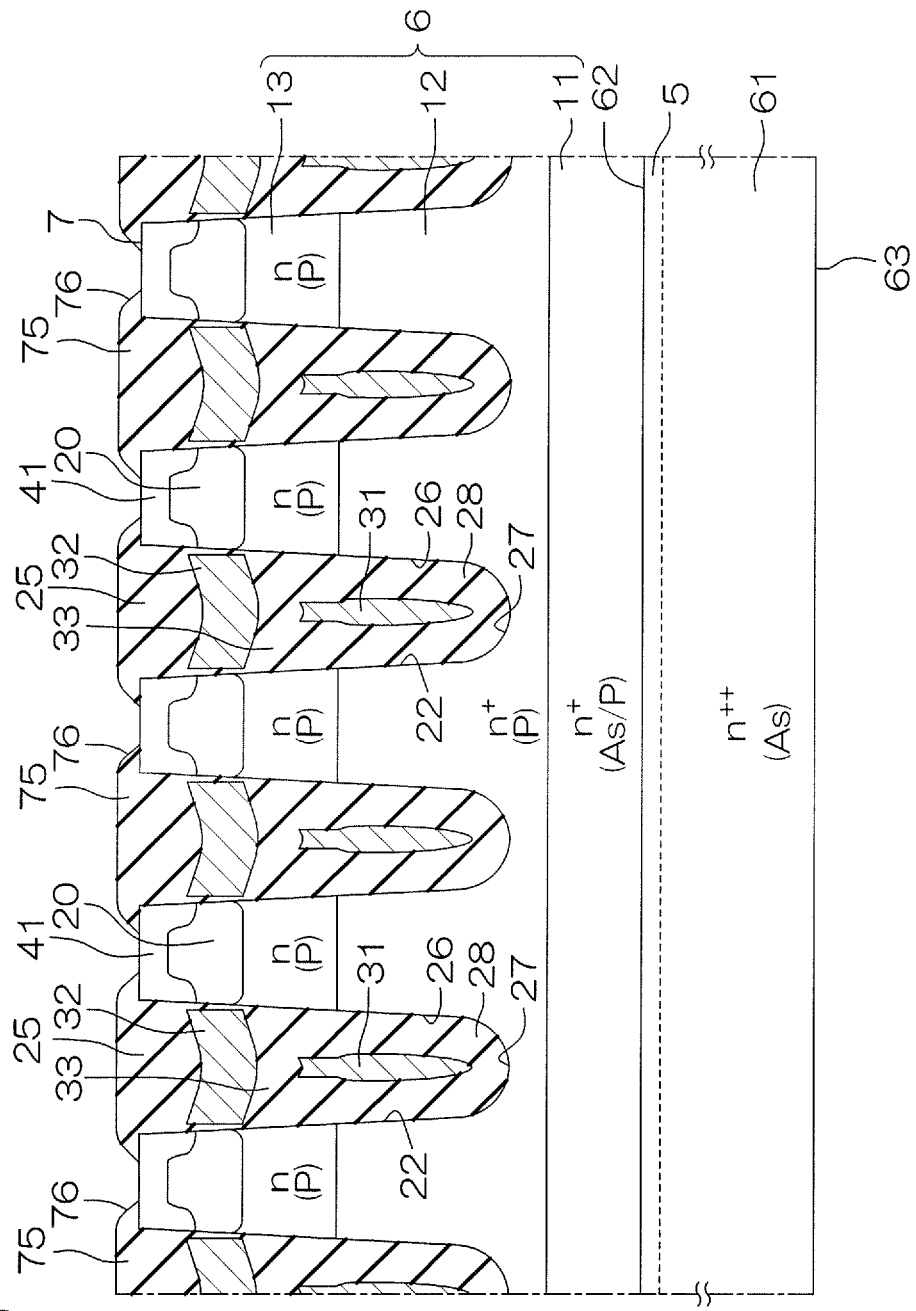
Figure 7V:
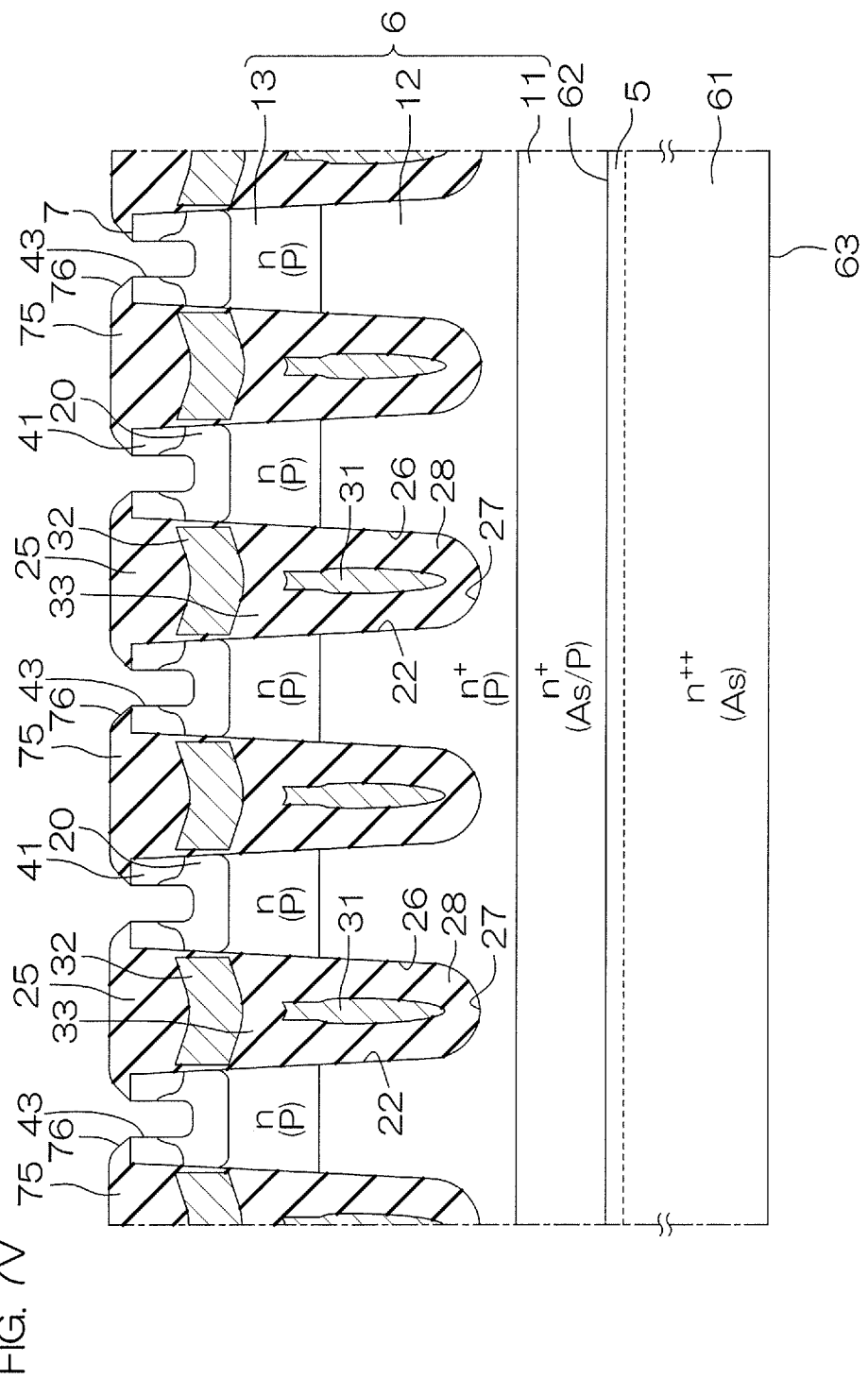
Figure 7W:
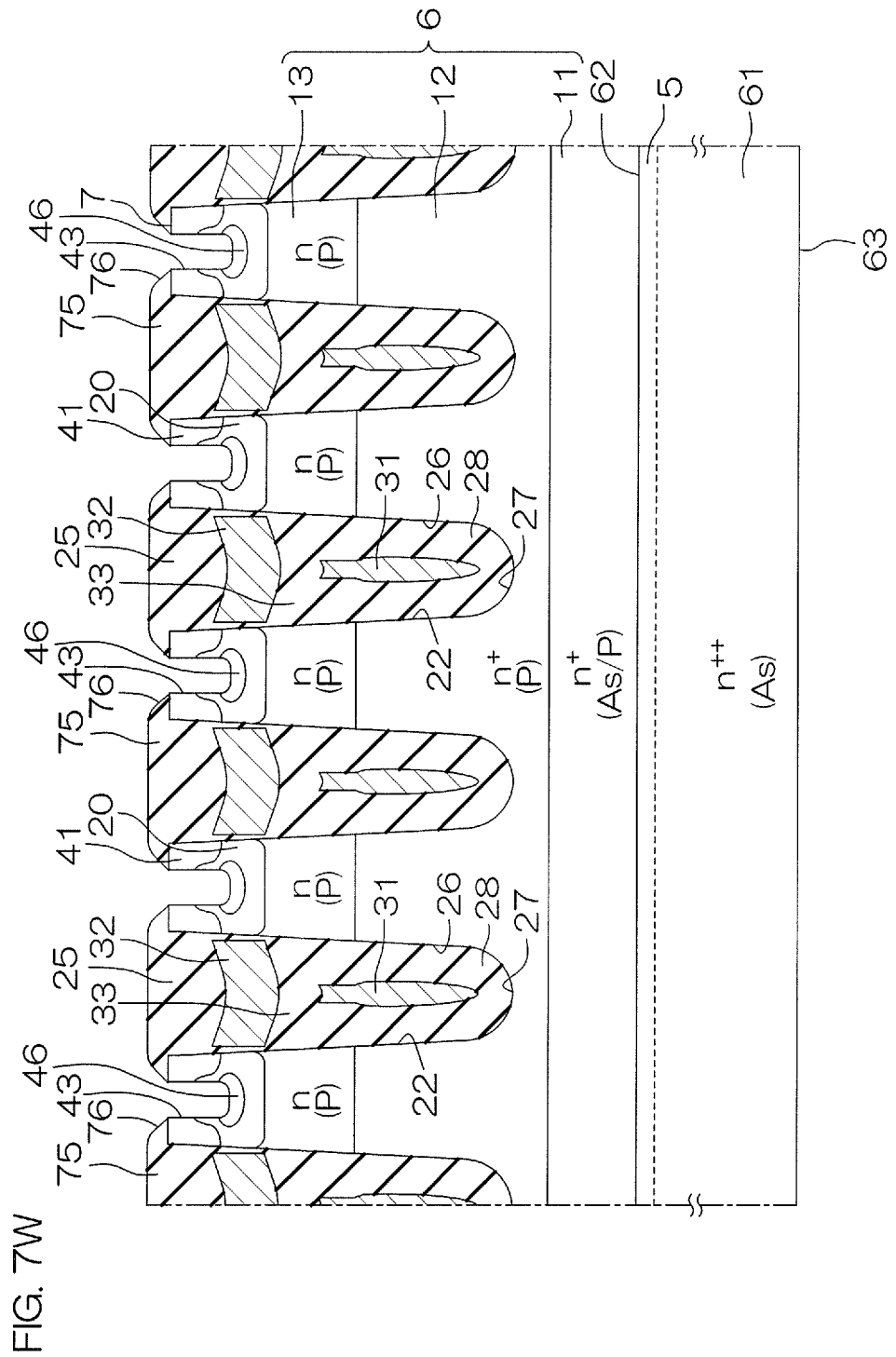
Figure 7X:
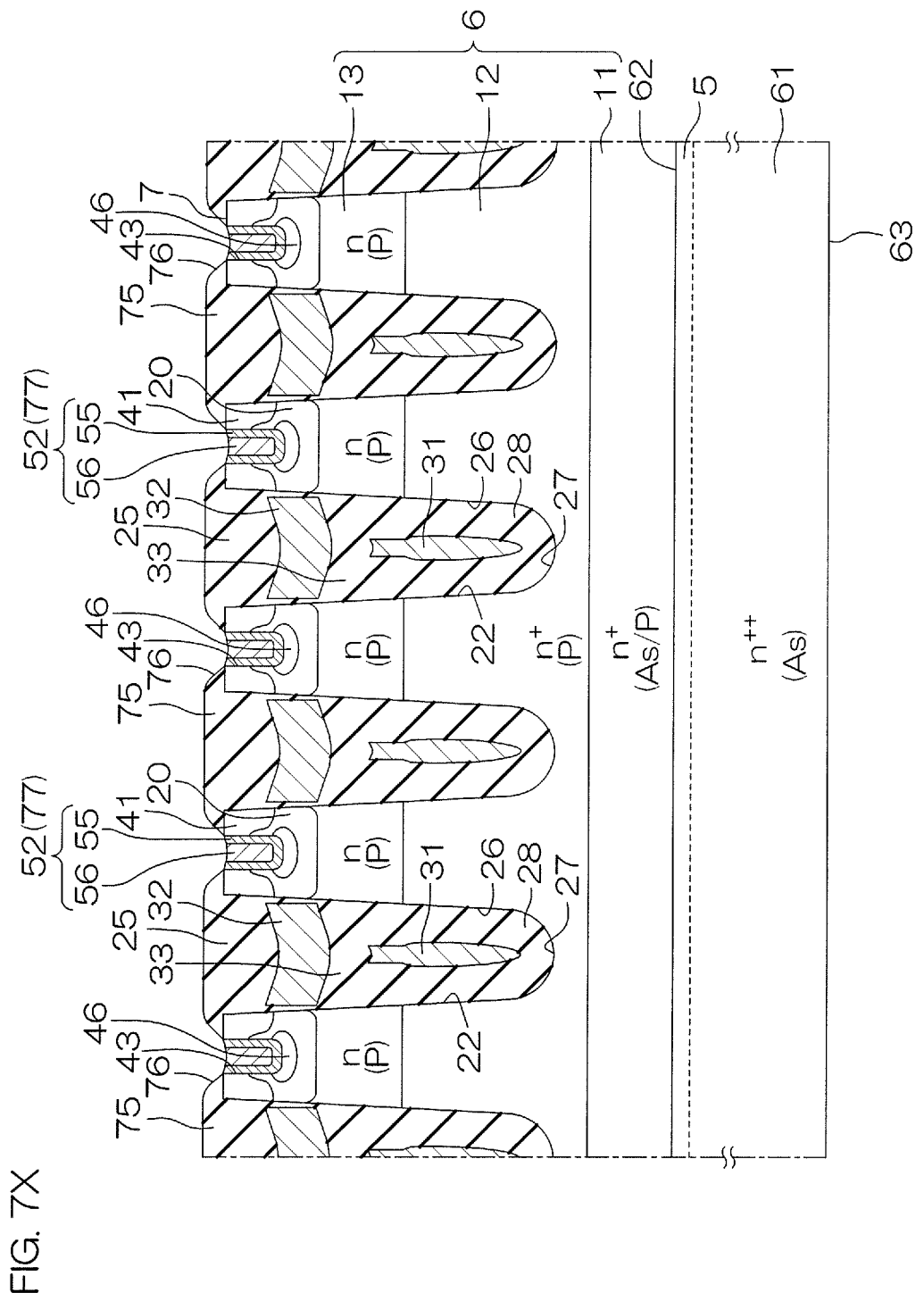
Figure 7Y:
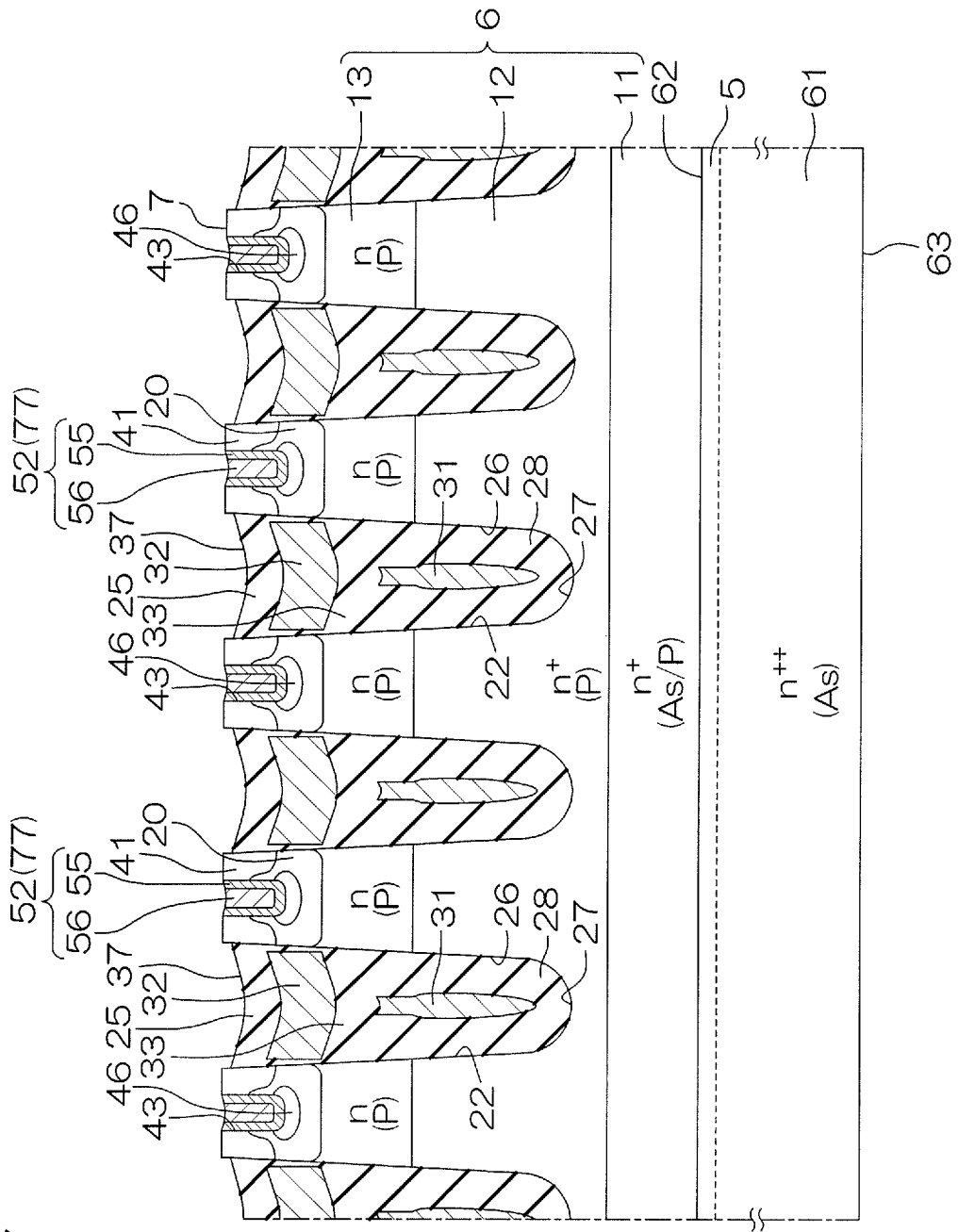
Figure 7Z:
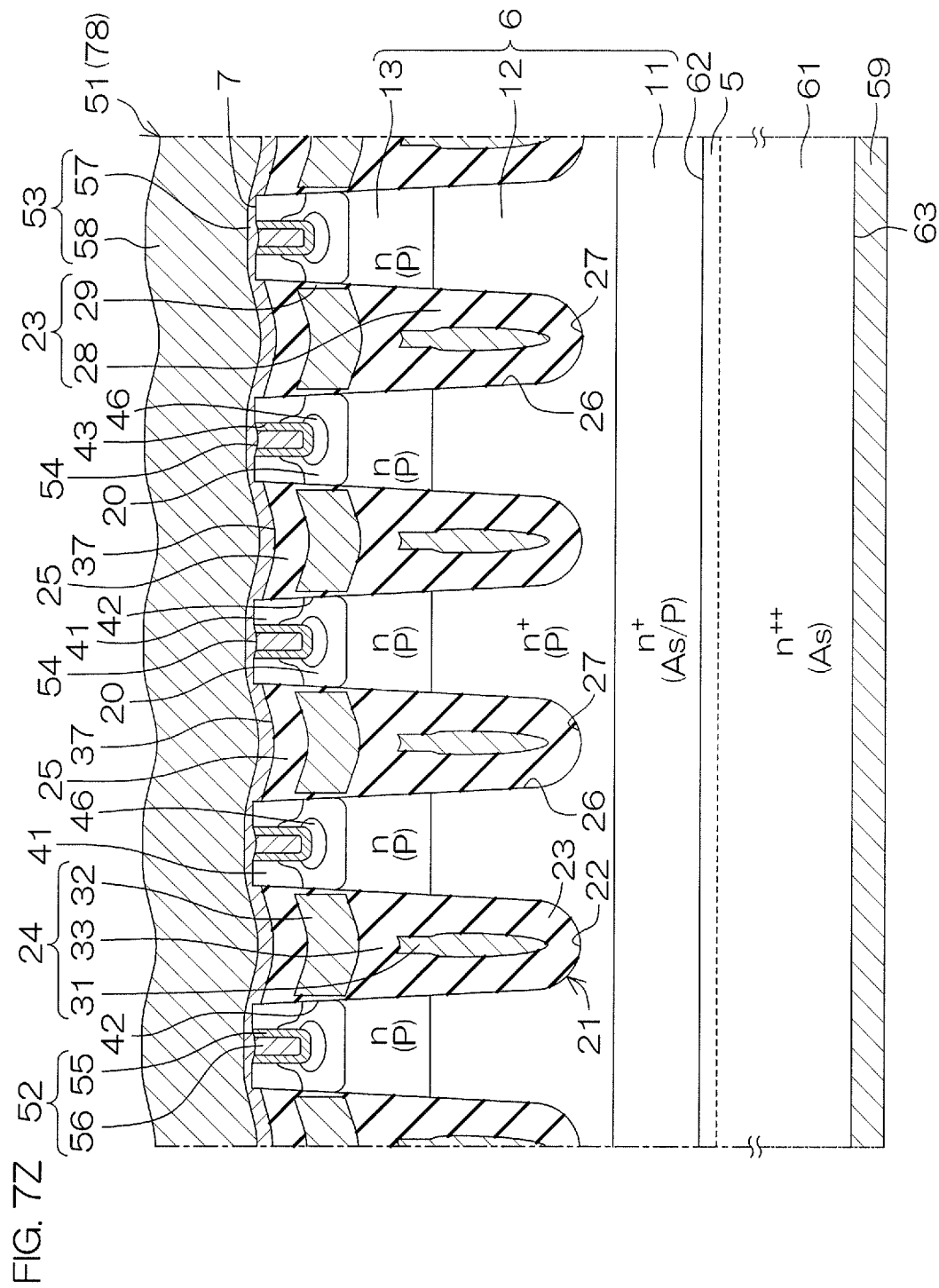

FIG. 7A to FIG. 7Z are each a sectional view of a region corresponding to that of FIG. 2 and a sectional view for describing one example of a method for manufacturing the semiconductor device 1 shown in FIG. 1.

With reference to FIG. 7A, a silicon-made n$^{++}$-type semiconductor wafer 61 served as a base of the semiconductor substrate 2 is prepared. The semiconductor wafer 61 includes a first wafer main surface 62 and a second wafer main surface 63. The first wafer main surface 62 and the second wafer main surface 63 of the semiconductor wafer 61 respectively correspond to the first substrate main surface 3 and the second substrate main surface 4 of the semiconductor substrate 2.

The semiconductor wafer 61 includes a pentavalent element having a diffusion coefficient less than a diffusion coefficient of phosphorus as a main n-type impurity (donor). Arsenic, antimony, bismuth etc., are exemplified as a pentavalent element having a relatively low diffusion coefficient. In this embodiment, the semiconductor wafer 61 includes arsenic as a main n-type impurity.

An n-type impurity concentration of the semiconductor wafer 61 may be from not less than $1\times10^{19}$ cm$^{-3}$ to not more than $1\times10^{21}$ cm$^{-3}$. In this embodiment, the n-type impurity concentration of the semiconductor wafer 61 is from not less than $1\times10^{19}$ cm$^{-3}$ to not more than $1\times10^{20}$ cm$^{-3}$.

Next, the impurity region 5 is formed in a surface layer portion of the first wafer main surface 62. The impurity region 5 is formed by introducing an n-type impurity to the surface layer portion of the first wafer main surface 62. The n-type impurity of the impurity region 5 has a relatively large diffusion coefficient in excess of a diffusion coefficient of the n-type impurity of the semiconductor wafer 61. In this embodiment, the n-type impurity having a relatively large diffusion coefficient is phosphorus. Phosphorus may be introduced by an ion implantation method or a phosphorus deposition method. Thereby, the impurity region 5 which includes arsenic and phosphorus as a main n-type impurity is formed.

A phosphorus concentration of the impurity region 5 is less than an arsenic concentration of the semiconductor wafer 61. The phosphorus concentration of the impurity region 5 may be from not less than $1\times10^{17}$ cm$^{-3}$ to not more than $1\times10^{19}$ cm$^{-3}$. The impurity region 5 may have a thickness of not less than 10 nm to not more than 1000 nm. The thickness of the impurity region 5 may be from not less than 10 nm to not more than 100 nm, from not less than 100 nm to not more than 250 nm, from not less than 250 nm to not more than 500 nm, from not less than 500 nm to not more than 750 nm, or from not less than 750 nm to not more than 1000 nm.

Next, with reference to FIG. 7B, the epitaxial layer 6 is formed on the first wafer main surface 62 by an epitaxial growth method. The epitaxial layer 6 has the epitaxial main surface 7 composed of a crystal growth surface. In this step, an epitaxial growth method is performed in a gas atmosphere which includes phosphorus as an n-type impurity.

Thereby, the n-type impurity is also added at the time of epitaxial growth to impart the base phosphorus concentration to the epitaxial layer 6. The base phosphorus concentration may be from not less than $5\times10^{15}$ cm$^{-3}$ to not more than $1\times10^{17}$ cm$^{-3}$. The base phosphorus concentration is preferably from not less than $1\times10^{16}$ cm$^{-3}$ to not more than $5\times10^{16}$ cm$^{-3}$.

In this step, the n-type impurity (arsenic) of the semiconductor wafer 61 and the n-type impurity (phosphorus) of the impurity region 5 are diffused to the epitaxial layer 6. A diffusion coefficient of arsenic is smaller than a diffusion coefficient of phosphorus. A decreasing rate of arsenic per unit thickness which is diffused from the semiconductor wafer 61 to the epitaxial layer 6 is less than a decreasing rate of phosphorus per unit thickness which is diffused from the impurity region 5 to the epitaxial layer 6.

Thereby, there is formed the high concentration region 11 which includes the n-type impurity (arsenic) diffused from the semiconductor wafer 61, the n-type impurity (phosphorus) diffused from the impurity region 5 and the n-type impurity (phosphorus) added at the time of epitaxial growth. The high concentration region 11 is formed in a mode that the n-type impurity concentration composed of the phosphorus concentration and the arsenic concentration is replaced by the n-type impurity concentration composed of the phosphorus concentration toward the crystal growth direction.

Further, the intermediate concentration region 12 which includes the n-type impurity (phosphorus) diffused from the impurity region 5 and the n-type impurity (phosphorus) added at the time of epitaxial growth is formed on the high concentration region 11. The intermediate concentration region 12 is formed in a mode that the n-type impurity concentration composed of the phosphorus concentration taken over from the high concentration region 11 is replaced by the n-type impurity concentration composed of the base phosphorus concentration toward the crystal growth direction.

Further, the low concentration region 13 which includes the n-type impurity (phosphorus) added at the time of epitaxial growth and keeps a base phosphorus concentration is formed on the intermediate concentration region 12. Further, the high concentration transition region 14 in which the concentration gradient inclines gently is formed in a region between the high concentration region 11 and the intermediate concentration region 12. Still further, the low concentration transition region 15 in which a concentration gradient inclines gently is formed in a region between the intermediate concentration region 12 and the low concentration region 13.

Next, with reference to FIG. 7C, the trenches 22 are formed in the epitaxial main surface 7. In this step, first, an insulating first hard mask 64 having a predetermined pattern is formed on the epitaxial main surface 7. The first hard mask 64 may be an SiO$_2$ layer. The first hard mask 64 has openings 65 which expose regions in which the trenches 22 are to be formed in the epitaxial main surface 7.

The first hard mask 64 may be formed by a CVD (Chemical Vapor Deposition) method or an oxidation treatment method (for example, a thermal oxidation treatment method). The openings 65 of the first hard mask 64 may be formed by an etching method via a resist mask (not shown).

Next, unnecessary portions of the semiconductor wafer 61 are removed by an etching method via the first hard mask 64. An etching method may be a wet etching method and/or a dry etching method. Thereby, the trenches 22 are formed in the epitaxial main surface 7. Specifically, the trenches 22 are formed such as to penetrate through the low concentration region 13 (low concentration transition region 15) and reach the intermediate concentration region 12. Further, the trenches 22 are formed at intervals from the high concentration region 11. Thereafter, the first hard mask 64 is removed.

Next, with reference to FIG. 7D, the first base insulating layer 66 which serves as a base of the bottom-side insulating layer 28 of the insulating layer 23 is formed. The first base insulating layer 66 is formed in a film shape along the epitaxial main surface 7 and the inner walls of the trenches 22. The first base insulating layer 66 may be formed by an oxidation treatment method (for example, a thermal oxidation treatment method) or a CVD method. In this embodiment, the first base insulating layer 66 is formed by a thermal oxidation treatment method.

In this step, corner portions which connect the side walls 26 of the trenches 22 and the epitaxial main surface 7 are rounded by oxidation. Further, corner portions which connect the side walls 26 of the trenches 22 and the bottom wall 27 is rounded by oxidation.

Next, with reference to FIG. 7E, a first base electrode layer 67 which serves as a base of the bottom-side electrode 31 of the embedded electrode 24 is formed on the epitaxial main surface 7. The first base electrode layer 67 fills the trenches 22 and covers the epitaxial main surface 7. The first base electrode layer 67 includes conductive polysilicon. The first base electrode layer 67 may be formed by a CVD method.

Next, with reference to FIG. 7F, unnecessary portions of the first base electrode layer 67 are removed. The unnecessary portions of the first base electrode layer 67 may be removed by an etching method (etch back method). The etching method may be a wet etching method and/or a dry etching method. The first base electrode layer 67 is removed until the etching surface (upper end portion 34) is positioned at a middle portion of the trenches 22 in a depth direction.

Next, with reference to FIG. 7G, unnecessary portions of the first base insulating layer 66 are removed. The unnecessary portions of the first base insulating layer 66 may be removed by an etching method (etch back method) via a resist mask (not shown) having a predetermined pattern. The etching method may be a wet etching method and/or a dry etching method. The first base insulating layer 66 is removed until the upper end portion 34 (a part of the wall portion 36) of the bottom-side electrode 31 is exposed. Thereby, the bottom-side insulating layer 28 of the insulating layer 23 is formed.

Next, with reference to FIG. 7H, a second base insulating layer 68 which serves as a base of a part of the intermediate insulating layer 33 is formed. The second base insulating layer 68 is formed in a film shape along the epitaxial main surface 7, the inner walls of the trenches 22 and the upper end portion 34 (a part of the wall portion 36) of the bottom-side electrode 31. The second base insulating layer 68 may be formed by an oxidation treatment method (for example, a thermal oxidation treatment method) or a CVD method. In this embodiment, the second base insulating layer 68 is formed by a thermal oxidation treatment method.

Next, with reference to FIG. 7I, a third base insulating layer 69 which serves as a base of a part of the intermediate insulating layer 33 is formed. The third base insulating layer 69 fills the trenches 22 and covers the epitaxial main surface 7. The third base insulating layer 69 may be formed by an oxidation treatment method (for example, a thermal oxidation treatment method) or a CVD method. In this embodiment, the third base insulating layer 69 is formed by a CVD method.

Next, with reference to FIG. 7J, unnecessary portions of the second base insulating layer 68 and unnecessary portions of the third base insulating layer 69 are removed. The unnecessary portions of the second base insulating layer 68 and the unnecessary portions of the third base insulating layer 69 may be removed by an etching method (etch back method) via a resist mask (not shown) having a predetermined pattern. The etching method may be a wet etching method and/or a dry etching method. Thereby, the intermediate insulating layers 33 which cover the bottom-side electrodes 31 inside the trenches 22 are formed. The intermediate insulating layers 33 define recessed spaces with the side walls 26 of the trenches 22.

Next, with reference to FIG. 7K, a fourth base insulating layer 70 which serves as a base of the opening-side insulating layer 29 of the insulating layer 23 is formed. The fourth base insulating layer 70 covers the side walls 26 of the trenches 22 and the epitaxial main surface 7. The fourth base insulating layer 70 maybe formed by an oxidation treatment method (for example, a thermal oxidation treatment method) or a CVD method. In this embodiment, the fourth base insulating layer 70 is formed by a thermal oxidation treatment method.

Next, with reference to FIG. 7L, a second base electrode layer 71 which serves as a base of the opening-side electrode 32 of the embedded electrode 24 is formed on the epitaxial main surface 7. The second base electrode layer 71 fills the trenches 22 and covers the epitaxial main surface 7. The second base electrode layer 71 includes conductive polysilicon. The second base electrode layer 71 may be formed by a CVD method.

Next, with reference to FIG. 7M, unnecessary portions of the second base electrode layer 71 are removed. The unnecessary portions of the second base electrode layer 71 may be removed by an etching method (etch back method) via a resist mask (not shown) having a predetermined pattern. The etching method may be a wet etching method and/or a dry etching method. The second base electrode layer 71 is removed until the side walls 26 of the trenches 22 are exposed. Thereby, the opening-side electrodes 32 of the embedded electrodes 24 are formed.

Next, with reference to FIG. 7N, a fifth base insulating layer 72 which serves as a base of a part of the insulator 25 is formed. The fifth base insulating layer 72 is formed in a film shape such as to cover the opening-side electrodes 32. The fifth base insulating layer 72 may be formed by an oxidation treatment method (for example, a thermal oxidation treatment method) or a CVD method. In this embodiment, the fifth base insulating layer 72 is formed by a thermal oxidation treatment method. A step of forming the fifth base insulating layer 72 may be omitted as necessary.

Next, with reference to FIG. 7O, a sixth base insulating layer 73 which serves as a base of a part of the insulator 25 is formed. The sixth base insulating layer 73 fills the trenches 22 and covers the epitaxial main surface 7. The sixth base insulating layer 73 may be formed by an oxidation treatment method (for example, a thermal oxidation treatment method) or a CVD method. In this embodiment, the sixth base insulating layer 73 is formed by a CVD method.

Next, with reference to FIG. 7P, unnecessary portions of the sixth base insulating layer 73 are removed. The sixth base insulating layer 73 is removed until the epitaxial main surface 7 is exposed. The unnecessary portions of the sixth base insulating layer 73 may be removed by an etching method via a resist mask (not shown) having a predetermined pattern. An etching method may be a wet etching method and/or a dry etching method. Thereby, the insulators 25 are formed inside the trenches 22.

Next, with reference to FIG. 7Q, the epitaxial main surface 7 is dug down toward the semiconductor wafer 61 such that the insulators 25 may be partially exposed. Parts of the insulators 25 are parts which cover the side walls 26 of the trenches 22 in the insulators 25. The epitaxial main surface 7 may be dug down by an etching method. An etching method may be a wet etching method and/or a dry etching method.

Next, with reference to FIG. 7R, an insulating second hard mask 74 is formed on portions which are exposed from the insulators 25 in the epitaxial main surface 7. The second hard mask 74 may be an $SiO_2$ layer. The second hard mask 74 is formed in regions at the epitaxial main surface 7 side with respect to exposed surfaces of the insulators 25. The second hard mask 74 may be formed by an oxidation treatment method (for example, a thermal oxidation treatment method) or a CVD method. In this embodiment, the second hard mask 74 is formed by a thermal oxidation treatment method.

Next, with reference to FIG. 7S, the body region 20 is formed in the surface layer portion of the epitaxial main surface 7. The body region 20 is formed in a surface layer portion of the low concentration region 13 at an interval at the epitaxial main surface 7 side from the intermediate concentration region 12. The body region 20 is formed by introducing a p-type impurity to the surface layer portion of the epitaxial main surface 7 by an ion implantation method via an ion implantation mask (not shown). The p-type impurity is introduced to the surface layer portion of the epitaxial main surface 7 by passing through the second hard mask 74. The p-type impurity is introduced to the surface layer portion of the epitaxial main surface 7 from the epitaxial main surface 7 and the side wall 26 of the trenches 22.

Further, the source regions 41 are formed in the surface layer portion of the body region 20. The source regions 41 are formed in the surface layer portion of the body region 20 such as to be exposed from the epitaxial main surface 7. The source regions 41 are formed at intervals at the epitaxial main surface 7 side from the bottom portion of the body region 20. Thereby, the p-type channels 42 are demarcated in regions between the source regions 41 and the low concentration region 13 in the body region 20.

The source regions 41 are formed by introducing an n-type impurity to the surface layer portion of the body region 20 by an ion implantation method via an ion implantation mask (not shown). The n-type impurity is introduced to the surface layer portion of the body region 20 by passing through the second hard mask 74. The n-type impurity is introduced to the surface layer portion of the body region 20 from the epitaxial main surface 7 and the side walls 26 of the trenches 22.

A step of forming the body region 20 and a step of forming the source region 41 may be carried out in any given order. The step of forming the source regions 41 may be carried out after the step of forming the body region 20. The step of forming the body region 20 may be carried out after the step of forming the source regions 41. The insulators 25 may include the same type of the p-type impurity as the p-type impurity of the body region 20. The insulators 25 may include the same type of the n-type impurity as the n-type impurity of the source region 41.

Next, with reference to FIG. 7T, a third hard mask 75 which covers the insulators 25 and the second hard mask 74 is formed on the epitaxial main surface 7. The third hard mask 75 may be an SiO$_2$ layer. The third hard mask 75 may be formed by a CVD method.

Next, with reference to FIG. 7U, unnecessary portions of the third hard mask 75 and the second hard mask 74 are removed. The unnecessary portions of the third hard mask 75 and the second hard mask 74 may be removed by an etching method (etch back method) via a resist mask (not shown) having a predetermined pattern. An etching method may be a wet etching method and/or a dry etching method.

In this step, the unnecessary portions of the third hard mask 75 is removed until the second hard mask 74 disappears. Thereby, a plurality of openings 76 which each expose the source regions 41 are formed in the third hard mask 75.

Next, with reference to FIG. 7V, the plurality of contact holes 43 are formed in the epitaxial main surface 7. The plurality of contact holes 43 are formed by removing unnecessary portions of the epitaxial layer 6 by an etching method via the third hard mask 75. An etching method may be a wet etching method and/or a dry etching method.

Next, with reference to FIG. 7W, the plurality of contact regions 46 are each formed in regions along the plurality of contact holes 43 (contact bottom wall 45) in the body region 20. The contact region 46 is formed by introducing a p-type impurity to the contact bottom wall 45 by an ion implantation method via an ion implantation mask (not shown).

Next, with reference to FIG. 7X, a third base electrode layer 77 which serves as abase of apart of the source electrode 51 (the first electrode layer 52) is formed on the epitaxial main surface 7. The step of forming the third base electrode layer 77 includes a step of forming the first layer 55 and the second layer 56 in this order from the epitaxial main surface 7 side.

The first layer 55 is formed in a film shape along the inner walls of the contact holes 43 and the third hard mask 75. The second layer 56 is formed in a film shape along the first layer 55. The first layer 55 and the second layer 56 may be each formed by a sputtering method and/or a CVD method.

Next, unnecessary portions of the third base electrode layer 77 are removed. The unnecessary portions of the third base electrode layer 77 may be removed by an etching method (etch back method). An etching method may be a wet etching method and/or a dry etching method. The unnecessary portions of the third base electrode layer 77 are removed until the third hard mask 75 is exposed. Thereby, the first electrode layers 52 are formed inside the contact holes 43.

Next, with reference to FIG. 7Y, the third hard mask 75 is removed. The third hard mask 75 may be removed by an etching method. An etching method may be a wet etching method and/or a dry etching method. The third hard mask 75 is removed until the epitaxial main surface 7 is exposed. In this step, the insulators 25 are also partially removed until the side walls 26 of the trenches 22 are exposed.

Next, with reference to FIG. 7Z, a fourth base electrode layer 78 which serves as a base of a part of the source electrode 51 (second electrode layer 53) is formed on the epitaxial main surface 7. The step of forming the fourth base electrode layer 78 includes a step of forming the first layer 57 and the second layer 58 in this order from the epitaxial main surface 7 side.

The first layer 57 is formed in a film shape along the epitaxial main surface 7, the exposed surfaces 37 of the insulators 25 and the first electrode layers 52. The second layer 58 is formed in a film shape along the first layer 57. The first layer 57 and the second layer 58 may be each formed by a sputtering method and/or a CVD method.

Next, unnecessary portions of the fourth base electrode layer 78 are removed. The unnecessary portions of the fourth base electrode layer 78 maybe removed by an etching method via a resist mask (not shown) having a predetermined pattern. An etching method may be a wet etching method and/or a dry etching method. Thereby, the second electrode layer 53 having a predetermined pattern is formed.

Further, the drain electrode 59 is formed on the second wafer main surface 63. The drain electrode 59 may be formed by a sputtering method. The step of forming the drain electrode 59 may be carried out in any given timing after the semiconductor wafer 61 has been prepared. Thereafter, the semiconductor wafer 61 is selectively cut and the semiconductor device 1 is cut out. The semiconductor device 1 is manufactured through the above-described steps.

As described above, according to the method for manufacturing the semiconductor device 1, the semiconductor wafer 61 which includes an n-type impurity (arsenic) having a diffusion coefficient less than a diffusion coefficient of phosphorus is prepared. It is, thereby, possible to suppress an undesired diffusion of the n-type impurity (arsenic) from the semiconductor wafer 61 to the epitaxial layer 6. As a result, it is possible to suppress an undesired increase in concentration of the epitaxial layer 6 due to the n-type impurity (arsenic) of the semiconductor wafer 61 and, therefore, appropriately adjust the n-type impurity concentration of the epitaxial layer 6.

In a step of forming the impurity region 5, the n-type impurity (phosphorus) having a diffusion coefficient in excess of a diffusion coefficient of the n-type impurity (arsenic) of the semiconductor wafer 61 is introduced to the surface layer portion of the first wafer main surface 62. The impurity region 5 is formed as an impurity supply source for supplying the n-type impurity (phosphorus) to the epitaxial layer 6. The impurity region 5 is formed in the surface layer portion of the first wafer main surface 62. Further, the phosphorus concentration of the impurity region 5 is less than the arsenic concentration of the semiconductor wafer 61. Thereby, the n-type impurity (phosphorus) which is diffused to the epitaxial layer 6 can be appropriately controlled.

In a step of forming the epitaxial layer 6, the n-type impurity (arsenic) of the semiconductor wafer 61 and the n-type impurity (phosphorus) of the impurity region 5 are diffused to the epitaxial layer 6, and the n-type impurity is separately added at the same time. Thereby, the high concentration region 11 which includes the n-type impurity (arsenic) diffused from the semiconductor wafer 61, the n-type impurity (phosphorus) diffused from the impurity region 5 and the n-type impurity (phosphorus) added at the time of epitaxial growth is formed on the semiconductor wafer 61 (impurity region 5).

Further, the intermediate concentration region 12 which includes the n-type impurity (phosphorus) diffused from the impurity region 5 and the n-type impurity (phosphorus) added at the time of epitaxial growth is formed on the high concentration region 11. Still further, the low concentration region 13 which includes the n-type impurity (phosphorus)

added at the time of epitaxial growth is formed on the intermediate concentration region 12.

As a result, it is possible to appropriately form, on the semiconductor wafer 61, the n-type epitaxial layer 6 having the n-type impurity concentration gradient in which the n-type impurity concentration is decreased in a downward step-wise manner from the semiconductor wafer 61 toward the crystal growth direction.

The high concentration region 11 is a buffer region which incorporates the n-type impurity (arsenic) diffused from the semiconductor wafer 61. The intermediate concentration region 12 is a region which partially raises the n-type impurity concentration of the epitaxial layer 6 to reduce a resistance. The low concentration region 13 is a region which keeps the base phosphorus concentration and suppresses an increase in concentration of the epitaxial layer 6 in its entirety.

In the method for manufacturing the semiconductor device 1, the trench structure 21 is formed in the epitaxial layer 6. In a region where the trench structure 21 is formed in the epitaxial layer 6, electric field concentration is likely to occur due to a structure in which a current path is restricted. In other words, electric field concentration is likely to occur in a region of the epitaxial layer 6 where the channel 42 is formed, an easily occurs. Further, when a region where the trench structure 21 is formed in the epitaxial layer 6 is increased in concentration, a depletion layer from the trench structure 21 spreads insufficiently, thus resulting in a reduction in breakdown voltage BVDSS.

Thus, in the method for manufacturing the semiconductor device 1, the low concentration region 13 is formed in a region where the trench structure 21 is formed in the epitaxial layer 6. Thereby, a depletion layer can be appropriately formed in the low concentration region 13. Therefore, it is possible to manufacture and provide the semiconductor device 1 capable of reducing a resistance of the epitaxial layer 6, while suppressing a reduction in breakdown voltage BVDSS.

Further, according to the method for manufacturing the semiconductor device 1, there is formed the trench structure 21 which penetrates through the low concentration region 13 and reaches the intermediate concentration region 12. According to the above-described structure, an electric field which gives a load to the trench structure 21 can be dissipated to the low concentration region 13 and the intermediate concentration region 12. It is, thereby, possible to suppress a local electric field concentration in the low concentration region 13 and the intermediate concentration region 12. As a result, it is possible to appropriately suppress a reduction in breakdown voltage BVDSS. The structure is in particular effective in a case where the plurality of trench structures 21 are formed.

Further, according the method for manufacturing the semiconductor device 1, the trench structure 21 is formed at an interval from the high concentration region 11. Thereby, a depletion layer can be appropriately spread from the trench structure 21. Therefore, it is possible to appropriately suppress a reduction in breakdown voltage BVDSS.

Figure 8:
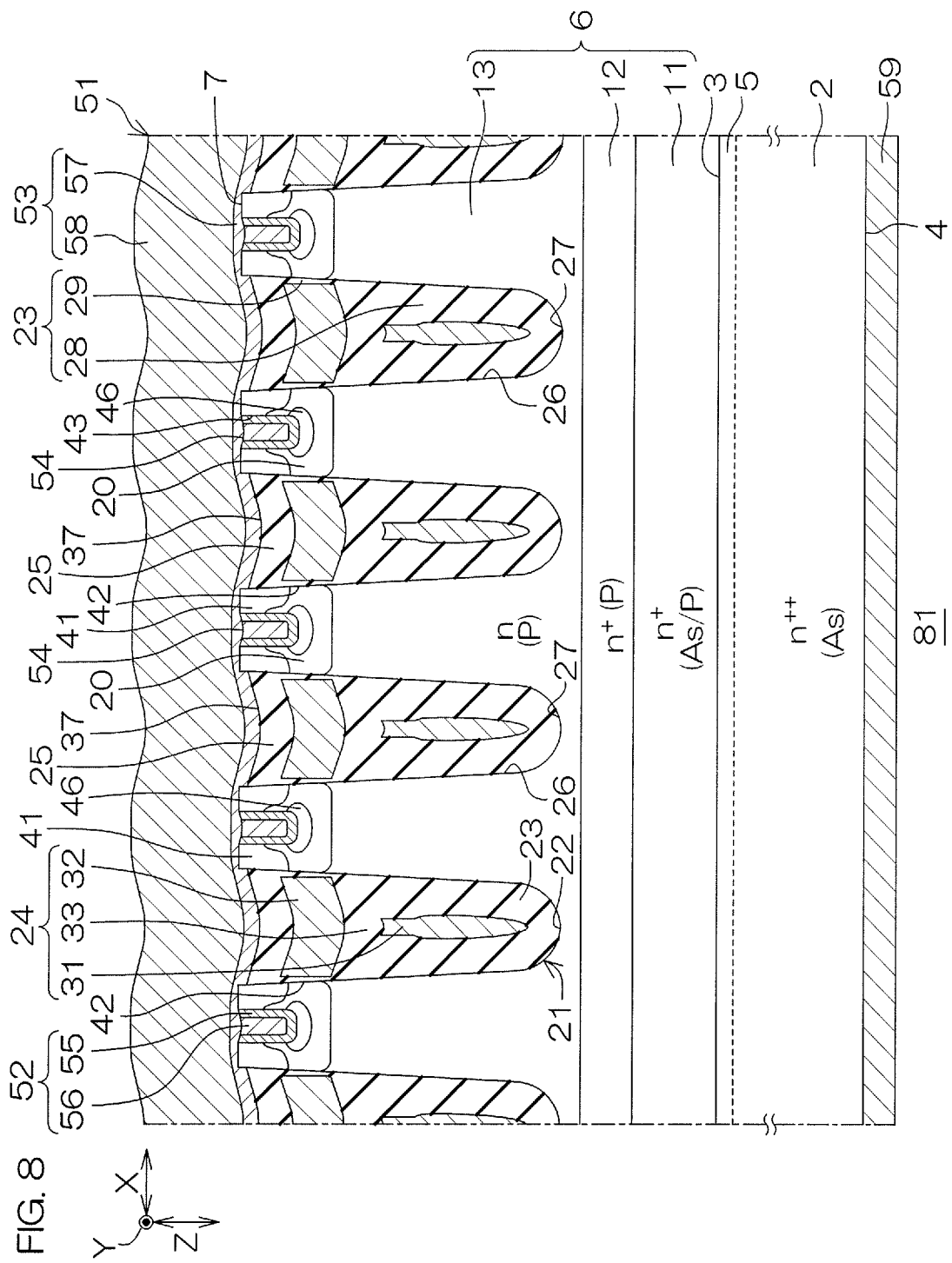
FIG. 8 is a sectional view of a region corresponding to that of FIG. 2 and a sectional view which shows a partial region of a semiconductor device according to a second preferred embodiment of the present invention in an enlarged manner.

FIG. 8 is a sectional view of a region corresponding to that of FIG. 2 and a sectional view which shows a partial region of a semiconductor device 81 according to the second preferred embodiment of the present invention in an enlarged manner. Hereinafter, structures corresponding to those described in the semiconductor device 1 will be given the same symbols, with a description thereof omitted.

In the semiconductor device 1, the trench 22 is formed such as to penetrate through the low concentration region 13 and reach the intermediate concentration region 12. In contrast thereto, in the semiconductor device 81, a trench 22 is formed in the low concentration region 13 at an interval at an epitaxial main surface 7 side from the intermediate concentration region 12. The above-described structure is formed by adjusting a thickness TH of a high concentration region 11, a thickness TM of the intermediate concentration region 12, a thickness TL of the low concentration region 13, a trench depth D of the trench 22, etc.

As described above, the semiconductor device 81 is also able to provide the effects similar to those described in the semiconductor device 1.

Figure 9:
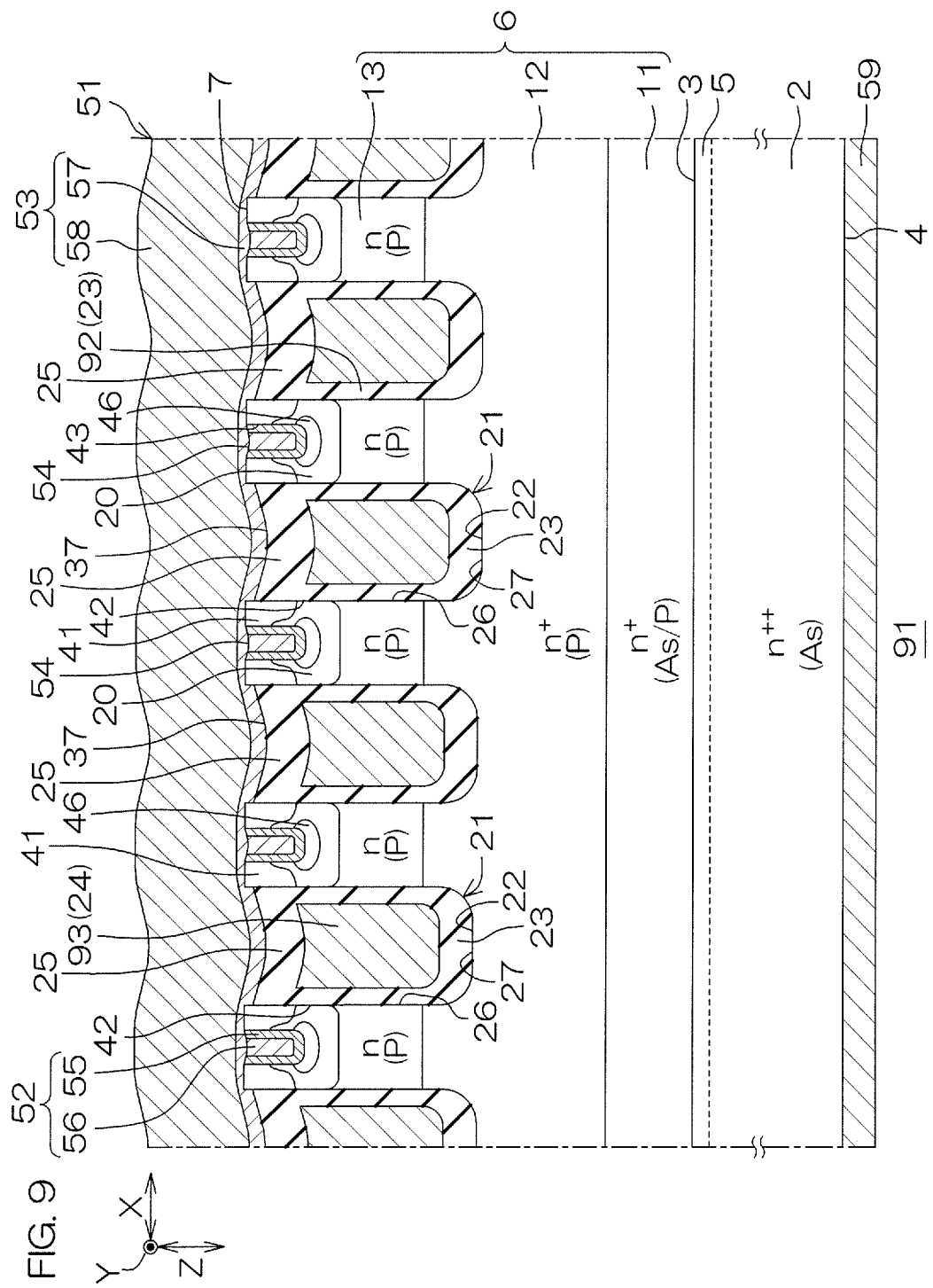
FIG. 9 is a sectional view of a region corresponding to that of FIG. 2 and a sectional view which shows a partial region of a semiconductor device according to a third preferred embodiment of the present invention in an enlarged manner.

FIG. 9 is a sectional view of a region corresponding to that of FIG. 2 and a sectional view which shows a partial region of a semiconductor device 91 according to the third preferred embodiment of the present invention in an enlarged manner. Hereinafter, structures corresponding to those described in the semiconductor device 1 will be given the same symbols, with a description thereof omitted.

In the semiconductor device 1, the insulating layer includes the bottom-side insulating layer 28 and the opening-side insulating layer 29, and the embedded electrode 24 includes the bottom-side electrode 31, the opening-side electrode 32 and the intermediate insulating layer 33. In contrast thereto, in the semiconductor device 91, the insulating layer 23 does not include the bottom-side insulating layer 28, and the embedded electrode 24 does not include the bottom-side electrode 31 and the intermediate insulating layer 33. In the semiconductor device 91, the insulating layer 23 includes a gate insulating layer 92 corresponding to the opening-side insulating layer 29, and the embedded electrode includes a gate electrode 93 corresponding to the opening-side electrode 32.

The gate insulating layer 92 is formed in a film shape along the inner wall of the trench 22. The gate insulating layer 92 defines a recessed space inside the trench 22. The gate insulating layer 92 may have a constant thickness. In the gate insulating layer 92, a thickness of a part which covers the bottom wall 27 may be in excess of a thickness of a part which covers the side wall 26 in the gate insulating layer 92. The gate insulating layer 92 may have a constant thickness.

The gate electrode 93 is embedded into the trench 22 as an integrated member across the gate insulating layer 92. Specifically, the gate electrode 93 is embedded into the recessed space defined by the gate insulating layer 92 in the trench 22. A gate voltage is applied to the gate electrode 93. The gate electrode 93 faces the intermediate concentration region 12 and the low concentration region 13 across the gate insulating layer 92.

The gate electrode 93 may include at least any one of conductive polysilicon, tungsten, aluminum, copper, an aluminum alloy and a copper alloy. In this embodiment, the gate electrode 93 includes conductive polysilicon. The gate electrode 93 may include n-type polysilicon or p-type polysilicon.

As described above, the semiconductor device 91 is also able to provide the effects similar to those described in the semiconductor device 1. The above-described structure is also applicable to the previously described semiconductor device 81.

While preferred embodiments of the present invention have been described above, the present invention may be implemented in yet other embodiments.

In each of the previously described preferred embodiments, a description has been given of an example in which the impurity region 5 is used to provide an n-type impurity concentration gradient in a step-wise manner in the epitaxial layer 6. However, as long as the n-type impurity concentration gradient can be provided in a step-wise manner, the impurity region 5 may not be necessarily used. For example, the base phosphorus concentration which is imparted in a step of forming the epitaxial layer 6 may be adjusted to form the n-type impurity concentration gradient in a step-wise manner in the epitaxial layer 6.

Further, as long as the n-type impurity concentration gradient can be provided in a step-wise manner, the n-type impurity concentration gradient of the epitaxial layer 6 may be adjusted by arsenic in place of phosphorus. That is, there may be formed the epitaxial layer 6 which includes arsenic as a main n-type impurity.

In each of the previously described preferred embodiments, a description has been given of an example in which the semiconductor substrate 2 is composed of Si (silicon). However, in each of the previously described preferred embodiments, there may be adopted the semiconductor substrate 2 which is composed of a wide band gap semiconductor. For example, in each of the previously described preferred embodiments, as an example of the wide band gap semiconductor, there may be adopted the semiconductor substrate 2 which is composed of a group III-V semiconductor, SiC (silicon carbide) or diamond. GaN, GaAs, AlN, InN, etc., are given as an example of the group III-V semiconductor.

This specification shall not restrict any combined manner of the features shown in the first to the third preferred embodiments. The first to the third preferred embodiments may be combined in any given form and in any given manner. That is, there may be adopted a semiconductor device which has a manner in which the features shown in the first to the third preferred embodiments are combined in any given form and in any given manner.

Hereinafter, there are shown examples of features extracted from this specification and drawings.

[A1] A method for manufacturing a semiconductor device comprising, a step of preparing an n-type semiconductor wafer which includes an n-type impurity having a diffusion coefficient less than a diffusion coefficient of phosphorus and which has a main surface, a step of forming an impurity region in a surface layer portion of the main surface of the semiconductor wafer by introducing an n-type impurity having a diffusion coefficient in excess of a diffusion coefficient of the n-type impurity of the semiconductor wafer to the surface layer portion of the main surface of the semiconductor wafer, and a step of forming an epitaxial layer on the main surface of the semiconductor wafer by an epitaxial growing method and also adding an n-type impurity to the epitaxial layer.

The method for manufacturing the semiconductor device is to appropriately form, on the semiconductor wafer, the n-type epitaxial layer which has a concentration gradient in which the n-type impurity concentration is decreased in a downward step-wise manner from the semiconductor wafer toward a crystal growth direction.

According to the method for manufacturing the semiconductor device, there is prepared the semiconductor wafer which includes the n-type impurity having the diffusion coefficient less than the diffusion coefficient of phosphorus. It is, thereby, possible to suppress an undesired diffusion of the n-type impurity from the semiconductor wafer to the epitaxial layer. As a result, it is possible to suppress an undesired increase in concentration of the epitaxial layer due to the n-type impurity of the semiconductor wafer and, therefore, appropriately adjust the n-type impurity concentration of the epitaxial layer.

In the step of forming the impurity region, the n-type impurity having the diffusion coefficient in excess of the diffusion coefficient of the n-type impurity of the semiconductor wafer is introduced to the surface layer portion of the main surface of the semiconductor wafer. The impurity region is formed as an impurity supply source which supplies the n-type impurity to the epitaxial layer. The impurity region is formed in the surface layer portion of the main surface of the semiconductor wafer, thus making it possible to appropriately control the n-type impurity diffused to the epitaxial layer.

In the step of forming the epitaxial layer, the n-type impurity of the semiconductor wafer and the n-type impurity of the impurity region are diffused to the epitaxial layer, and an n-type impurity is separately added at the same time. Thereby, there is formed a high concentration region which includes the n-type impurity diffused from the semiconductor wafer, the n-type impurity diffused from the impurity region and the n-type impurity added at the time of epitaxial growth. Further, an intermediate concentration region which includes the n-type impurity diffused from the impurity region and the n-type impurity added at the time of epitaxial growth is formed on the high concentration region. Further, a low concentration region which includes the n-type impurity added at the time of epitaxial growth is formed on the intermediate concentration region.

As a result, it is possible to appropriately form, on the semiconductor wafer, an n-type epitaxial layer having a concentration gradient in which the n-type impurity concentration is decreased in a downward step-wise manner from the semiconductor wafer toward the crystal growth direction.

[A2] The method for manufacturing the semiconductor device according to A1, wherein the epitaxial layer which includes a high concentration region including an n-type impurity diffused from the semiconductor wafer, an n-type impurity diffused from the impurity region and an n-type impurity added during epitaxial growth, an intermediate concentration region including an n-type impurity diffused from the impurity region and an n-type impurity added during epitaxial growth, and a low concentration region including an n-type impurity added during epitaxial growth in this order from the main surface of the semiconductor wafer is formed.

[A3] The method for manufacturing the semiconductor device according to A2, wherein the epitaxial layer which has a high concentration transition region in which a concentration gradient inclines gently between the high concentration region and the intermediate concentration region is formed.

[A4] The method for manufacturing the semiconductor device according to A2 or A3, wherein the epitaxial layer which has a low concentration transition region in which a concentration gradient inclines gently between the intermediate concentration region and the low concentration region is formed.

[A5] The method for manufacturing the semiconductor device according to any one of A2 to A4, wherein the semiconductor wafer which includes arsenic as a main n-type impurity is prepared.

[A6] The method for manufacturing the semiconductor device according to A5, wherein the impurity region which includes arsenic and phosphorus as a main n-type impurity is formed.

[A7] The method for manufacturing the semiconductor device according to A5 or A6 in which the high concentration region which includes arsenic and phosphorus as a main n-type impurity is formed.

[A8] The method for manufacturing the semiconductor device according to any one of A5 to A7, wherein the intermediate concentration region which includes phosphorus as a main n-type impurity is formed.

[A9] The method for manufacturing the semiconductor device according to any one of A5 to A8, wherein the low concentration region which includes phosphorus as a main n-type impurity is formed.

[A10] A method for manufacturing a semiconductor device further comprising, a step of preparing an n-type semiconductor wafer which includes an n-type impurity having a diffusion coefficient less than a diffusion coefficient of phosphorus and which has a main surface, a step of forming an impurity region in the surface layer portion of the main surface of the semiconductor wafer by introducing an n-type impurity having a diffusion coefficient in excess of a diffusion coefficient of an n-type impurity of the semiconductor wafer to a surface layer portion of the main surface of the semiconductor wafer, a step of forming an epitaxial layer including a high concentration region which includes an n-type impurity diffused from the semiconductor wafer, an n-type impurity diffused from the impurity region and an n-type impurity added during epitaxial growth, an intermediate concentration region which includes an n-type impurity diffused from the impurity region and an n-type impurity added during epitaxial growth and a low concentration region which includes an n-type impurity added during epitaxial growth in this order from the main surface of the semiconductor wafer, by forming the epitaxial layer on the main surface of the semiconductor wafer by an epitaxial growing method and adding an n-type impurity to the epitaxial layer at the same time, and a step of forming a trench in the low concentration region by an etching method, a step of forming an insulating layer which covers an inner wall of the trench, and a step of embedding an electrode into the trench across the insulating layer.

The method for manufacturing the semiconductor device is to manufacture and provide a semiconductor device which is capable of suppressing a reduction in breakdown voltage and reducing a resistance of the epitaxial layer.

According to the method for manufacturing the semiconductor device, the semiconductor wafer which includes an n-type impurity having a diffusion coefficient less than a diffusion coefficient of phosphorus is prepared. Thereby, it is possible to suppress an undesired diffusion of the n-type impurity from the semiconductor wafer to the epitaxial layer. As a result, it is possible to suppress an undesired increase in concentration of the epitaxial layer due to the n-type impurity of the semiconductor wafer and, therefore, appropriately adjust an n-type impurity concentration of the epitaxial layer.

In the step of forming the epitaxial layer, the epitaxial layer which includes the high concentration region, the intermediate concentration region and the low concentration region is formed from the main surface of the semiconductor wafer. The high concentration region is a region which incorporates the n-type impurity diffused from the semiconductor substrate. The intermediate concentration region is a region which partially raises the n-type impurity concentration of the epitaxial layer to reduce a resistance. The low concentration region is a region which suppresses an increase in concentration of the epitaxial layer in its entirety.

In a region where the trench structure is formed in the epitaxial layer, electric field concentration is likely to occur due to a structure in which a current path is restricted. Further, when the region where the trench structure is formed in the epitaxial layer is increased in concentration, a depletion layer from the trench structure spreads insufficiently, thus resulting in a reduction in breakdown voltage.

Thus, in the method for manufacturing the semiconductor device, the low concentration region is formed in the region where the trench structure is formed in the epitaxial layer. Thereby, a depletion layer can be appropriately formed in the low concentration region. Therefore, there can be manufactured and provided the semiconductor device capable of reducing a resistance of the epitaxial layer, while suppressing a reduction in breakdown voltage.

[A11] The method for manufacturing the semiconductor device according to A10, wherein the epitaxial layer having a high concentration transition region in which a concentration gradient inclines gently between the high concentration region and the intermediate concentration region is formed.

[A12] The method for manufacturing the semiconductor device according to A10 or A11, wherein the epitaxial layer having a low concentration transition region in which a concentration gradient inclines gently between the intermediate concentration region and the low concentration region is formed.

[A13] The method for manufacturing the semiconductor device according to A10 to A12, wherein the semiconductor wafer which includes arsenic as a main n-type impurity is prepared.

[A14] The method for manufacturing the semiconductor device according to A13, wherein the impurity region which includes arsenic and phosphorus as a main n-type impurity is formed.

[A15] The method for manufacturing the semiconductor device according to A13 or A14, wherein the high concentration region which includes arsenic and phosphorus as a main n-type impurity is formed.

[A16] The method for manufacturing the semiconductor device according to any one of A13 to A15, wherein the intermediate concentration region which includes phosphorus as a main n-type impurity is formed.

[A17] The method for manufacturing the semiconductor device according to any one of A13 to A16, wherein the low concentration region which includes phosphorus as a main n-type impurity is formed.

[A18] The method for manufacturing the semiconductor device according to any one of A10 to A17, wherein the trench which penetrates through the low concentration region to expose the low concentration region and the high concentration region is formed.

[A19] The method for manufacturing the semiconductor device according to any one of A10 to A18, wherein the trench which faces the semiconductor wafer across the high concentration region is formed.

[A20] The method for manufacturing the semiconductor device according to any one of A10 to A19 further comprising, a step of forming a p-type body region by introducing a p-type impurity to a region along the trench on a surface layer portion of the low concentration region, and a step of forming an n-type source region by introducing an n-type impurity to a region along the trench on a surface layer portion of the body region.

[A21] The method for manufacturing the semiconductor device according to A20, wherein the body region is formed at an interval from the intermediate concentration region to a crystal growth direction.

[A22] The method for manufacturing the semiconductor device according to A20 or A21, further comprising, a step of forming a source electrode on the epitaxial layer.

[A23] The method for manufacturing the semiconductor device according to A22, further comprising, a step of forming a contact hole which exposes the source region by digging down a region which faces the trench across the source region in the low concentration region by an etching method prior to the step of forming the source electrode, wherein the source electrode electrically connected to the source region inside the contact hole.

[A24] The method for manufacturing the semiconductor device according to A23, further comprising, a step of forming a p-type contact region having a p-type impurity concentration in excess of a p-type impurity concentration of the body region by introducing a p-type impurity to a region along the contact hole in the body region after the step of forming the contact hole and prior to the step of forming the source electrode, wherein the source electrode electrically connected to the contact region inside the contact hole is formed.

[A25] The method for manufacturing the semiconductor device according to any one of A10 to A24, further comprising, a step of forming a drain electrode on a main surface on the opposite side of the main surface of the semiconductor wafer.

[A26] The method for manufacturing the semiconductor device according to any one of A10 to A25, further comprising, a step of cutting out a semiconductor device from the semiconductor wafer.

[B1] A semiconductor device comprising, an n-type semiconductor substrate which includes an n-type impurity having a diffusion coefficient less than a diffusion coefficient of phosphorus, an n-type epitaxial layer which includes a high concentration region, an intermediate concentration region and a low concentration region formed in this order on the semiconductor substrate and has an n-type impurity concentration gradient which is formed in a downward step-wise manner from the semiconductor substrate toward a crystal growth direction by the high concentration region, the intermediate concentration region and the low concentration region, and a trench structure which includes a trench formed in the low concentration region, an insulating layer formed on an inner wall of the trench and an embedded electrode which is embedded into the trench across the insulating layer. According to the semiconductor device, it is possible to suppress a reduction in breakdown voltage and also reduce a resistance of the epitaxial layer.

[B2] The semiconductor device according to B1, wherein the epitaxial layer has a high concentration transition region in which a concentration gradient inclines gently between the high concentration region and the intermediate concentration region.

[B3] The semiconductor device according to B1 or B2, wherein the epitaxial layer has a low concentration transition region in which a concentration gradient inclines gently between the intermediate concentration region and the low concentration region.

[B4] The semiconductor device according to any one of B1 to B3, wherein the epitaxial layer includes an n-type impurity having a diffusion coefficient in excess of a diffusion coefficient of the n-type impurity of the semiconductor substrate.

[B5] The semiconductor device according to any one of B1 to B4, wherein the semiconductor substrate includes arsenic as a main n-type impurity.

[B6] The semiconductor device according to B5, wherein the high concentration region includes arsenic and phosphorus as a main n-type impurity.

[B7] The semiconductor device according to B5 or B6, wherein the intermediate concentration region includes phosphorus as a main n-type impurity.

[B8] The semiconductor device according to any one of B5 to B7, wherein the low concentration region includes phosphorus as a main n-type impurity.

[B9] The semiconductor device according to any one of B1 to B8, wherein the trench penetrates through the low concentration region to reach the intermediate concentration region, and the embedded electrode faces the low concentration region and the intermediate concentration region across the insulating layer.

[B10] The semiconductor device according to anyone of B1 to B9, further comprising, a p-type channel formed at a region along the trench structure in the low concentration region.

[B11] The semiconductor device according to B10, further comprising, a p-type body region which is formed in a region along the trench structure in the surface layer portion of the low concentration region, and an n-type source region which is formed in a region along the trench structure in the surface layer portion of the body region to demarcate the channel between itself and the low concentration region.

[B12] The semiconductor device according to B11, wherein the body region is formed in a surface layer portion of the low concentration region at an interval from the intermediate concentration region.

[B13] The semiconductor device according to B11 or B12, further comprising, a source electrode electrically connected to the source region on the epitaxial layer.

[B14] The semiconductor device according to B13, further comprising, a contact hole formed at a region that faces the trench structure across the source region in the low concentration region to expose the source region and in which the source electrode is electrically connected to the source region inside the contact hole.

[B15] The semiconductor device according to B14, further comprising, a p-type contact region formed in a region along the contact hole in the body region and has a p-type impurity concentration in excess of a p-type impurity concentration of the body region and in which the source electrode is electrically connected to the contact region inside the contact hole.

[B16] The semiconductor device according to anyone of B1 to B15, further comprising, a drain electrode electrically connected to the semiconductor substrate.

[B17] The semiconductor device according to anyone of B1 to B16, wherein the embedded electrode has an insulated-separation type electrode structure which includes a bottom-side electrode which is embedded in a bottom wall side of the trench across the insulating layer, an opening-side electrode which is embedded in an opening side of the trench across the insulating layer, and an intermediate insulating layer which is interposed between the bottom-side electrode and the opening-side electrode.

[B18] The semiconductor device according to B17, wherein the insulating layer includes a bottom-side insulating layer which covers a region in the bottom wall side of the trench and has a first thickness and an opening-side insulating layer which covers a region in the opening side of the trench and has a second thickness less than the first thickness, the bottom-side electrode is embedded in the bottom wall side of the trench across the bottom-side insulating layer, and the opening-side electrode is embedded in the opening side of the trench across the opening-side insulating layer.

[B19] The semiconductor device according to anyone of B1 to B16, wherein the embedded electrode is embedded in the trench as an integrated member.

[B20] A semiconductor device comprising, an n-type semiconductor substrate which includes arsenic as an n-type impurity, an n-type epitaxial layer which includes a high concentration region, an intermediate concentration region and a low concentration region formed in this order on the semiconductor substrate, has an n-type impurity concentration gradient which is formed in a downward step-wise manner from the semiconductor substrate toward a crystal growth direction by the high concentration region, the intermediate concentration region and the low concentration region and includes phosphorus as an n-type impurity, and a trench structure which includes a trench formed in the low concentration region, an insulating layer formed on an inner wall of the trench, a bottom-side electrode embedded in a bottom wall side of the trench across the insulating layer, an opening-side electrode embedded in an opening side of the trench across the insulating layer and an intermediate insulating layer interposed between the bottom-side electrode and the opening-side electrode inside the trench. According to the semiconductor device, it is possible to suppress a reduction in breakdown voltage and also reduce a resistance of the epitaxial layer.

[B21] The semiconductor device according to B20, wherein the high concentration region includes arsenic and phosphorus as a main n-type impurity.

[B22] The semiconductor device according to B20 or B21, wherein the trench penetrates through the low concentration region to reach the intermediate concentration region, the bottom-side electrode faces the intermediate concentration region and the low concentration region across the insulating layer, and the opening-side electrode faces the low concentration region across the insulating layer.

[B23] The semiconductor device according to any one of B20 to B22, further comprising, a p-type channel that is formed at a region along the trench structure in the low concentration region.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A semiconductor device comprising:
an n-type semiconductor substrate which includes an n-type impurity having a diffusion coefficient less than a diffusion coefficient of phosphorus;
an n-type epitaxial layer which includes a high concentration region, an intermediate concentration region and a low concentration region formed in this order from the semiconductor substrate side and has a concentration gradient in which an n-type impurity concentration is decreased in a downward step-wise manner from the semiconductor substrate toward a crystal growth direction by the high concentration region, the intermediate concentration region and the low concentration region; and
a trench structure which includes a trench formed in the low concentration region, an insulating layer formed on an inner wall of the trench and an embedded electrode which is embedded in the trench across the insulating layer;
wherein the epitaxial layer has a high concentration transition region in which a concentration gradient inclines gently between the high concentration region and the intermediate concentration region, and a low concentration transition region in which a concentration gradient inclines gently between the intermediate concentration region and the low concentration region, and
the trench structure penetrates through the low concentration transition region to reach the intermediate concentration region.

2. The semiconductor device according to claim 1, wherein
the epitaxial layer includes an n-type impurity having a diffusion coefficient in excess of a diffusion coefficient of the n-type impurity of the semiconductor substrate.

3. The semiconductor device according to claim 1, wherein
the semiconductor substrate includes arsenic as a main n-type impurity.

4. The semiconductor device according to claim 3, wherein
the high concentration region includes arsenic and phosphorus as a main n-type impurity.

5. The semiconductor device according to claim 3, wherein
the intermediate concentration region includes phosphorus as a main n-type impurity.

6. The semiconductor device according to claim 3, wherein
the low concentration region includes phosphorus as a main n-type impurity.

7. The semiconductor device according to claim 1, wherein
the embedded electrode faces the low concentration region and the intermediate concentration region across the insulating layer.

8. The semiconductor device according to claim 1 further comprising:
a p-type channel formed in a region along the trench structure in the low concentration region.

9. The semiconductor device according to claim 8 further comprising:
a p-type body region which is formed in a region along the trench structure in a surface layer portion of the low concentration region, and
an n-type source region which is formed in a region along the trench structure in a surface layer portion of the body region to demarcate the channel between the low concentration region and the n-type source region.

10. The semiconductor device according to claim 9, wherein
the body region is formed in the surface layer portion of the low concentration region at an interval from the intermediate concentration region.

11. The semiconductor device according to claim 9 further comprising:
a source electrode which is electrically connected to the source region on the epitaxial layer.

12. The semiconductor device according to claim 11 further comprising:
a contact hole which is formed in a region facing the trench structure across the source region in the low concentration region to expose the source region, wherein
the source electrode is electrically connected to the source region inside the contact hole.

13. The semiconductor device according to claim 12 further comprising:
a p-type contact region which is formed in a region along the contact hole in the body region and has a p-type impurity concentration in excess of a p-type impurity concentration of the body region, wherein
the source electrode is electrically connected to the contact region inside the contact hole.

14. The semiconductor device according to claim 1 further comprising:
a drain electrode electrically connected to the semiconductor substrate.

15. The semiconductor device according to claim 1, wherein
the embedded electrode has an insulated-separation type electrode structure which includes a bottom-side electrode embedded in the bottom wall side of the trench across the insulating layer, an opening-side electrode embedded in the opening side of the trench across the insulating layer and an intermediate insulating layer which is interposed between the bottom-side electrode and the opening-side electrode.

16. The semiconductor device according to claim 15, wherein
the insulating layer includes a bottom-side insulating layer which covers a region on the bottom wall side of the trench and has a first thickness, and an opening-side insulating layer which covers a region on the opening side of the trench and has a second thickness less than the first thickness,
the bottom-side electrode is embedded in the bottom wall side of the trench across the bottom-side insulating layer, and
the opening-side electrode is embedded in the opening side of the trench across the opening-side insulating layer.

17. The semiconductor device according to claim 1, wherein
the trench structure is formed at an interval from the high concentration transition region such as not to penetrate the high concentration transition region.

* * * * *